United States Patent
Kumar et al.

(10) Patent No.: US 10,092,933 B2
(45) Date of Patent: Oct. 9, 2018

(54) METHODS AND APPARATUSES FOR CLEANING ELECTROPLATING SUBSTRATE HOLDERS

(71) Applicant: Novellus Systems, Inc., Fremont, CA (US)

(72) Inventors: Santosh Kumar, Beaverton, OR (US); Bryan L. Buckalew, Tualatin, OR (US); Steven T. Mayer, Aurora, OR (US); Thomas Ponnuswamy, Sherwood, OR (US); Chad Michael Hosack, Tigard, OR (US); Robert Rash, West Linn, OR (US); Lee Peng Chua, Beaverton, OR (US); David Porter, Sherwood, OR (US)

(73) Assignee: Novellus Systems, Inc., Fremont, CA (US)

( * ) Notice: Subject to any disclaimer, the term of this patent is extended or adjusted under 35 U.S.C. 154(b) by 287 days.

(21) Appl. No.: 13/852,767

(22) Filed: Mar. 28, 2013

(65) Prior Publication Data
US 2013/0292254 A1    Nov. 7, 2013

Related U.S. Application Data

(60) Provisional application No. 61/616,909, filed on Mar. 28, 2012, provisional application No. 61/676,841, filed on Jul. 27, 2012.

(51) Int. Cl.
*B08B 3/02* (2006.01)
*C25D 7/12* (2006.01)
(Continued)

(52) U.S. Cl.
CPC ............ *B08B 3/022* (2013.01); *B08B 3/041* (2013.01); *C25D 7/12* (2013.01); *C25D 17/00* (2013.01);
(Continued)

(58) Field of Classification Search
CPC .................. H01L 21/67028–21/67057; C25D 7/12–7/126; C25D 21/12–21/14; B08B 3/02–3/028
See application file for complete search history.

(56) References Cited

U.S. PATENT DOCUMENTS 2,773,257 A * 12/1956 Craggs ................. B65G 39/145
198/808
3,225,899 A * 12/1965 Lo Presti ............... B65G 21/04
198/827
(Continued)

FOREIGN PATENT DOCUMENTS

CN       1509348 A    6/2004
CN       1550033 A   11/2004
(Continued)

OTHER PUBLICATIONS

Everett, Manual of Symbols and Terminology for Physicochemical Quantities and Units (2001).*
(Continued)

*Primary Examiner* — Bryan D. Ripa
*Assistant Examiner* — Ho-Sung Chung
(74) *Attorney, Agent, or Firm* — Weaver Austin Villeneuve & Sampson LLP

(57) ABSTRACT

Disclosed herein are methods of cleaning a lipseal and/or cup bottom of an electroplating device by removing metal deposits accumulated in prior electroplating operations. The methods may include orienting a nozzle such that it is pointed substantially at the inner circular edge of the lipseal and/or cup bottom, and dispensing a stream of cleaning solution from the nozzle such that the stream contacts the inner circular edge of the lipseal and/or cup bottom while they are being rotated, removing metal deposits. In some embodiments, the stream has a velocity component against the rotational direction of the lipseal and/or cup bottom. In (Continued)

some embodiments, the deposits may include a tin/silver alloy. Also disclosed herein are cleaning apparatuses for mounting in electroplating devices and for removing electroplated metal deposits from their lipseals and/or cup bottoms. In some embodiments, the cleaning apparatuses may include a jet nozzle.

27 Claims, 24 Drawing Sheets

(51) Int. Cl.
    *B08B 3/04*     (2006.01)
    *H01L 21/67*     (2006.01)
    *C25D 17/00*     (2006.01)
    *C25D 21/00*     (2006.01)
    *C25D 21/12*     (2006.01)

(52) U.S. Cl.
    CPC ............ *C25D 17/001* (2013.01); *C25D 21/00* (2013.01); *C25D 21/12* (2013.01); *H01L 21/67051* (2013.01)

(56) References Cited

U.S. PATENT DOCUMENTS

| | | | |
|---|---|---|---|
| 3,334,750 A | 8/1967 | Ullman, Jr. | |
| 3,430,055 A | 2/1969 | Metzger | |
| 3,684,633 A | 8/1972 | Haase | |
| 3,716,765 A * | 2/1973 | Rueffer et al. | H01L 23/291 257/638 |
| 3,724,471 A * | 4/1973 | Sitges | C25C 7/08 134/34 |
| 4,418,432 A | 12/1983 | Vidal | |
| 4,466,864 A | 8/1984 | Bacon et al. | |
| 4,569,695 A * | 2/1986 | Yamashita | B08B 11/00 134/1 |
| 4,654,235 A | 3/1987 | Effenberger et al. | |
| 4,924,891 A * | 5/1990 | Soubrier | B29C 71/0009 134/122 R |
| 5,000,827 A | 3/1991 | Schuster et al. | |
| 5,221,449 A | 6/1993 | Colgan et al. | |
| 5,227,041 A | 7/1993 | Brogden et al. | |
| 5,281,485 A | 1/1994 | Colgan et al. | |
| 5,289,639 A * | 3/1994 | Bard | B05C 5/02 118/63 |
| 5,311,634 A | 5/1994 | Andros | |
| 5,482,611 A | 1/1996 | Helmer et al. | |
| 5,519,945 A * | 5/1996 | Ahvenniemi | B08B 3/022 15/345 |
| 5,723,028 A | 3/1998 | Poris | |
| 5,853,559 A | 12/1998 | Tamaki et al. | |
| 5,860,361 A * | 1/1999 | Nanjyo | B08B 3/02 101/424 |
| 5,985,762 A | 11/1999 | Geffken et al. | |
| 6,071,388 A | 6/2000 | Uzoh | |
| 6,074,544 A | 6/2000 | Reid et al. | |
| 6,080,291 A | 6/2000 | Woodruff et al. | |
| 6,099,702 A | 8/2000 | Reid et al. | |
| 6,108,847 A | 8/2000 | Cueman et al. | |
| 6,110,346 A | 8/2000 | Reid et al. | |
| 6,124,203 A | 9/2000 | Joo et al. | |
| 6,126,798 A | 10/2000 | Reid et al. | |
| 6,139,712 A | 10/2000 | Patton et al. | |
| 6,156,167 A | 12/2000 | Patton et al. | |
| 6,159,354 A | 12/2000 | Contolini et al. | |
| 6,162,344 A | 12/2000 | Reid et al. | |
| 6,176,985 B1 | 1/2001 | Downes, Jr. et al. | |
| 6,179,973 B1 | 1/2001 | Lai et al. | |
| 6,179,983 B1 | 1/2001 | Reid et al. | |
| 6,193,854 B1 | 2/2001 | Lai et al. | |
| 6,217,716 B1 | 4/2001 | Lai | |
| 6,221,757 B1 | 4/2001 | Schmidbauer et al. | |
| 6,251,238 B1 | 6/2001 | Kaufman et al. | |
| 6,251,242 B1 | 6/2001 | Fu et al. | |
| 6,261,433 B1 | 7/2001 | Landau | |
| 6,267,860 B1 | 7/2001 | Brodsky | |
| 6,270,646 B1 | 8/2001 | Walton et al. | |
| 6,274,008 B1 | 8/2001 | Gopalraja et al. | |
| 6,277,249 B1 | 8/2001 | Gopalraja et al. | |
| 6,303,010 B1 | 10/2001 | Woodruff et al. | |
| 6,309,520 B1 | 10/2001 | Woodruff et al. | |
| 6,309,981 B1 * | 10/2001 | Mayer | C23F 1/08 156/345.21 |
| 6,379,468 B1 * | 4/2002 | Chang | B08B 3/022 134/15 |
| RE37,749 E | 6/2002 | Poris | |
| 6,398,926 B1 | 6/2002 | Mahneke | |
| 6,413,388 B1 | 7/2002 | Uzoh et al. | |
| 6,436,249 B1 | 8/2002 | Patton et al. | |
| 6,517,689 B1 | 2/2003 | Hongo et al. | |
| 6,540,899 B2 | 4/2003 | Keigler | |
| 6,551,487 B1 | 4/2003 | Reid et al. | |
| 6,579,430 B2 | 6/2003 | Davis et al. | |
| 6,589,401 B1 | 7/2003 | Patton et al. | |
| 6,612,915 B1 | 9/2003 | Uzoh et al. | |
| 6,613,214 B2 | 9/2003 | Dordi et al. | |
| 6,627,052 B2 | 9/2003 | Fluegel et al. | |
| 6,755,946 B1 | 6/2004 | Patton et al. | |
| 6,755,954 B2 | 6/2004 | Mayer et al. | |
| 6,773,560 B2 | 8/2004 | Pedersen et al. | |
| 6,800,187 B1 | 10/2004 | Reid et al. | |
| 6,869,510 B2 | 3/2005 | Woodruff et al. | |
| 6,908,540 B2 | 6/2005 | Kholodenko | |
| 7,033,465 B1 | 4/2006 | Patton et al. | |
| 7,070,686 B2 | 7/2006 | Contolini et al. | |
| 7,087,144 B2 | 8/2006 | Herchen | |
| 7,285,195 B2 | 10/2007 | Herchen et al. | |
| 7,522,055 B2 | 4/2009 | Carrender et al. | |
| 7,935,231 B2 | 5/2011 | Ghongadi et al. | |
| 7,985,325 B2 | 7/2011 | Rash et al. | |
| 8,172,992 B2 | 5/2012 | Prabhakar et al. | |
| 8,377,268 B2 | 2/2013 | Rash et al. | |
| 8,398,831 B2 | 3/2013 | Ghongadi et al. | |
| 9,221,081 B1 | 12/2015 | Mayer et al. | |
| 9,228,270 B2 | 1/2016 | Feng et al. | |
| 9,476,139 B2 | 10/2016 | Chua et al. | |
| 9,746,427 B2 | 8/2017 | Mayer et al. | |
| 2001/0020480 A1 * | 9/2001 | Yoshikawa | B08B 3/04 134/22.1 |
| 2002/0000372 A1 | 1/2002 | Pedersen et al. | |
| 2002/0020763 A1 * | 2/2002 | Hirae | B05B 7/0433 239/418 |
| 2002/0084183 A1 | 7/2002 | Hanson et al. | |
| 2002/0108851 A1 | 8/2002 | Woodruff et al. | |
| 2002/0134403 A1 * | 9/2002 | Selwyn | B08B 3/02 134/1.2 |
| 2002/0144900 A1 | 10/2002 | Keigler | |
| 2002/0153260 A1 * | 10/2002 | Egli | C25D 3/38 205/182 |
| 2002/0157686 A1 * | 10/2002 | Kenny | B08B 3/00 134/34 |
| 2003/0010641 A1 | 1/2003 | Kholodenko | |
| 2003/0085118 A1 | 5/2003 | Tench et al. | |
| 2003/0085119 A1 | 5/2003 | Davis et al. | |
| 2003/0134044 A1 * | 7/2003 | Aoki | B05C 5/0279 427/372.2 |
| 2003/0181349 A1 * | 9/2003 | Maeno | C11D 1/72 510/499 |
| 2003/0201184 A1 | 10/2003 | Dordi et al. | |
| 2004/0002430 A1 * | 1/2004 | Verhaverbeke | B08B 3/02 510/175 |
| 2004/0060576 A1 * | 4/2004 | Cronin | B08B 3/02 134/7 |
| 2004/0084301 A1 | 5/2004 | Dordi et al. | |
| 2004/0112405 A1 * | 6/2004 | Lee | G03F 7/425 134/1.3 |
| 2004/0149573 A1 | 8/2004 | Herchen | |
| 2004/0171277 A1 | 9/2004 | Oh et al. | |
| 2005/0081899 A1 * | 4/2005 | Shannon | B08B 3/026 134/172 |

(56) References Cited

U.S. PATENT DOCUMENTS

| | | | |
|---|---|---|---|
| 2005/0183947 A1* | 8/2005 | Henuset | C25C 7/08 204/216 |
| 2005/0218000 A1 | 10/2005 | Hafezi et al. | |
| 2005/0284754 A1 | 12/2005 | Herchen et al. | |
| 2005/0287928 A1* | 12/2005 | Hardikar | B08B 1/00 451/5 |
| 2006/0113192 A1 | 6/2006 | Kurashina et al. | |
| 2006/0118132 A1* | 6/2006 | Bergman | B08B 3/02 134/1 |
| 2006/0151007 A1* | 7/2006 | Bergman | B08B 3/02 134/26 |
| 2006/0226000 A1 | 10/2006 | Hanson et al. | |
| 2006/0237308 A1 | 10/2006 | Herchen | |
| 2006/0246690 A1 | 11/2006 | Dordi et al. | |
| 2006/0266653 A1* | 11/2006 | Birang | C25D 21/12 205/83 |
| 2007/0077871 A1 | 4/2007 | Park et al. | |
| 2007/0141849 A1* | 6/2007 | Kanno | B01F 3/04049 438/745 |
| 2007/0199578 A1* | 8/2007 | Nomura | H01L 21/67046 134/1 |
| 2008/0011322 A1* | 1/2008 | Weber | B08B 3/02 134/2 |
| 2008/0117051 A1 | 5/2008 | Carrender et al. | |
| 2009/0009753 A1 | 1/2009 | Horai et al. | |
| 2009/0033889 A1 | 2/2009 | Bleeker et al. | |
| 2009/0107835 A1* | 4/2009 | Ghongadi | C25D 21/08 204/242 |
| 2009/0107836 A1 | 4/2009 | Rash et al. | |
| 2009/0117730 A1 | 5/2009 | Maitani et al. | |
| 2010/0116290 A1* | 5/2010 | Zhu | C11D 3/2079 134/7 |
| 2010/0144158 A1 | 6/2010 | Ito et al. | |
| 2010/0155254 A1 | 6/2010 | Prabhakar et al. | |
| 2010/0216302 A1* | 8/2010 | Luo | C25D 3/60 438/613 |
| 2011/0181000 A1 | 7/2011 | Ghongadi et al. | |
| 2011/0233056 A1 | 9/2011 | Rash et al. | |
| 2012/0043200 A1 | 2/2012 | Fujikata et al. | |
| 2012/0137970 A1 | 6/2012 | Naruse et al. | |
| 2012/0181170 A1 | 7/2012 | Prabhakar et al. | |
| 2013/0042454 A1 | 2/2013 | Feng et al. | |
| 2013/0062197 A1 | 3/2013 | He et al. | |
| 2013/0256146 A1* | 10/2013 | Chua | C25F 1/00 205/261 |
| 2014/0230855 A1 | 8/2014 | Mayer et al. | |
| 2014/0367265 A1 | 12/2014 | Ravid et al. | |
| 2015/0218726 A1 | 8/2015 | Feng et al. | |
| 2016/0145761 A1 | 5/2016 | Mayer et al. | |
| 2016/0186355 A1 | 6/2016 | Feng et al. | |
| 2016/0201212 A1 | 7/2016 | Ostrowski et al. | |
| 2017/0009369 A1 | 1/2017 | Berke et al. | |
| 2017/0009370 A1 | 1/2017 | Chua et al. | |
| 2017/0073832 A1 | 3/2017 | Berke et al. | |
| 2017/0299524 A1 | 10/2017 | Arora et al. | |

FOREIGN PATENT DOCUMENTS

| | | | | |
|---|---|---|---|---|
| CN | 1623012 | A | 6/2005 | |
| CN | 1930666 | A | 3/2007 | |
| CN | 100469948 | C | 3/2009 | |
| CN | 101599420 | | * 12/2009 | H01L 21/00 |
| CN | 101798698 | | 8/2010 | |
| CN | 102953104 | A | 3/2013 | |
| CN | 103031580 | A | 4/2013 | |
| EP | 1 724 820 | A1 | 11/2006 | |
| JP | 2002-069698 | | 3/2002 | |
| JP | 2002-540011 | | 11/2002 | |
| JP | 2004-083932 | A | 3/2004 | |
| JP | 2004-247738 | A | 9/2004 | |
| JP | 2004-270014 | | 9/2004 | |
| JP | 2005-146398 | | 6/2005 | |
| JP | 2007-204832 | | 8/2007 | |
| JP | 2008-045179 | | 2/2008 | |
| JP | 2008-095157 | A | 4/2008 | |
| JP | 2010-150659 | A | 7/2010 | |
| KR | 10-2004-0079843 | | 9/2004 | |
| KR | 10-2004-0081577 | | 9/2004 | |
| KR | 10-2005-0068038 | | 7/2005 | |
| KR | 10-2007-0064847 | | 6/2007 | |
| KR | 20070064847 | A | * 6/2007 | |
| KR | 10-2008-0007931 | | 1/2008 | |
| TW | 531770 | | 5/2003 | |
| TW | 544811 | | 8/2003 | |
| TW | 200409836 | | 6/2004 | |
| TW | 200410296 | A | 6/2004 | |
| TW | 200511422 | A | 3/2005 | |
| TW | I244548 | | 12/2005 | |
| TW | I585246 | B | 6/2017 | |
| WO | WO 99/041434 | | 8/1999 | |
| WO | WO 03/006718 | | 1/2003 | |
| WO | WO 03/010368 | A | 2/2003 | |
| WO | WO 2013/148890 | | 10/2013 | |

OTHER PUBLICATIONS

Zheng, CN 101599420a, abstract and machine translation (2009).*
Cambridge English Dictionary, Against (2016).*
Ham et al., Abstract & Machine Translation, KR 10-2007-0064847 A (2007).*
U.S. Final Office Action, dated Apr. 23, 2015, issued in U.S. Appl. No. 13/563,619.
Singapore Final Exam Report, dated May 20, 2015, issued in Application No. 201206129-7.
U.S. Office Action, dated Nov. 6, 2014, issued in U.S. Appl. No. 13/563,619.
U.S. Office Action, dated Feb. 23, 2015, issued in U.S. Appl. No. 13/584,343.
Singapore Search Report and Written Opinion, dated Oct. 6, 2014, issued in Application No. 201206129-7.
PCT International Preliminary Report on Patentability and Written Opinion dated Oct. 9, 2014 issued in PCT/US2013/034178.
U.S. Appl. No. 14/178,804, titled "Detection of Plating on Wafer Holding Apparatus," filed Feb. 12, 2014.
U.S. Appl. No. 13/563,619, titled "Automated Cleaning of Wafer Plating Assembly," filed Jul. 31, 2012.
U.S. Office Action, dated Nov. 1, 2011, issued in U.S. Appl. No. 12/633,219.
U.S. Notice of Allowance, dated Jan. 12, 2012, issued in U.S. Appl. No. 12/633,219.
U.S. Notice of Allowance, dated Mar. 19, 2012, issued in U.S. Appl. No. 12/633,219.
U.S. Office Action, dated Oct. 26, 2012, issued in U.S. Appl. No. 13/432,767.
U.S. Final Office Action, dated Nov. 26, 2013, issued in U.S. Appl. No. 13/432,767.
U.S. Office Action, dated Mar. 2, 2011, issued in U.S. Appl. No. 11/929,638.
U.S. Notice of Allowance, dated May 23, 2011, issued in U.S. Appl. No. 11/929,638.
U.S. Office Action, dated Jul. 7, 2010, issued in U.S. Appl. No. 11/932,595.
U.S. Office Action, dated Nov. 17, 2010, issued in U.S. Appl. No. 11/932,595.
U.S. Notice of Allowance, dated Jan. 26, 2011, issued in U.S. Appl. No. 11/932,595.
U.S. Notice of Allowance, dated Mar. 8, 2011, issued in U.S. Appl. No. 11/932,595.
U.S. Notice of Allowance (Supplemental Notice of Allowability) dated Mar. 11, 2011, issued in U.S. Appl. No. 11/932,595.
U.S. Notice of Allowance, dated Mar. 18, 2011, issued in U.S. Appl. No. 11/932,595.
U.S. Office Action, dated Nov. 4, 2011, issued in U.S. Appl. No. 13/154,224.
U.S. Office Action, dated Mar. 16, 2012, issued in U.S. Appl. No. 13/154,224.

(56) References Cited

OTHER PUBLICATIONS

U.S. Final Office Action, dated Jul. 18, 2012, issued in U.S. Appl. No. 13/154,224.
U.S. Notice of Allowance, dated Oct. 4, 2012, issued in U.S. Appl. No. 13/154,224.
U.S. Notice of Allowance (Corrected Notice of Allowability) dated Jan. 23, 2013, issued in U.S. Appl. No. 13/154,224.
U.S. Office Action, dated May 21, 2012, issued in U.S. Appl. No. 13/079,745.
U.S. Office Action, dated Sep. 21, 2012, issued in U.S. Appl. No. 13/079,745.
U.S. Notice of Allowance, dated Nov. 19, 2012, issued in U.S. Appl. No. 13/079,745.
Chinese First Office Action dated May 2, 2013 issued in CN 200910211989.X.
Japanese Office Action, dated Oct. 2, 2012, issued in Application No. 2009-278998.
Korean Description of Notification of Provisional Rejection, dated May 10, 2012, issued in Application No. 2009-0122738.
Korean Notification of Decision to Grant, dated Sep. 4, 2012, issued in Application No. 2009-0122738.
Singapore Written Opinion, dated Mar. 4, 2011, issued in Application No. 200908245.4.
Singapore Search and Examination Report, dated Oct. 10, 2011, issued in Application No. 200908245.4.
Taiiwan International Search Report, dated Jun. 11, 2012, issued in Application No. 098142112.
PCT International Search Report and Written Opinion dated Jul. 25, 2013 issued in PCT/US2013/034178.
Shin-Etsu Polymer Co., Ltd., "L-type connector," http://www.shinpoly.co.jp./business/connector/products_e/l/html?typezeb (one page) downloaded May 23, 2003.
Shin-Etsu Polymer Co., Ltd., "SS-type connector," http://www.shinpoly.co.jp./business/connector/products_e/ss.html?typezeb (2 pages) downloaded May 23, 2003.
U.S. Appl. No. 14/990,725, titled "Multi-Contact Lipseals and Associated Electroplating Methods," filed Jan. 7, 2016.
U.S. Appl. No. 14/936,328, titled "Integrated Elastomeric Lipseal and Cup Bottom for Reducing Wafer Sticking," filed Nov. 9, 2015.
U.S. Appl. No. 15/004,593, titled "Durable Low Cure Temperature Hydrophobic Coating in Electroplating Cup Asssembly," filed Jan. 22, 2016.
U.S. Appl. No. 14/949,681, titled "Automated Cleaning of Wafer Plating Assembly," filed Nov. 23, 2015.
U.S. Appl. No. 14/957,156, titled "Lipseals and Contact Elements for Semiconductor Electroplating Apparatuses," filed Dec. 2, 2015.
U.S. Notice of Allowance, dated Aug. 31, 2015, issued in U.S. Appl. No. 13/563,619.
U.S. Notice of Allowance [corrected Notice of Allowability], dated Sep. 23, 2015, issued in U.S. Appl. No. 13/563,619.
U.S. Notice of Allowance, dated Aug. 31, 2015, issued in U.S. Appl. No. 13/584,343.
Chinese First Office Action dated Jan. 26, 2016, issued in Application No. CN 201210289735.1.
Chinese First Office Action dated Mar. 2, 2016 issued in Application No. CN 201380023757.6.
U.S. Office Action, dated Nov. 23, 2016, issued in U.S. Appl. No. 14/178,804.
Chinese Second Office Action dated Nov. 2, 2016, issued in Application No. CN 201210289735.1.
Chinese Second Office Action dated Jan. 24, 2017 issued in Application No. CN 201380023757.6.
U.S. Appl. No. 15/276,436, titled "Cleaning Electroplating Substrate Holders Using Reverse Current Deplating," filed Sep. 26, 2016.
Taiwan Examination and Search Report dated Oct. 12, 2016, issued in TW 102111233.
U.S. Notice of Allowance, dated May 3, 2017, issued in U.S. Appl. No. 14/178,804.
U.S. Office Action, dated Mar. 6, 2017, issued in U.S. Appl. No. 14/685,526.
Japanese Second Office Action dated Mar. 14, 2017, issued in Application No. JP 2012-179853.
U.S. Notice of Allowance [Corrected Notice of Allowability], dated Jul. 21, 2017, issued in U.S. Appl. No. 14/178,804.
U.S. Notice of Allowance, dated Aug. 7, 2017, issued in U.S. Appl. No. 14/685,526.
U.S. Office Action, dated Sep. 21, 2017, issued in U.S. Appl. No. 14/990,725.
U.S. Notice of Allowance, dated Sep. 1, 2017, issued in U.S. Appl. No. 14/936,328.
U.S. Office Action, dated Oct. 31, 2017, issued in U.S. Appl. No. 15/004,593.
U.S. Office Action, dated Sep. 7, 2017, issued in U.S. Appl. No. 14/957,156.
Chinese First Office Action dated Jun. 20, 2017 issued in CN 201510837221.9.
Taiwan Office Action, dated Jul. 11, 2017, issued in Application No. TW 106105154.
Taiwan Notice of Allowance and Search Report, dated Sep. 8, 2017, issued in Application No. TW 102111465.
U.S. Notice of Allowance, dated Jun. 30, 2016, issued in U.S. Appl. No. 13/853,935.
Japanese First Office Action dated Jun. 28, 2016, issued in Application No. JP 2012-179853.
Taiwan Office Action and Search Report, dated May 12, 2016, issued in Application No. TW 101129602.
U.S. Notice of Allowance, dated Feb. 6, 2018, issued in U.S. Appl. No. 14/685,526.
U.S. Notice of Allowance, dated Apr. 12, 2018, issued in U.S. Appl. No. 14/936,328.
U.S. Notice of Allowance, dated Feb. 7, 2018, issued in U.S. Appl. No. 14/949,681.
U.S. Final Office Action, dated Mar. 21, 2018, issued in U.S. Appl. No. 14/957,156.
Japanese Decision to Grant w/Search Report dated Mar. 27, 2018 issued in Application No. JP 2014-026848.
Chinese Second Office Action dated Feb. 24, 2018 issued in Application No. CN 201510837221.9.
Chinese First Office Action dated Jan. 29, 2018, issued in CN 201610539196.0.
U.S. Notice of Allowance, dated May 30, 2018, issued in U.S. Appl. No. 14/949,681.
Taiwanese First Office Action dated May 7, 2018 issued in Application No. TW 103104954.

\* cited by examiner

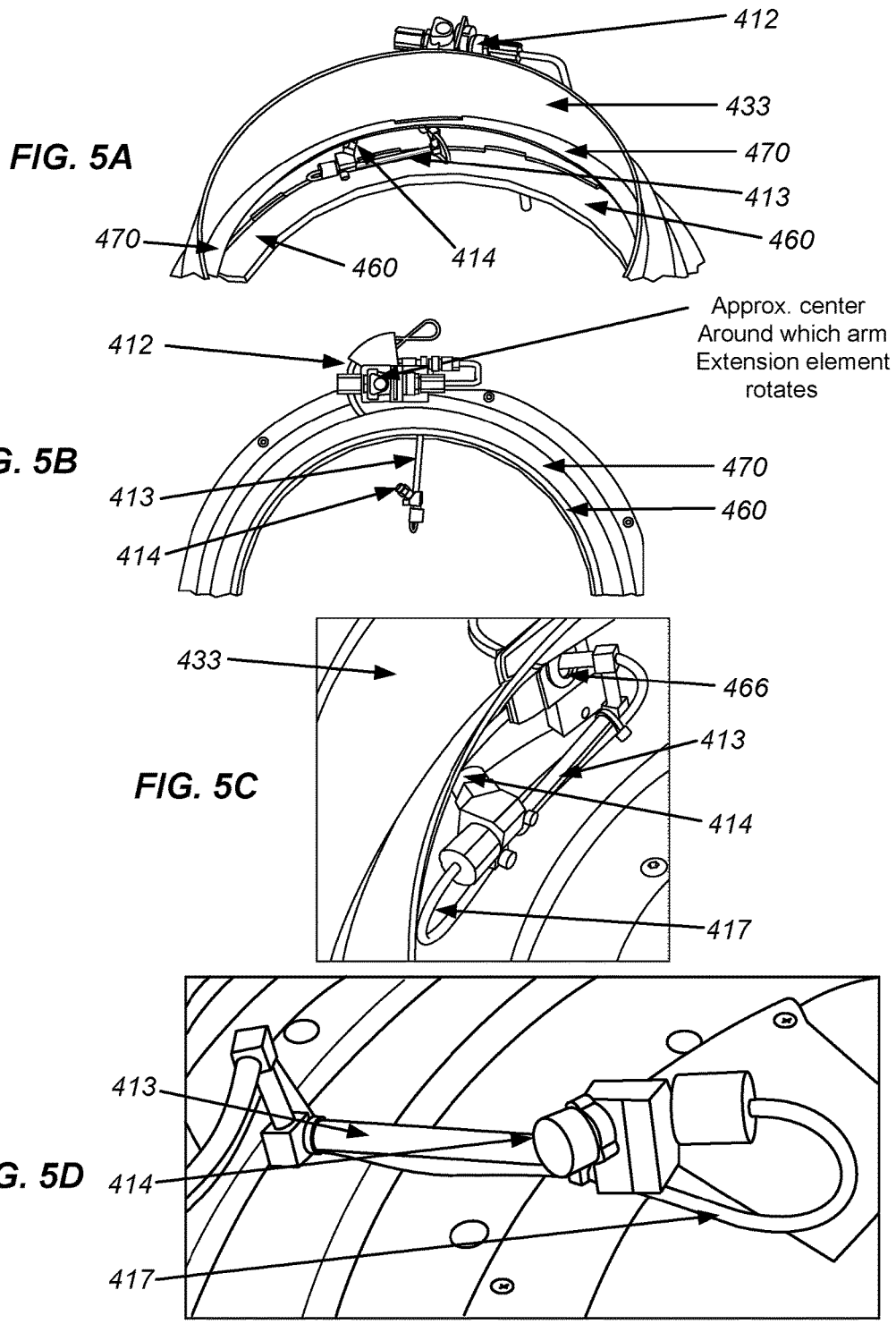

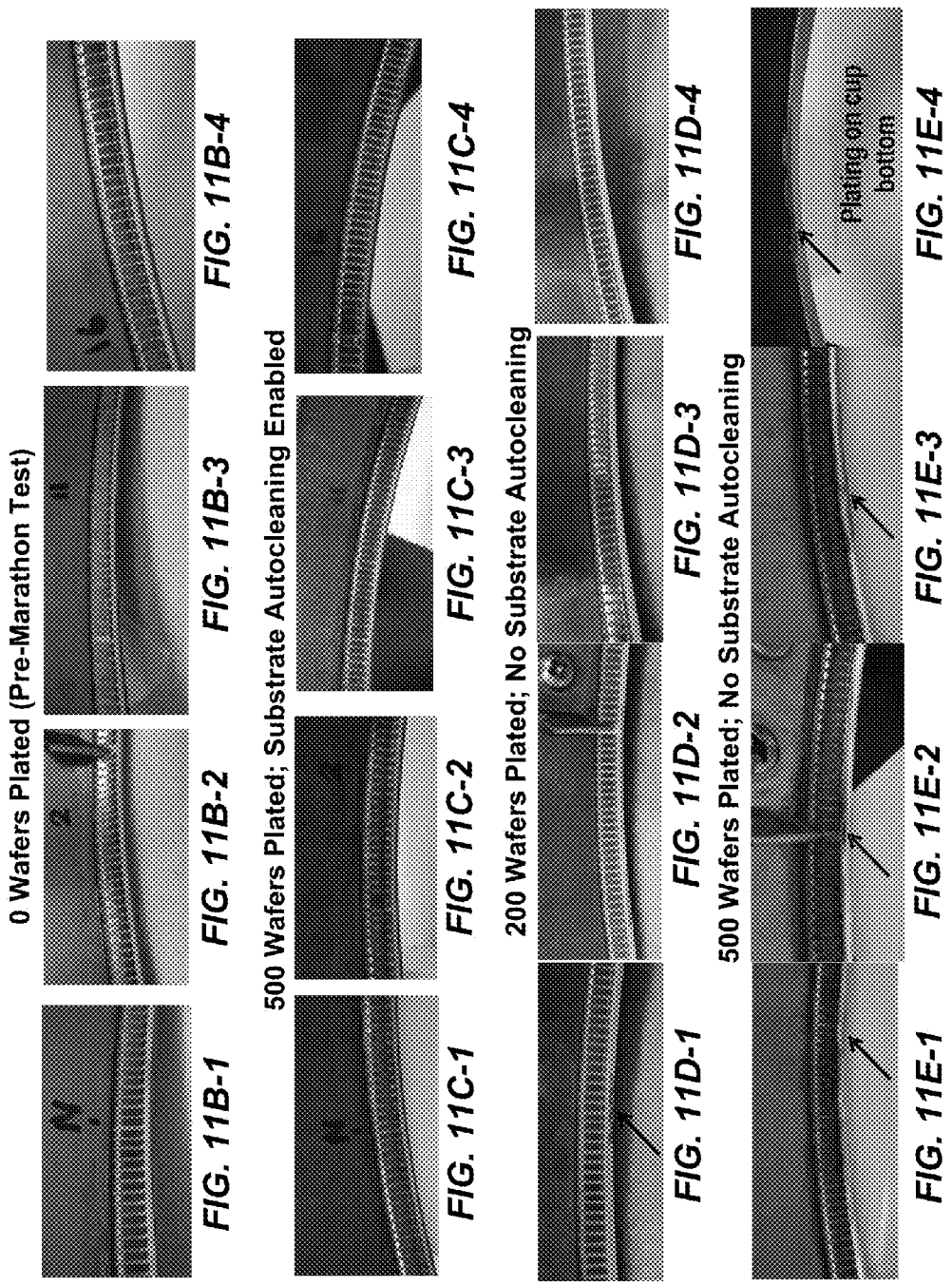

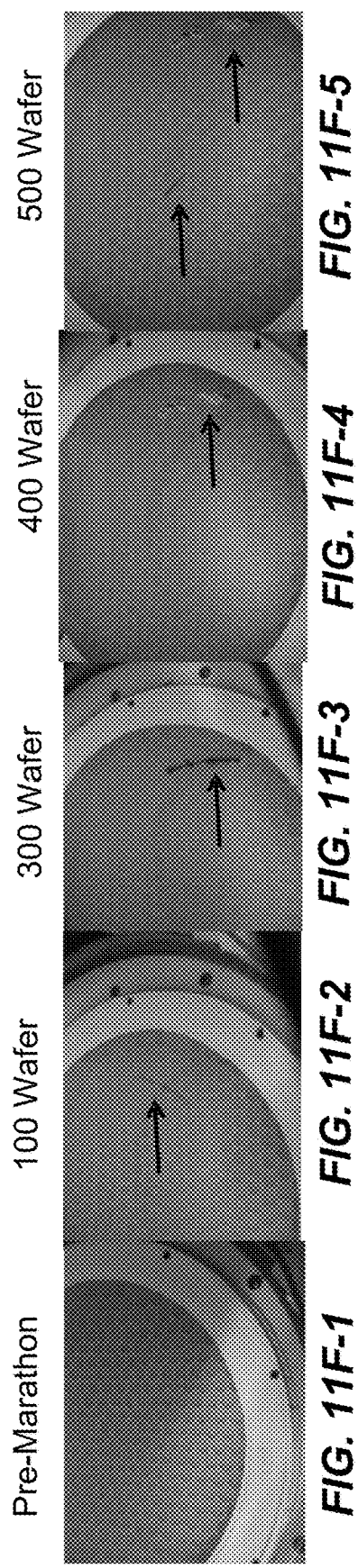

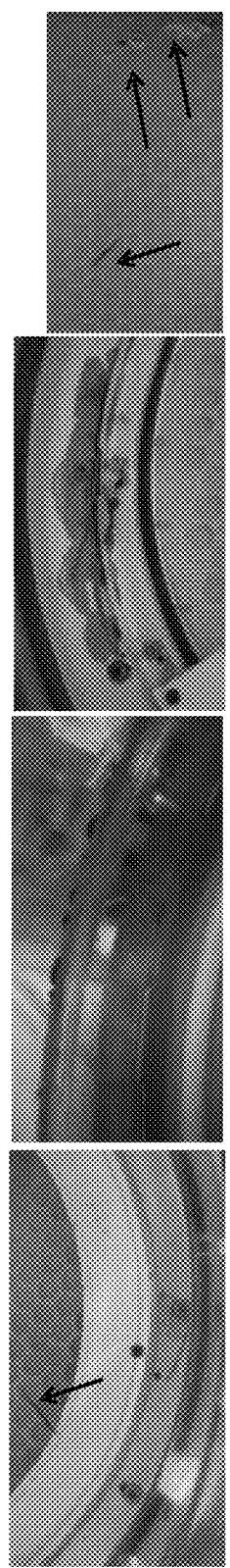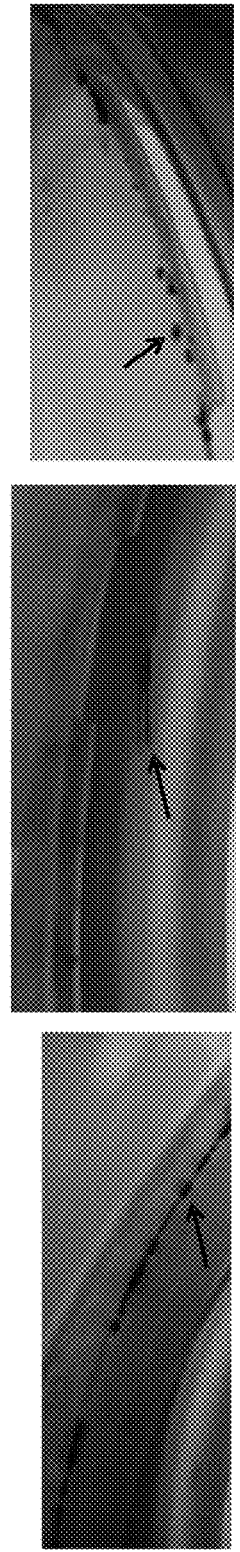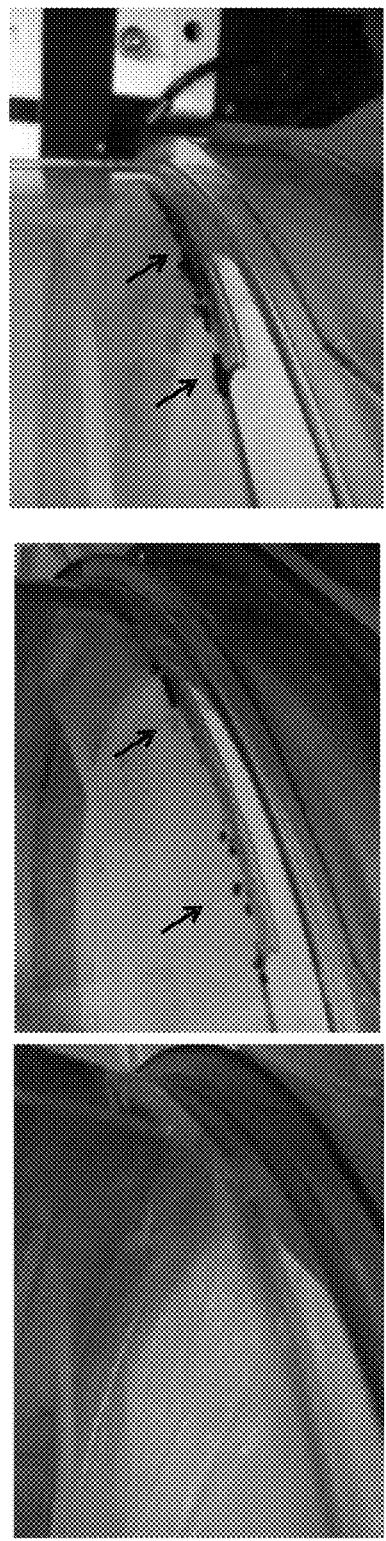

METHODS AND APPARATUSES FOR CLEANING ELECTROPLATING SUBSTRATE HOLDERS

CROSS-REFERENCE TO RELATED APPLICATIONS

This application claims priority to: U.S. Prov. Pat. App. No. 61/616,909, entitled "Methods and Systems for Cleaning Electroplating Substrate Holders," filed Mar. 28, 2012; and U.S. Prov. Pat. App. No. 61/676,841, entitled "Methods, Apparatus, and Systems for Cleaning Electroplating Substrate Holders," filed Jul. 27, 2012; both of which are hereby incorporated by reference in their entirety for all purposes.

Also hereby incorporated by reference in their entirety for all purposes are: U.S. Prov. Pat. App. No. 61/513,993, entitled "Automated Cleaning of Wafer Plating Assembly," filed on Aug. 1, 2011; and U.S. patent application Ser. No. 13/305,384, entitled: "Electroplating Apparatus and Process for Wafer Level Packaging," filed Nov. 28, 2011.

FIELD OF THE INVENTION

This disclosure relates to the fabrication of electronic devices, the electroplating of semiconductor substrates, and various cleaning apparatuses and methods associated with electroplating processes and devices.

BACKGROUND

Recent advances in semiconductor fabrication and processing have led to the increased use of electroplated tin-silver alloys. Some exemplary applications of tin-silver alloys are disclosed in U.S. Pat. Pub. No. 2012/0138471 (of U.S. patent application Ser. No. 13/305,384), entitled "ELECTROPLATING APPARATUS AND PROCESS FOR WAFER LEVEL PACKAGING," hereby incorporated by reference in its entirety and for all purposes. In many of these applications, tin-silver alloys derive their utility, at least in part, from a superior resistance to tin whisker formation, available reasonably stable plating baths and processes, a lower solder melting point, and improved resistance to solder ball connection breaking under shock forces. However, the electroplating of tin-silver alloys onto semiconductor substrates has oftentimes found to be problematic due to the buildup of spurious tin-silver deposits on the electroplating apparatus itself. In particular, it has been found that tin-silver buildup on and around the lipseal and/or cup bottom regions of an electroplating device's substrate holder—or clamshell assembly—may lead to significant processing difficulties. Such spurious metal accumulation, generally referred to herein as "lipseal plating" may even, in some circumstances, cause the seal formed between the substrate and lipseal to fail. The result is that the inner portions of the clamshell assembly become contaminated with potentially harmful and corrosive electroplating solution.

Because "lipseal plating" can lead to lipseal failure, it is typically necessary to remove or clean away spurious tin/silver deposits from the lipseal and/or cup bottom regions, periodically, over the course of a sequence of electroplating operations. Current cleaning techniques involve regular periodic cleaning with a nitric acid solution by manually wiping the lipseal region with a hand-held swab which has been dipped in the nitric acid solution. Once swabbed with nitric acid, deposits on the lipseal and/or cup bottom dissolve, and these regions are subsequently rinsed to remove the acid solution and dissolved deposits. However, these procedures are error prone, either because not all deposits are removed, or because too much force is applied causing the swab to damage the relatively fragile lipseal contact region. Furthermore, when the spurious depositions are substantial, manual wipe down techniques may simply be insufficient, and some components of an electroplating apparatus may need to be removed and replaced. Often, these preventive operations need to be performed on a daily basis—a significant challenge in production environments utilizing multiple tools and where high production volumes are required. Thus, the current techniques for removing spurious metal deposits from the lipseal and/or cup bottom regions of electroplating devices are inefficient and inadequate at best.

SUMMARY OF THE DISCLOSURE

Disclosed herein are methods of cleaning a lipseal and/or cup bottom of an electroplating device by removing metal deposits accumulated on the lipseal and/or cup bottom in prior electroplating operations. In some embodiments, the methods include orienting a first nozzle relative to the lipseal and/or cup bottom such that the first nozzle is pointed substantially at the inner circular edge of the lipseal and/or cup bottom, rotating the lipseal and cup bottom in a first rotational direction, and dispensing a stream of cleaning solution having a fluid velocity between about 5 and 40 meters/second from the first nozzle such that the stream of cleaning solution contacts the inner circular edge of the lipseal and/or cup bottom while they are rotating in the first rotational direction, removing metal deposits from the lipseal and/or cup bottom. In some embodiments, the metal deposits include a tin/silver alloy. In some embodiments, the cleaning solution is substantially distilled and deionized water. In some embodiments, the stream of cleaning solution is dispensed from the first nozzle with a velocity component against the first rotational direction. In some embodiments, the first nozzle is oriented relative to the inner circular edge of the lipseal and/or cup bottom at a normal angle between about −45 and +45 degrees, and in some embodiments, the first nozzle is oriented relative to the horizontal plane of the lipseal and/or cup bottom at a horizontal angle between about −30 and +10 degrees. In some embodiments, a cleaning method may further include generating megasonic waves in the cleaning solution within the first nozzle as the cleaning solution is dispensed from the first nozzle.

Also disclosed herein are methods of electroplating a metal onto a plurality of semiconductor substrates using an electroplating apparatus having a lipseal and cup bottom. In some embodiments, the methods include electroplating the metal onto a first set of one or more substrates, determining whether to perform a cleaning operation which removes metal deposits accumulated on the lipseal and/or cup bottom while electroplating the first set of substrates, performing the cleaning operation if it is determined that it is warranted, and afterwards electroplating the metal onto a second set of one or more substrates. In some embodiments, the cleaning operation is performed according to one or more of the cleaning methods described in the preceding paragraph. In some embodiments, the determining whether to perform the cleaning operation includes an assessment of whether there is sufficient build-up of metal deposits on the lipseal and/or cup bottom to warrant cleaning. In some embodiments, it is determined that a cleaning operation is warranted if more than a predetermined number of substrates have been electroplated since the last cleaning operation, and in certain such embodiments, the predetermined number of substrates is selected dependent upon the ratio of patterned to unpatterned surface area of the substrates electroplated since the last cleaning operation. In some embodiments, the predetermined number of substrates is a number that may be selected from the range of 1 to 200. In some embodiments, it may be determined that a cleaning operation is warranted if more than a predetermined quantity of electric charge has been transferred to the substrate via electroplating since the last cleaning operation, and in certain such embodiments, the predetermined quantity of electric charge may be selected dependent upon the radial distribution of patterned surface area and/or the radial distribution of unpatterned surface area of the substrates electroplated since the last cleaning operation. In some embodiments, the predetermined quantity of electric charge is a charge quantity selected from the range of about 5 to 500 Coulombs.

Also disclosed herein are cleaning apparatuses for mounting in an electroplating device and for removing electroplated metal deposits from the lipseal and/or cup bottom of the electroplating device. In some embodiments, the cleaning apparatus may include a first nozzle, a first cleaning fluid supply conduit in fluidic connection with the first nozzle, and a nozzle arm to which the first nozzle is affixed. In some embodiments, the cleaning apparatus may further include a nozzle arm actuator mechanically coupled to the nozzle arm and configured to move the first nozzle and nozzle arm between, when the cleaning apparatus is mounted in an electroplating device, a retracted position and a cleaning position. In certain such embodiments, in the retracted position, the first nozzle and nozzle arm are positioned such that a semiconductor substrate may be placed on the lipseal and lowered into the volume of the electroplating device configured to hold an electroplating bath without physically contacting the first nozzle or nozzle arm. In certain such embodiments, in the cleaning position, the first nozzle is positioned such that it is substantially pointed at the inner circular edge of the lipseal and/or cup bottom of the electroplating device. In certain embodiments, the nozzle arm actuator is configured to rotate the nozzle arm about an axis of rotation moving the nozzle arm between the retracted position and the cleaning position. In some embodiments, the metal deposits include a tin/silver alloy. In some embodiments, the first nozzle is a jet nozzle.

Also disclosed herein are electroplating apparatuses for electroplating metal onto a patterned semiconductor substrate. In some embodiments, the electroplating apparatuses may include a substrate holder, an electroplating cell having a volume for holding an electroplating bath fluid, a power supply configured to supply electrical charge, and a substrate holder cleaning apparatus as described in the preceding paragraph. In some embodiments, the substrate holder may include a cup having a cup bottom, a lipseal mounted in the cup, a plurality of electrical contact fingers, and a cone movable relative to the cup and lipseal and configured to secure a substrate in the substrate holder by pressing the substrate into the lipseal. In certain such embodiments, the power supply of the electroplating apparatus supplies electrical charge to the contact fingers.

In some embodiments, the substrate holder of the electroplating apparatus may be movable between a plurality of vertical positions within the electroplating apparatus. In certain such embodiments, the positions include: a loading position for opening the substrate holder, loading the substrate, and closing the substrate holder; an electroplating position wherein a substrate loaded in the substrate holder is positioned such that the surface of the substrate to be electroplated upon is positioned within the volume of the electroplating cell which holds the electroplating bath fluid; and a cleaning position wherein, without a substrate loaded in the substrate holder, the lipseal and/or cup bottom are positioned relative to the cleaning apparatus such that electroplated metal deposits on the lipseal and/or cup bottom may be removed by the cleaning apparatus.

In some embodiments, an electroplating apparatus may further include a controller. The controller may have machine readable instructions which it is configured to execute. In some embodiments, the instructions may include: instructions for moving the substrate holder to the loading position, receiving a substrate, and closing the substrate holder; instructions for moving the substrate holder to the electroplating position and electroplating the substrate; instructions for returning the substrate holder to the loading position, opening the substrate holder, and removing the substrate; instructions for moving the substrate holder to the cleaning position; and instructions for dispensing cleaning solution from the nozzle of the cleaning apparatus while rotating the substrate holder.

In some embodiments, the cleaning apparatus may further include a nozzle arm actuator mechanically coupled to the nozzle arm and configured to move the first nozzle and nozzle arm between, when the cleaning apparatus is mounted in an electroplating device, a retracted position and a cleaning position. In some embodiments, when the first nozzle and nozzle arm are in the retracted position, the first nozzle and nozzle arm are positioned such that a semiconductor substrate may be placed on the lipseal and lowered into the volume of the electroplating device configured to hold an electroplating bath without physically contacting the first nozzle or nozzle arm. In some embodiments, when the first nozzle and nozzle arm are in the cleaning position, the first nozzle is positioned such that it is substantially pointed at the inner circular edge of the lipseal and/or cup bottom of the electroplating device. In certain such embodiments, the machine readable instructions of the controller may further include instructions for moving the nozzle arm actuator of the cleaning apparatus to its cleaning position prior to moving the substrate holder to the cleaning position, and also may further include instructions for returning the nozzle arm actuator to its retracted position after moving the substrate holder out of the cleaning position.

In some embodiments, an electroplating apparatus may further include a reclaim shield and a rinse shield. In certain such embodiments, the plurality of vertical positions within the electroplating apparatus between which the substrate holder is movable may include: a reclaim position wherein the substrate is positioned above the volume of the electroplating cell which holds the electroplating bath fluid but below a reclaim shield such that rotating the substrate at this position between about 150 and 750 RPM causes at least a portion of any electroplating bath fluid adhered to the substrate to be flung against the reclaim shield and returned to the volume of the electroplating cell which holds the electroplating bath; and a rinse position for rinsing the substrate with a rinse solution wherein the substrate is positioned above the reclaim shield but below the rinse shield such that rotating the substrate at this position between about 150 and 750 RPM causes at least a portion of any rinse solution and/or electroplating bath fluid adhered to the substrate to be flung against the rinse shield and not returned to the volume of the electroplating cell which holds the electroplating bath. In certain such embodiments, the machine readable instructions of the controller may further include instructions for moving the substrate holder to the reclaim position and rotating the substrate holder and substrate, and also may include instructions for moving the substrate holder to the rinse position and rinsing the substrate while rotating the substrate holder and substrate.

In some embodiments, the electroplating apparatus may further include a retractable cleaning shield located above the volume of the electroplating cell which holds the electroplating bath and below the first nozzle and substrate when the substrate holder is positioned in the cleaning position.

BRIEF DESCRIPTION OF THE DRAWINGS

FIGS. 1B-1, 1B-2, and 1B-3 schematically illustrate undesirable tin-silver deposition on the lipseal and cup bottom of an electroplating substrate holder.

FIGS. 1C and 1C-1 schematically illustrate one mechanism of undesirable tin-silver deposition on the cup bottom of an electroplating substrate holder.

FIGS. 1D-1, 1D-2, 1D-3, and 1D-4 display photographs of a cup bottom illustrating severe damage caused by undesirable tin-silver deposition.

FIG. 5A presents a cutaway view of the electroplating apparatus of FIGS. 4A and 4B showing the electroplating apparatus's built-in cleaning apparatus in its retracted position.

FIG. 5B presents a top view of the electroplating apparatus of FIGS. 4A and 4B showing the electroplating apparatus's built-in cleaning apparatus in its cleaning position.

FIG. 5C presents a drawing of the nozzle and nozzle arm of the cleaning apparatus schematically presented in FIGS. 4A, 4B, 5A, and 5B, with the nozzle and nozzle arm in the retracted position.

FIG. 5D presents a drawing of the nozzle and nozzle arm of the cleaning apparatus schematically presented in FIGS. 4A, 4B, 5A, and 5B, with the nozzle and nozzle arm in the cleaning position.

FIGS. 11B-1, 11B-2, 11B-3, and 11B-4 display photographs of an electroplating substrate holder prior to the Marathon Test presented herein.

FIGS. 11C-1, 11C-2, 11C-3, and 11C-4 display photographs of an electroplating substrate holder after electroplating 500 blanket test wafers in the Marathon Test presented herein employing the cleaning methods described herein with a cleaning interval of 5 wafers.

FIGS. 11D-1, 11D-2, 11D-3, and 11D-4 display photographs of an electroplating substrate holder after electroplating 200 blanket test wafers in the Marathon Test presented herein without employing the cleaning methods described herein.

FIGS. 11E-1, 11E-2, 11E-3, and 11E-4 display photographs of an electroplating substrate holder after electroplating 500 blanket test wafers in the Marathon Test presented herein without employing the cleaning methods and apparatuses described herein.

FIGS. 11F-1, 11F-2, 11F-3, 11F-4, and 11F-5 display photographs of an electroplating apparatus's high-resistance virtual anode illustrating the contamination which may accumulate thereon after plating 0, 100, 300, 400, and 500 blanket test wafers, respectively, when the cleaning methods and apparatuses described herein are not employed.

FIGS. 11G-1, 11G-3, and 11G-4 display additional photographs of an electroplating apparatus's high-resistance virtual anode illustrating the contamination which may accumulate thereon when the cleaning methods and apparatuses described herein are not employed.

FIG. 11G-2 displays a photograph of an electroplating apparatus's top hat illustrating that some contamination has accumulated in the top hat despite not employing the cleaning methods and apparatuses disclosed herein.

FIGS. 11H-1, 11H-2, and 11H-3 display photographs of an electroplating apparatus's top hat illustrating the contamination which may accumulated in the top hat when employing the cleaning methods and apparatuses disclosed herein.

FIG. 11I-1 displays a photograph of the rinse shield of an electroplating apparatus's top hat, clean prior to electroplating any wafers.

FIGS. 11I-2 and 11I-3 display photographs of the rinse shield of an electroplating apparatus's top hat illustrating the contamination which may accumulated in the rinse shield after electroplating 250 and 500 wafers, respectively, when employing the cleaning methods and apparatuses disclosed herein.

DETAILED DESCRIPTION

Introduction

Figures 1, 1A:
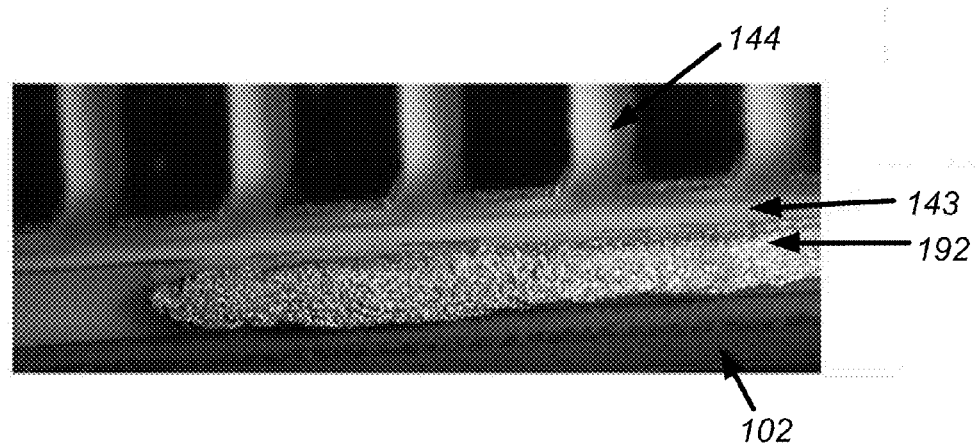
FIGS. 1A-1 and 1A-2 display photographs of the inner circular edge of a lipseal and cup bottom after a series of tin-silver electroplating operations.
Figures 1, 1A, 2:
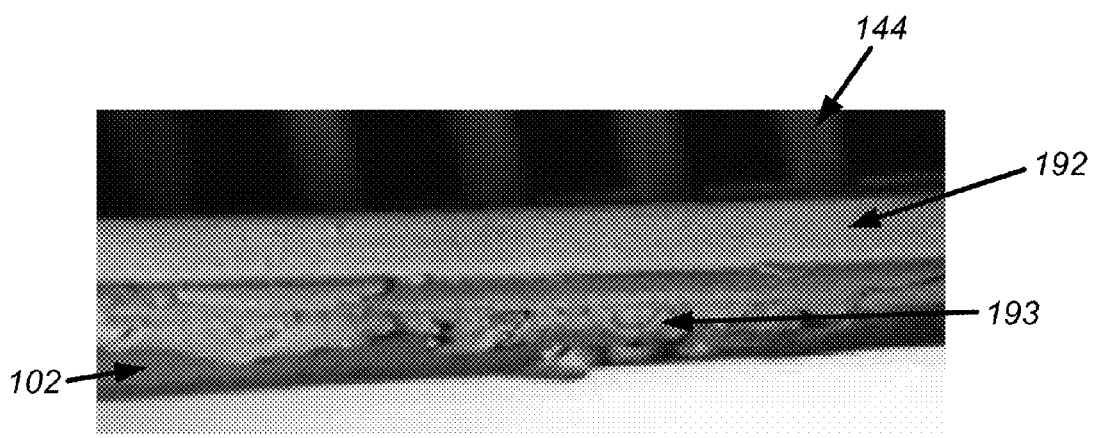

While there is currently strong interest in the electroplating of tin-silver alloys for various electrofill applications in the semiconductor fabrication arts, spurious lipseal deposition of tin-silver alloys—and also spurious cup bottom deposition—has proven problematic. The problem is exemplified in FIGS. 1A-1 and 1A-2. FIG. 1A-1 displays a photograph of the inner circular edge of a lipseal 143 and cup bottom 102 after a series of tin-silver electroplating operations on 120 substrates. Shown in the photograph is the presence of significant tin-silver deposition on the lipseal 143. FIG. 1A-2 displays a similar photograph of the inner circular edge of another lipseal 143 and cup bottom 102 after another series of electroplating operations. In this instance, significant deposition is evident on the cup bottom 102 in addition to the lip seal 143. This undesirable deposition needs to be periodically removed to avoid catastrophic failures such as a drop in the quality and yield of the work piece or wafer, or damage to the plating equipment.

Without being limited to a particular theory, it is believed that the root cause, at least in part, of spurious tin-silver alloy deposition are the significantly differing reduction potentials of atomic tin versus atomic silver. It is further believed that the growth of spurious tin-silver deposits occurs by way of a displacement reaction on the surface of the lipseal and cup bottom resulting in a substitution of 2 silver atoms (having oxidation state +1) for every atom of tin (having oxidation state +2). Once again, without being limited to a particular theory, it is believed that other alloys formed from other combinations of metals having significantly differing reduction potentials may also lead to the same or similar problems involving spurious metallic deposition on lipseals and/or cup bottoms. Some examples include copper-indium, nickel-palladium, silver-indium, copper-tin, and iron-cobalt alloys, for example.

Figures 1, 1B:
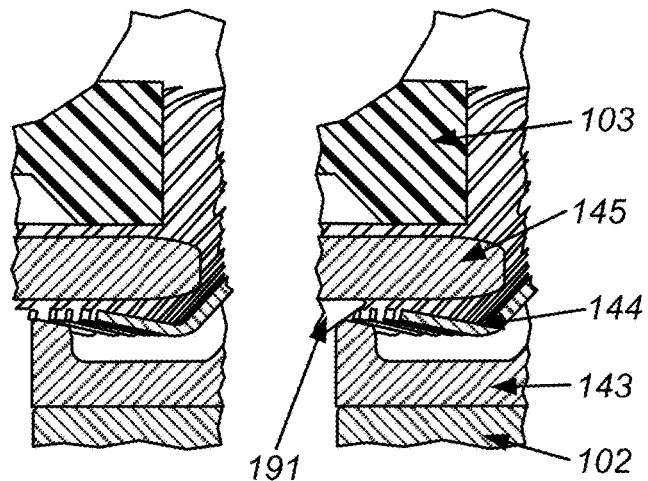
Figures 1, 1B, 2:
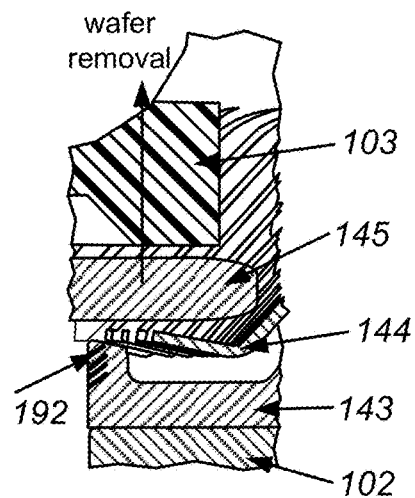

Further characterization of the formation of these deposits, the manner in which they nucleate, and the manner in which they grow, will act to further illustrate the magnitude of the problem. Oftentimes, unintended/spurious deposition begins or is initiated at the lipseal of the electroplating device (which does, of course, serve as a contact point between the substrate and electroplating device) and subsequently progresses to other surfaces of the substrate holder, such as the cup bottom. FIG. 1B-1, for example, illustrates a spurious tin-silver deposit 191 formed on the working (front) surface of a substrate 145 loaded in an electroplating device's substrate holder—which includes lipseal 143, cup bottom 102, contact fingers 144, and cone 103 (each of which is to be described in more detail below). FIG. 1B-1 shows that the deposit 191 is physically contacting the lip seal 143. Such a spurious deposit at the edge of the substrate and in the vicinity of the lip seal may be due to the localized absence of photoresist in this region due to, for example, edge defects, substrate misalignment, and other potential causes. Furthermore, a tin-silver plated feature and layer may be thicker than the photoresist layer and, as a result, may cause "bump-out" plating. "Bump out" plating is sometime used to save cost because it can enable the use of less material (a thinner photoresist film), but that saving should be balanced with the difficulty in controlling and avoiding feature to feature encroachment and shorting, as well as a higher propensity for lip seal plating. In any event, when the cone 103 of the substrate holder is raised in order to allow removal of the substrate 145 from substrate holder as shown in FIG. 1B-2, such a tin-silver deposit may break its connection with the substrate 145 and remain connected to the lip seal 143—or remain connected to some other components such as cup bottom 102. (Note, that in this scenario, while the substrate may still be resting temporarily on the lipseal, and therefore in physical contact with it, raising of the cone 103 has released the pressure on the back side of the substrate 145 so that it no longer compresses the lipseal 143 to the same degree. The physical change in the interface between substrate 145 and lipseal 143 thus may cause the deposit to break its connection with one or the other, in this case, the substrate.) In this manner, releasing the cone 103 may cause some residual and discontinuous tin-silver deposits 192 to be retained in the lip seal 143 during substrate (e.g. wafer) removal. Once retained on either the lipseal or cup bottom, the deposits may serve as active nuclei for further tin-silver deposition.

FIG. 1B-1 shows that the deposit 191 is physically contacting the lip seal 143. Such a spurious deposit at the edge of the substrate and in the vicinity of the lip seal may be due to the localized absence of photoresist in this region due to, for example, edge defects, substrate misalignment, and other potential causes. Furthermore, a tin-silver plated feature and layer may be thicker that the photoresist layer and, as a result, may cause "bump-out" plating. "Bump out" plating is sometime used to save cost because it can enable the use of less material (a thinner photoresist film), but that saving should be balanced with the difficulty in controlling and avoiding feature to feature encroachment and shorting, as well as a higher propensity for lip seal plating. In any event, when the cone 103 of the substrate holder is raised in order to allow removal of the substrate 145 from substrate holder as shown in FIG. 1B-2, such a tin-silver deposit may break its connection with the substrate 145 and remain connected to the lip seal 143—or remain connected to some other components such as cup bottom 102. (Note, that in this scenario, while the substrate may still be resting temporarily on the lipseal, and therefore in physical contact with it, raising of the cone 103 has released the pressure on the back side of the substrate 145 so that it no longer compresses the lipseal 143 to the same degree. The physical change in the interface between substrate 145 and lipseal 143 thus may cause the deposit to break its connection with one or the other, in this case, the substrate.) In this manner, releasing the cone 103 may cause some residual and discontinuous tin-silver deposits 192 to be retained in the lip seal 143 during substrate (e.g. wafer) removal. Once retained on either the lipseal or cup bottom, the deposits may serve as active nuclei for further tin-silver deposition.

While these active nuclei are initially disconnected from the wafer or from each other, through the course of multiple electroplating cycles, further deposition at these nucleation sites may cause some of the nuclei to become connected and form a semi-continuous conductive surface. If and when this surface contacts a portion of the substrate being electroplated, it may in effect become an additional seed layer (at least locally) and thus receive additional electroplated material as such. Furthermore, the initially discontinuous nuclei, which may primarily be composed of tin, will likely undergo a displacement reaction with the more noble silver ions in the electrolyte according to Eqs. 1 and 2:

$$Sn \rightarrow Sn^{+2} + 2e^-  \quad (Eq. 1),$$

$$2Ag^+ + 2e^- \rightarrow 2Ag \quad (Eq. 2).$$

As mentioned above, this yields a significant net volume increase in the deposited metal. The effect is that these nuclei tend to grow in size even if not reconnected to an external current source and become physically and electrically connected to each other or back to the current source over time. Considering the above reactions and the relative densities of silver and tin, the tin/silver substitution reaction is estimated to cause a net volume change of about 40% in the spurious tin-silver deposits. Thus, the initially discontinuous nuclei become a significant plating surface over time. Nuclei may form on the lipseal, but they may also form on the cup bottom, or both. Likewise, as shown in FIG. 1B-3, initial deposits 192 on the lipseal 143 may serve as nucleation sites which grow and extend over time forming deposits 193 on the cup bottom 102. Note, that while this disclosure has focused on tin-silver deposition, and the deposition mechanism presented in Eqs. 1 and 2, other types of deposits and other deposition mechanisms may also occur during tin-silver alloy electroplating. Some which have been observed involve forming silver and/or tin metal containing heterogeneous colloids.

Figures 1, 1B, 2, 3:
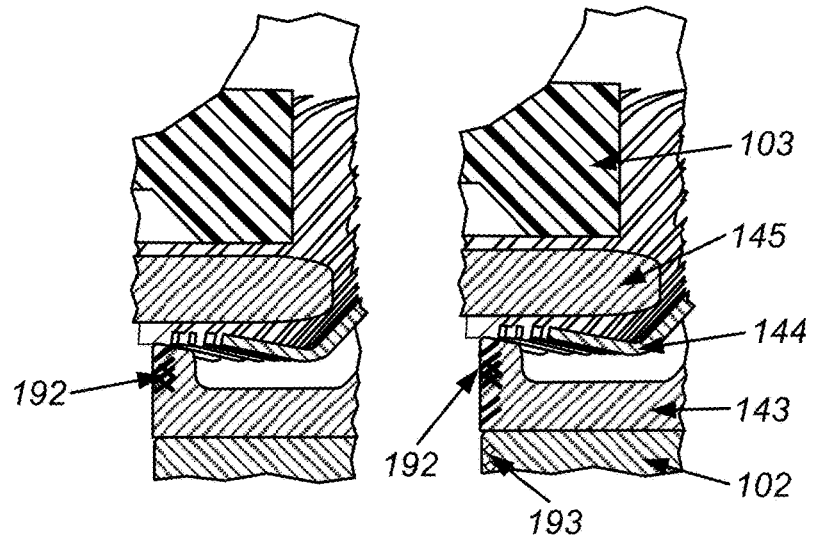
Figure 1C:
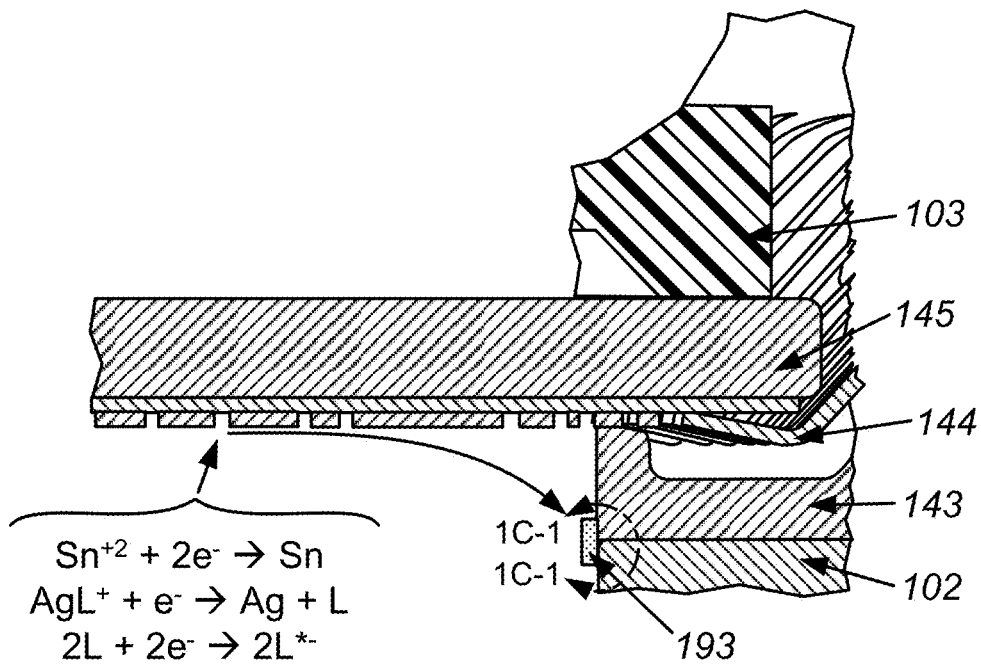
Figures 1, 1C:
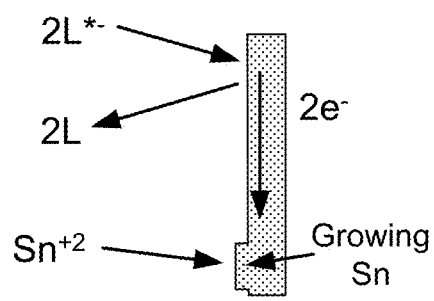

While it is believed that tin-silver deposition on the cup bottom occurs via expansion of nucleation sites on the lipseal as shown in FIG. 1B-3, it is also believed that direct tin-silver deposition on the cup bottom can occur. One possible mechanism, illustrated in FIGS. 1C and 1C-1, is a process wherein some edge material, rather than being electroplated and remaining on the substrate, is electrochemically removed from the substrate and then re-plated onto the cup bottom. Without being restricted to any particular theory, it is believed that the typical deposition rate of this sort of build-up on the lip seal and cup bottom is non-linear in time, increasing towards the later stages of the overall electroplating process. FIGS. 1C and 1C-1 illustrate the process in detail which again, without being limited to a particular theory, is believed to proceed according to the mechanism described by Eqs. 3-7:

$$Sn^{2+} + 2e^- \rightarrow Sn \text{ (tin deposition on substrate)} \quad (Eq. 3),$$

$$AgL^+ + e^- \rightarrow Ag + L \text{ (silver deposition on substrate)} \quad (Eq. 4),$$

$$L + e^- \rightarrow L^{*-} \text{ (removal of electrons from substrate by } L^*) \quad (Eq. 5),$$

$$L^{*-} \rightarrow L + e^- \text{ (transfer of } e^- \text{ from } L^* \text{ to cup bottom nucleation site)} \quad (Eq. 6),$$

$$Sn^{2+} + 2e^- \rightarrow Sn \text{ (tin deposition at cup bottom nucleation site)} \quad (Eq. 7).$$

Following the schematic of FIGS. 1C and 1C-1, and Eqs. 3-7, the notion is that tin and silver are deposited in the normal fashion on the substrate (FIG. 1C), but leftover silver ligands may act as a vehicle for reducing and for transferring electrons from the substrate to locations on the lipseal and/or cup bottom where tin ions can then receive the electrons (FIG. 1C-1) and plate out of solution.

It is also believed that spurious metal deposition away from the substrate may essentially act as a "cathode current thief" due to the fact that these deposits may behave as alternate sites for electroplating. In so doing, spurious deposition may redirect current distribution in the electroplating cup and, in particular, redirect it away from features at or near the interface between the lip seal and substrate which, in turn, may lead to degradations in electroplating near the substrate edges. It also may cause non-uniformity in deposition thicknesses and alloy compositions. Once the spurious deposition site has a substantial amount of coverage, the "thieving current" becomes large enough to cause severe degradation and defects in packaging and wafer level packaging (WLP) applications. As such, this unintended deposition may stochastically transition from being relatively insignificant to causing catastrophic failures, usually in a sudden manner.

Figures 1, 1D:
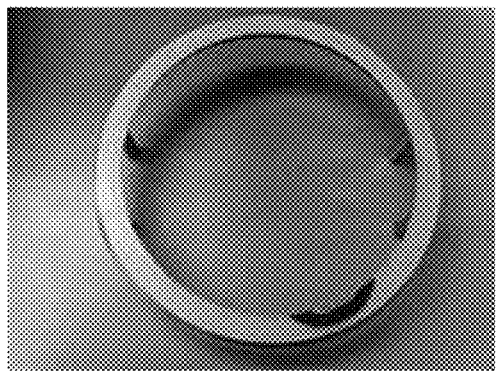
Figures 1, 1D, 2:
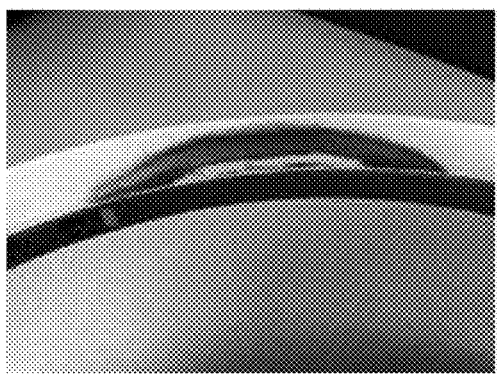
Figures 1, 1D, 2, 3:
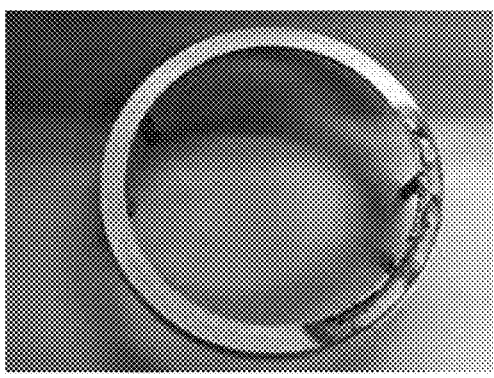

FIGS. 1D-1 shows an example of the sort of catastrophic failure which may be caused by major deposition on the cup bottom; the damaged area is magnified in FIG. 1D-2. The electroplating cup displayed in FIG. 1D-3 shows even greater damage, which is magnified in FIG. 1D-4. In this latter case, the cup may become permanently damaged, pitted and decayed as a result of the unintended tin-silver deposition. This sort of damage to the lip seal and cup bottom, and even less visible types of damage, may prevent these elements from properly sealing a substrate in the substrate holder. The result is an increased likelihood of electroplating fluid penetrating into normally sealed regions of the electroplating device and potentially contacting various sensitive elements—electrical contact fingers 144, for example, as shown in FIGS. 1A-1 and 1A-2. In extreme cases, damage may be so extensive that these expensive and precision manufactured parts can't be reworked (e.g. by disassembly, etching of the deposited metals, reassembly) but must be replaced.

In any event, due to current interest in the use of tin-silver alloys as metallization and solder materials for semiconductor processing and the tendency of these alloys to buildup on lipseal and cup bottom components of electroplating devices, effective lipseal cleaning methods and apparatuses are desired for the removal of spurious tin-silver alloy deposits. In some embodiments, an automated lipseal cleaning process (which also may include cleaning of the cup bottom) is preferred, which potentially avoids exposing technicians tasked with manual lipseal cleaning to potentially corrosive and/or toxic chemical agents such as concentrated nitric acid solutions. In addition, such an "autoclean" process potentially eliminates (or at least reduces) the errors or hardware damage associated with manual cleaning. Moreover, in some embodiments, autoclean methods and apparatuses may effectively remove most or all metal deposits from the lipseal and/or cup bottom, may keep the lipseal substantially clean of metal buildup, may substantially remove any broken film from the lipseal, and may substantially prevent and/or avoid the formation of metal deposits on the cup bottom. In some embodiments, autoclean methods and apparatuses may effectively use distilled/deionized water as a cleaning agent rather than employing a potentially harmful, dangerous, and/or expensive chemical agent such as concentrated nitric acid, for instance. It is also advantageous if such autoclean methods and apparatuses substantially prevent dislodged metal deposits and any other metal from entering the electroplating bath or other regions of an electroplating device, thus having little or no impact on bath composition through dilution or chemical contamination. Ideally, in some embodiments, all of the foregoing may be accomplished in a virtually fully automated fashion.

Electroplating Processes and Contamination in Integrated Circuit Fabrication

A brief description of electroplating processes and sources of contamination in the context of integrated circuit fabrication will now be provided. Electrochemical deposition may be employed at various points in the integrated circuit fabrication and packaging process. The first steps in making transistors are referred to as front end of the line (FEOL) processing. The processes involved in making the metal interconnections are referred to as back end of the line (BEOL) processing. At the IC chip level, damascene features are created during BEOL processing by electrodepositing copper or other sufficiently conductive material within vias and trenches to form multiple interconnected metallization layers. Generally, there is an increasing hierarchy of larger interconnect feature scales moving away from the transistor level. The back end of the line generally ends with hermetic sealing of the wafer (e.g. with SiN), referred to as a wafer passivation layer. Above the multiple pre-passivation interconnection metallization layers, the packaging of the chip occurs. Packaging—including wafer level packaging (WLP)—generally starts with the process of exposing metal pads residing beneath the passivation layer, and ending in a chip in a package. Packaging can be performed on a die (where the wafer is diced and then processed) or in part on a wafer level. More advanced packaging tends to be wafer level packaging, and involves electrodeposition to/from much finer bump and redistributions lines, as opposed to ball placement and more conventional wire bond. Various wafer level packaging structures may be employed, some of which may contain alloys or other combinations of two or more metals or other components. For example, the packaging may include one or more bumps made from solder or related materials. A typical example of a solder plated bump starts with a conductive substrate seed layer (e.g., a copper seed layer) having a first plated layer, an under bump diffusion barrier layer of plated nickel between about 1-3 micrometers thick and about 80 to 120 micrometers wide or more particularly about 100 micrometers wide) under a film of lead tin solder plated pillar (e.g., about 50 to 100 micrometers thick and about 80 to 120 micrometers wide or more particularly about 100 micrometers wide). After plating, photoresist stripping, and etching of the conductive substrate copper seed layer, the pillar of solder is carefully melted or reflowed to create a solder bump or ball attached to the under bump metal.

In another scheme, which may be referred to "copper pillar" and/or "micro pillar," an under bump or pillar of a non-soldertype of plated metal, the pillar being a metal such as copper, nickel, or a combination of these two, is created below a typically thinner solder film than above. In this scheme, achieving tight/precise feature pitch and separation control may be needed. The copper pillars may be, for example, about 20-50 microns or less in width, while the features may be separated from one another by only about 75-100 micrometers center to center. The copper structures may be about 10-40 micrometers in height. On top of the copper pillar, often but not always (largely depending on the anticipated operational temperature of the final chip) a nickel or cobalt barrier film, e.g., about 1-2 micrometers thick, may be used to separate the copper from the tin containing solder and thereby potentially avoid a solid state reaction which could form various mechanically undesirable and chemically undesirable bronzes. Finally, a solder layer, typically 10-40 micrometers in thickness is added. Such schemes also enable a reduced amount of solder for the same features size, reducing cost, and/or total amount of lead (in lead containing solders) in the chip.

Recently, there has been a move in the field away from lead containing solders due to environmental and health-safety concerns. Tin-silver solder alloy bumps are of particular interest. Lead-tin materials provide good quality "bumps" for packaging and are very easy to plate, but lead's unfortunate toxicity is driving the field away from its use. For instance, the RoHS initiative (Directive 2002/95/EC of The European Parliament) requires entities to change from the established tin-lead process to a lead free one. Logical replacement bump materials include indium, tin, tin-silver binary materials, tin-bismuth binary materials, and tin-silver-copper ternary materials. However, unalloyed tin can suffer from a number of fundamental limitations and difficulties in its application, such as its tendency to form large single grained balls with varying crystal orientations and thermal expansion coefficients, and also its tendency to form "tin whiskers" which can lead to interconnect-to-interconnect shorting. Various binary and tertiary materials, such as those listed above, generally perform better and alleviate some of the issues associated with the use of pure, unalloyed tin. Without being limited to a particular theory, this may be, at least in part, due to the fact that the solder freezing process—i.e., the solder material transitioning from melt to solid state—tends to cause significant small grain precipitation and inclusion of the non-tin component into the solid state solder. Alloys of tin and silver are examples of compositions having improved properties and performance over unalloyed tin.

Deposition of silver-tin alloys is accomplished by a process that frequently employs an inert anode (rather than the potentially more desirable "active" or soluble anode). Part of the difficulty in using an active anode for this and similar systems results from the very widely separated electrochemical deposition potentials of silver and tin; the standard electrochemical potentials (Eos) of the metals are separated by more than 0.9 volts ($Ag^+/Ag$: 0.8V NHE, $Sn^{+2}/Sn$: −0.15V). Since elemental silver is substantially more noble and inert than elemental tin, it will therefore undergo a displacement reaction and electroplate out of solution onto the surface of a tin anode or tin/silver anode. This chemical "short circuit" removes (strips or extracts) the relatively low concentration of silver from the plating solution continuously, resulting in both an uncontrollable process as well as the formation of reduced silver metal on the tin anode.

Methods and apparatuses for efficient and high-quality plating when using potential-differing sets of metals are described in U.S. Prov. Pat. App. No. 61/502,590, filed Jun. 29, 2011, entitled "ELECTRODEPOSITION WITH ISOLATED CATHODE AND REGENERATED ELECTROLYTE"; U.S. Prov. Pat. App. No. 61/418,781, filed Dec. 1, 2010, entitled, "ELECTROPLATING APPARATUS AND PROCESS FOR WAFER LEVEL PACKAGING"; and U.S. patent application Ser. No. 13/172,642, filed Jun. 29, 2011, entitled, "CONTROL OF ELECTROLYTE HYDRODYNAMICS FOR EFFICIENT MASS TRANSFER DURING ELECTROPLATING"; each of which is hereby incorporated by reference in its entirety for all purposes. Nevertheless, despite the existence of high quality plating regimes when plating two or more metals, where there is a large difference in the plating potentials, there remains the issue of undesirable metal plating out on surfaces of the electroplating cup and lip seal and how to address these unintended deposits. Although the discussion herein is couched in terms of silver-tin plating, it may apply equally well to any other undesired metal deposition processes. That is, the methods and apparatuses described herein can potentially be used for addressing many types of unwanted metal or even non-metal deposits and deposition processes.

Electroplating Apparatuses

Figure 2A:
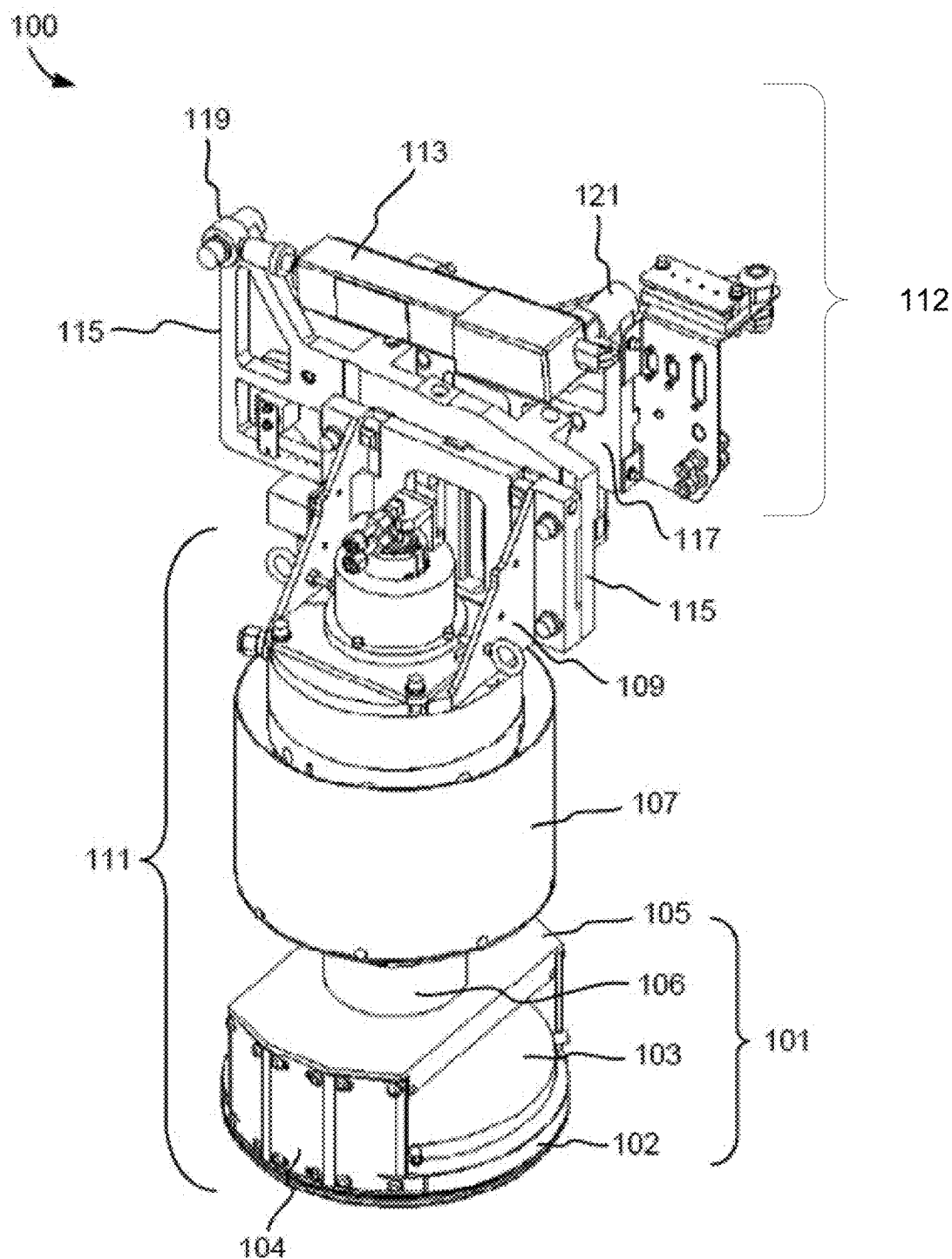
FIG. 2A presents a perspective view schematic of an electroplating apparatus.

Accordingly, described herein are methods and apparatuses for cleaning semiconductor substrate electroplating devices and, more particularly, the substrate holders of these devices. FIG. 2A provides a perspective view of a semiconductor substrate electroplating apparatus 100 to which the disclosed cleaning methods and apparatuses may be applied. Note that although FIG. 2A illustrates a particular substrate electroplating apparatus, the cleaning methods and apparatuses disclosed herein may be applied to a variety of electroplating devices, and so the instant disclosure is not limited in application to that which is disclosed in FIG. 2A.

Electroplating apparatus 100 has various features which are illustrated in FIG. 2A and also described with respect to subsequent Figures. Apparatus 100 includes a semiconductor substrate holder which may be referred to as a "clamshell." A clamshell may include a cup 102 and also a cone 103 which may clamp a semiconductor substrate securely in the cup 102.

In FIG. 2A, the cup 102 is supported by struts 104, which are connected to a top plate 105. This assembly 102-105, collectively cup/cone assembly 101, sometime referred to as the clamshell assembly, is driven by a motor 107, via a spindle 106. Motor 107 is attached to a mounting bracket 109. The spindle 106 transmits torque to a semiconductor substrate (not shown in this figure) being held/engaged by the cup/cone assembly 101 so that the substrate rotates during treatment (e.g. electroplating). Inside spindle 106 there may be an air cylinder (not visible in FIG. 2A) which provides a vertical force clamping the substrate between the cup 102 and cone 103. The entire assembly of components referenced as 102-109 (which includes the cup/cone assembly) is collectively referred to as a substrate holder 111 in FIG. 2A. Note, however, that the concept of a "substrate holder" extends generally to various combinations and sub-combinations of components for engaging/holding a substrate and/or for providing mechanisms for its movement and positioning.

Also illustrated in FIG. 2A, is a tilting assembly 112, which may include a first plate 115 slidably connected to a second plate 117. The first plate 115 is also connected to a mounting bracket 109 which is located on the distal end of the substrate holder 111. Also illustrated in FIG. 2A is a drive cylinder 113 connected to both the first plate 115 and the second plate 117 at pivot joints 119 and 121, respectively. Thus, the drive cylinder 113 may provide a drive force for sliding plate 115 across plate 117, thus positioning semiconductor substrate holder 111. The distal end of substrate holder 111 (the end having the mounting bracket 109) thus may be moved along an arced path defined by the contact region between plates 115 and 117, and therefore the proximal end of substrate holder 111 having the cup/cone assembly may be tilted with respect to a virtual pivot point. In some embodiments, this allows for the angled entry of the semiconductor substrate into a treatment solution (e.g. an electroplating bath).

The entire apparatus 100 is lifted vertically either up or down to immerse the proximal end of substrate holder 111 into a treatment solution via another actuator (not shown). Thus, a two-component positioning mechanism provides both vertical movement along a trajectory perpendicular to a treatment solution (e.g. an electrolytic electroplating bath), and also a tilting movement allowing the position of the substrate to deviate from a horizontal orientation relative to the surface of the treatment solution thus providing an angled-substrate immersion capability. A more detailed description of the movement capabilities and associated hardware of apparatus 100 is described in U.S. Pat. No. 6,551,487, filed May 31, 2001, issued Apr. 22, 2003, and titled "METHODS AND APPARATUS FOR CONTROLLED-ANGLE WAFER IMMERSION," which is hereby incorporated herein by reference in its entirety for all purposes.

Note that during electroplating, apparatus 100 is typically used with a particular plating cell having a plating chamber which houses an anode and an electrolyte. The plating cell may also include plumbing or plumbing connections for circulating electrolyte through the plating cell, and against the substrate being electroplated. The plating cell may also include membranes or other separators designed to maintain different electrolyte chemistries in an anode compartment versus a cathode compartment.

Figure 2B:
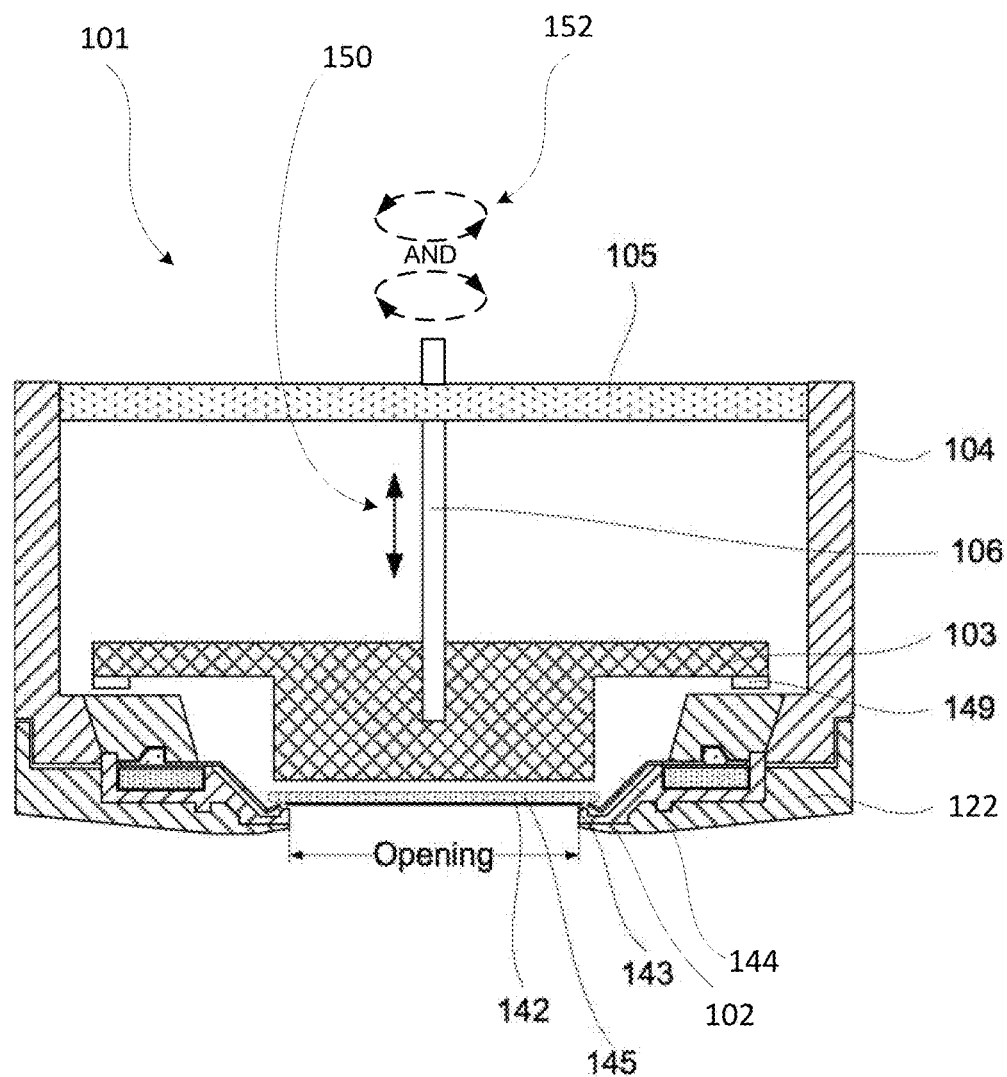
FIG. 2B presents a cross-sectional schematic of an electroplating substrate holder.

FIG. 2B provides a more detailed view of the substrate holder (also referred to as cup/cone assembly or "clamshell assembly") 101, including a cross-sectional view of cup 122 and cone 103. Note that the cup/cone assembly 101 depicted in FIG. 2B is not intended to be proportionately accurate, but rather is an exhibit stylized to promote the clarity of the following description. Cup 122, having cup bottom 102, supports the lip seal 143, the contacts 144, buss bar, and other elements, and is itself supported by top plate 105 via struts 104. Generally, a substrate 145 rests on the lip seal 143, just above the contact 144, which is configured to support it. Cup 122 also includes an opening (as labeled in the figure) through which an electroplating bath solution may contact the substrate 145. Note that electroplating takes place on the front side 142 of substrate 145. Thus, the periphery of substrate 145 rests on a bottom inward protrusion of the cup 122 (e.g., "knife-shaped" edge) or more specifically on lip seal 143 which is positioned on the bottom inward protrusion of cup 122.

Cone 103 presses down on the back side of substrate 145 to engage it and hold it in place and to seal it against lip seal 143 during submersion of the substrate into the electroplating bath during electroplating. The vertical force from cone 103, which is transferred through substrate 145. compresses lip seal 143 to form the fluid tight seal. Lip seal 143 prevents electrolyte from contacting the backside of substrate 145 (where it could introduce contaminating metal atoms directly into silicon) and from reaching sensitive components of apparatus 100, such as contact fingers that establish electrical connections to edge portions of substrate 145. This electrical connection and associated electrical contacts 144, themselves sealed and protected by the lip seal from becoming wet, is used to supply current to conductive portions of substrate 145 that are exposed to the electrolyte. Overall, lip seal 143 separates unexposed edge portions of substrate 145 from exposed portions of substrate 145. Both portions include conductive surfaces that are in electronic communication with each other.

To load a substrate 145 into cup/cone assembly 101, cone 103 is lifted from its depicted position via spindle 106 until there is a sufficient gap between the cup 102 and the cone 103 to allow insertion of substrate 145 into the cup/cone assembly 101. The substrate 145 is then inserted, in some embodiments by a robot arm, and allowed to rest lightly on the lip seal and cup 202 (or on a related component attached to the cup, such as a lip seal 143 as described below). In some embodiments, the cone 103 is lifted from its depicted position until it touches top plate 105. Subsequently, the cone 103 is then lowered to press and engage the substrate against the periphery of cup 102 or attached lip seal 143 as depicted in FIG. 2B. In some embodiments, the spindle 106 transmits both a vertical force for causing the cone 103 to engage the substrate 145, and also the torque for rotating the cup/cone assembly 101 as well as the substrate 145 being held by the cup/cone assembly. FIG. 2B indicates the directionality of the vertical force and rotational orientation of the torque by solid arrows 150 and dashed arrows 152, respectively. In some embodiments, electroplating of the substrate 145 typically occurs while the substrate 145 is rotating. In certain such embodiments, rotating the substrate 145 during electroplating aids in achieving uniform plating, and aids in removing metallic buildup removal as part of the process described in detail hereafter.

In some embodiments, there may also be an additional seal 149 located between the cup 102 and the cone 103, which engages the surfaces of the cup 102 and cone 103 to generally form a substantially fluid-tight seal when the cone 103 engages the substrate 145. The additional sealing provided by cup/cone seal 149 functions to further protect the backside of the substrate 145. Cup/cone seal 149 may be affixed to either the cup 102, or to the cone 103, engaging the alternative element when the cone 103 engages the substrate 145. Cup/cone seal 149 may be a single component seal or a multi-component seal. Similarly, lip seal 143 may be a single component seal or a multi-component seal. Furthermore, a variety of materials may be used to construct seals 143 and 149, as would be appreciated by one of ordinary skill in the art. For instance, in some embodiments, the lip seal is constructed of an elastomeric material, and in certain such embodiments, a perfluoropolymer.

Figure 3A:
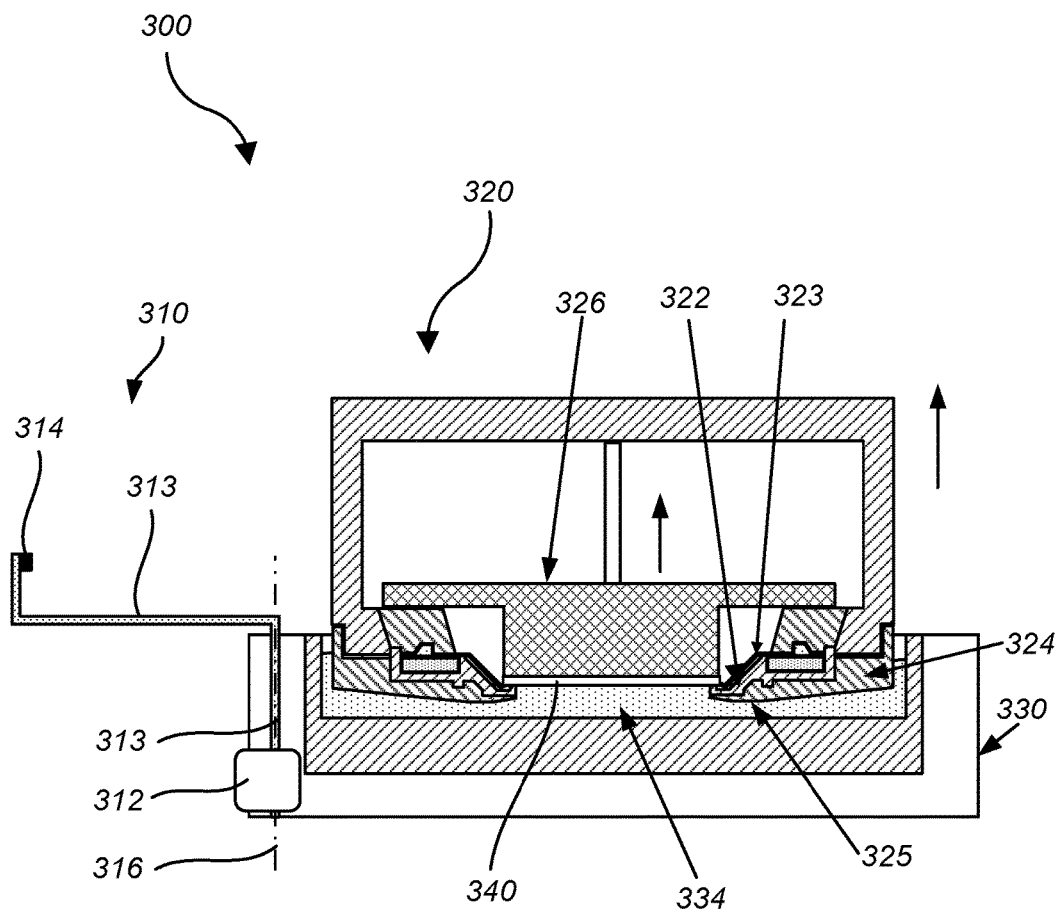
FIG. 3A presents a cross-sectional schematic of an electroplating apparatus having a built-in cleaning apparatus with its nozzle in its retracted position.
Figure 3B:
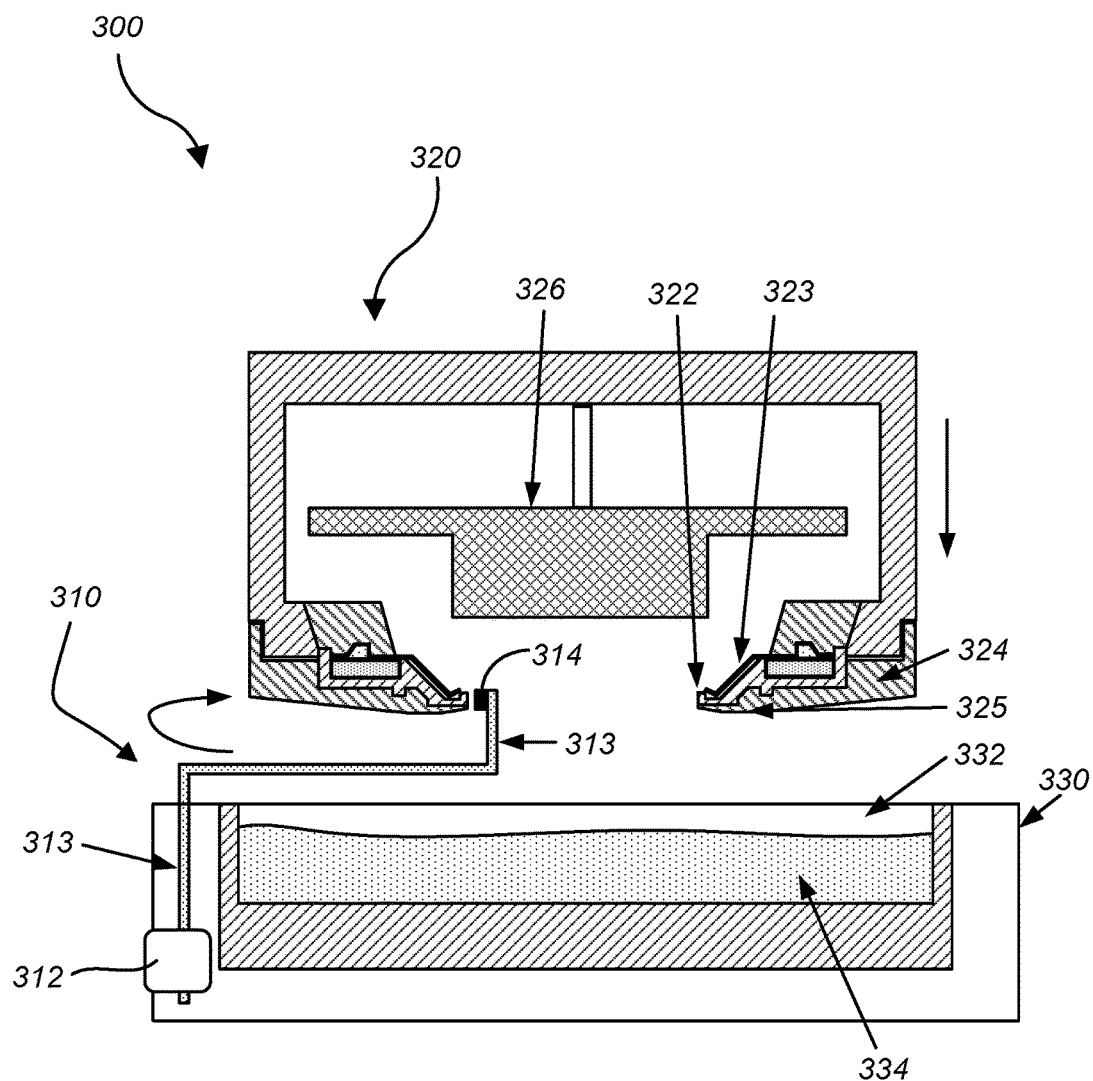
FIG. 3B presents a cross-sectional schematic of an electroplating apparatus having a built-in cleaning apparatus with its nozzle in its cleaning position.

Electroplating Apparatuses Having Built-in Lipseal and/or Cup Cleaning Apparatuses Disclosed herein are electroplating apparatuses which include a built-in cleaning apparatus (or multiple cleaning apparatuses) for cleaning spurious metal deposits from the electroplating apparatuses' substrate holder—particularly from the lip seal and/or cup bottom of the substrate holder. Note, though, that in some embodiments, the cleaning apparatuses themselves may be independent components designed to be mounted on or attached to a preexisting electroplating device. A particular example of such an electroplating apparatus 300 having a substrate holder 320 and built-in cleaning apparatus 310 is shown in FIGS. 3A and 3B. In addition to a built-in cleaning apparatus 310 and substrate holder 320, such an electroplating apparatus 300 includes an electroplating cell 330 having a volume 332 for holding an electroplating bath fluid 334. The substrate holder 320 generally has a lipseal 322 mounted in a cup 324, a cone 326 movable relative to the cup 324 and lipseal 322 and configured to secure a substrate 340 in the substrate holder 320 by pressing the substrate 340 into the lipseal 322, and also typically includes a plurality of electrical contact fingers (not shown in FIGS. 3A and 3B) which are generally protected by the lipseal 322 when a substrate 340 is sealed in the cup 324 as described above and supplied with electrical charge by a power supply of the electroplating apparatus (also not shown in FIGS. 3A and 3B).

The cleaning apparatus itself—built into, or attached/mounted to the electroplating apparatus of FIGS. 3A and 3B—includes a first nozzle 314, a first cleaning fluid supply conduit in fluidic connection with the first nozzle (not shown), and a nozzle arm 313 to which the first nozzle 314 is affixed. In some embodiments, such as the embodiment displayed in FIGS. 3A and 3B, the cleaning apparatus 310 includes a nozzle arm actuator 312 mechanically coupled to the nozzle arm 313 and configured to move the first nozzle 314 and nozzle arm 313 between a retracted position and a cleaning position. FIG. 3A illustrates the first nozzle 314 and nozzle arm 313 in the retracted position. As illustrated in the figure, in the retracted position, the first nozzle 314 and nozzle arm 313 are positioned such that a semiconductor substrate 340 may be placed on the lipseal 322 and lowered into the volume 332 of the electroplating cell 330 configured to hold the electroplating bath fluid 334 without physically contacting the first nozzle 314 or nozzle arm 313. Likewise, FIG. 3B illustrates the first nozzle 314 and nozzle arm 313 in the cleaning position wherein, as shown in the figure, the first nozzle 314 is positioned such that it is substantially pointed at the inner circular edge of the lipseal 322 and/or cup bottom 325 of the electroplating device 300.

In some embodiments, such as the embodiment displayed in FIGS. 3A and 3B, the nozzle arm actuator 312 is configured to move the nozzle 314 between retracted and cleaning positions by rotating the nozzle arm 313 about an axis of rotation 316. When nozzle arm actuator 312 rotates the nozzle arm 313 about the axis of rotation 316, nozzle 314 swings around axis 316 into a position at least within the vertical periphery of the opening, as shown in FIG. 3B. In the examples shown in FIGS. 3A and 3B, axis of rotation 316 is substantially vertical, which means that the nozzle 314 travels substantially within the horizontal plane. In this example, a vertical orientation of nozzle 314 with respect to the inner circular edge of the lipseal 322 and/or cup bottom 325 may be achieved by moving cleaning apparatus 310, or substrate holder 320, or both in the vertical direction. This vertical direction may correspond to the motion of the holder during electroplating cycles.

In another example (which is not shown in FIGS. 3A and 3B), an axis of rotation may be at a non-zero angle relative to the vertical direction and rotation about the axis may correspond to both horizontal and vertical motions of the nozzle or other cleaning device. In certain embodiments, the electroplating apparatus 300 may be designed and configured to operate in such a way that rotation of the nozzle arm 313 alone is sufficient to bring nozzle 314 into the needed initial position with respect to the inner circular edge. In other embodiments, vertical motion of nozzle 314 may be provided by vertical motion of nozzle arm 313 via nozzle arm actuator 312—such as, for example, by nozzle arm actuator 312 causing nozzle arm 313 to slide within a housing up-and-down along its axis of rotation. In certain such embodiments, a vertical motion of the nozzle without any substantial rotational motion may be sufficient to bring the nozzle in close enough proximity to the inner circular edge for a cleaning operation. In some embodiments, a cleaning apparatus 310 may include an extendable nozzle arm with the nozzle attached at one end, and the extension of the nozzle arm is all that is required to bring the nozzle into sufficient proximity to the inner circular edge for a cleaning operation. The nozzle arm may extend along its axis with respect to its supporting structure or housing to accomplish this. Once again, throughout the foregoing, it is to be understood that nozzle 314 in FIGS. 3A and 3B could be replaced with a different type of cleaning device, such as a brush or swab for applying cleaning solution depending on the embodiment. As such, the substitution of various types of cleaning devices for nozzle 314 is within the scope of the present disclosure.

Thus, FIG. 3A illustrates the electroplating apparatus 300 in its electroplating mode and FIG. 3B illustrates the electroplating apparatus 300 in its cleaning mode, and as shown in these figures, the substrate holder 320 is movable within the electroplating apparatus 300 between different vertical positions depending on the mode of the electroplating apparatus. Specifically, FIG. 3A illustrates the substrate holder 320 vertically positioned in the electroplating position and holding a substrate 340 such that the surface of the substrate 340 to be electroplated upon is positioned within the volume 332 of the electroplating cell 330 which holds the electroplating bath fluid 334. In this position, the wafer holder 320 supports the substrate 340 and submerges it into the electroplating bath fluid/solution 334. Further, note that in this electroplating mode, the cleaning system 310 is positioned away from substrate holder 320 to avoid any interference with its vertical motion between various positions within the electroplating apparatus 300.

Likewise, FIG. 3B illustrates an empty substrate holder 320 (i.e. not holding a substrate) vertically located within the electroplating apparatus 300 at a cleaning position wherein the lipseal 322 and/or cup bottom 325 are positioned relative to the cleaning apparatus 310 such that electroplated metal deposits on the lipseal 322 and/or cup bottom 325 may be removed by the cleaning apparatus 310. Because, in the cleaning mode, no substrate 340 is present in the substrate holder 320, there is an opening in the bottom of the substrate holder defined by the inner circular edge of the lipseal 322 and/or cup bottom 325 of the substrate holder 320. In FIG. 3B, a portion of cleaning system 310 that includes nozzle 314 protrudes through this opening such that nozzle 314 is located at a predetermined position with respect to the inner circular edge of the lipseal and/or cup bottom. Also note that while not shown in FIGS. 3A and 3B, an electroplating apparatus 300 typically also includes a vertical positioning or "drive mechanism" for positioning of the substrate holder 310 at various up and down and between vertical levels or target positions, one referred to as a loading position which is used for opening the substrate holder, loading/unloading the substrate, and closing the substrate holder, another position referred to as an electroplating position which is used for positioning the substrate into the electroplating bath solution, another position referred to as the reclaim position for removing excess entrained fluid from the substrate and substrate holder, another referred to the rinse position for generally rinsing the substrate bottom with a spray of rinse solution (e.g., water), and another referred to as a cleaning position for performing the lip seal cleaning operations as detailed here.

Figure 3C:
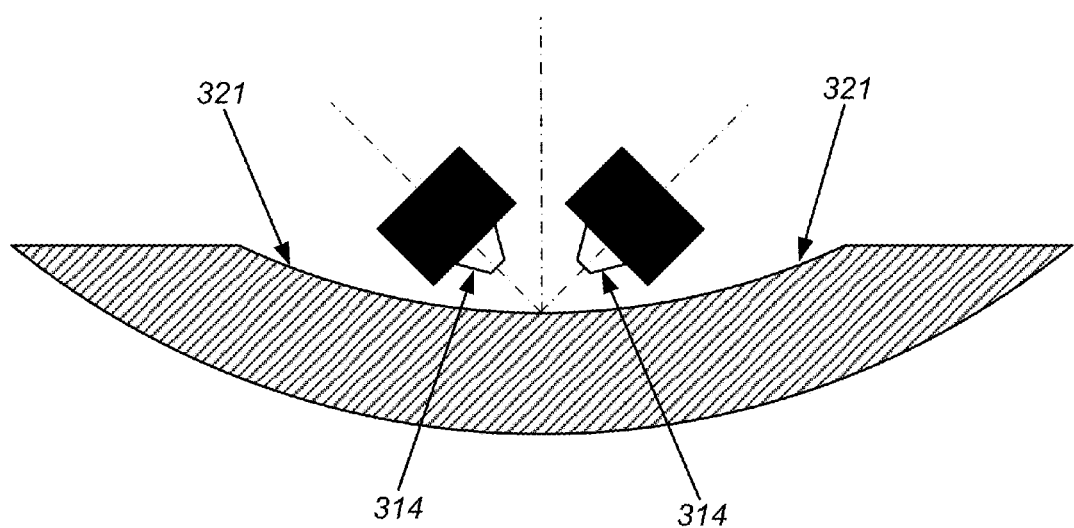
FIG. 3C schematically illustrates a pair of nozzles having equal and opposite angles relative to the normal vector of the inner circular edge of an electroplating substrate holder.

The predetermined location and position of the cleaning device relative to the inner circular edge of the lipseal and/or cup bottom during cleaning may depend on the type of cleaning device—i.e., whether it is a nozzle and what type of nozzle, or whether it is other type of cleaning device. For example, cleaning devices such as swabs and brushes are typically positioned in direct contact with the inner circular edge to ensure at least some shear force is generated between the two during rotation of the substrate holder. Nozzles, on the other hand, are positioned some distance away. Furthermore, in order to prevent splash back, nozzles (e.g., sonic nozzles and/or high-pressure jet nozzles) may be positioned at an angle other than normal with respect to a surface forming the inner circular edge. This is illustrated in FIG. 3C which shows two nozzles 314 located at some non-zero distance away from the inner circular edge 321 (of a hypothetical lipseal and/or cup bottom). Thus, generally, the cleaning apparatuses disclosed herein may, in some embodiments, include a second nozzle. Additionally, in certain such embodiment apparatuses employing a second nozzle, the apparatuses may additionally employ a second cleaning fluid supply conduit in fluidic connection with the second nozzle. Depending on the embodiment, the two nozzles may be connected to the same or different actuating nozzle arms. The pair of nozzles 314 illustrated in FIG. 3C have equal and opposite angles relative to the normal vector of the inner circular edge 321. In certain embodiments, this angle may vary from between about 0 and 60 degrees or, more specifically, between about 30 and 45 degrees.

Of course, FIG. 3C also illustrates, generally, that a substrate holder cleaning apparatus may employ multiple cleaning devices, and specifically, that such an apparatus may employ multiple cleaning fluid dispensing nozzles 314. Note, however, that when multiple cleaning devices are used in a cleaning apparatus, all may be of the same type (e.g., a cleaning device having multiple nozzles as shown in FIG. 3C), but they need not be: a cleaning apparatus may employ different types of cleaning devices in various combinations (e.g., a combination of a sonic nozzle and swab) depending on the embodiment. Also note that depending on the embodiment, multiple cleaning devices may be positioned on the same support structure or multiple support structures. In embodiments employing swab and brush-type cleaning devices, these devices may receive a low-pressure fluid stream, and they may be rotated while cleaning to provide additional shear forces at the point of contact. Furthermore, the initial position of a swab or brush-type cleaning device may be changed (e.g., angles, vertical orientation, distance from the edge) during this operation.

Figure 3D:
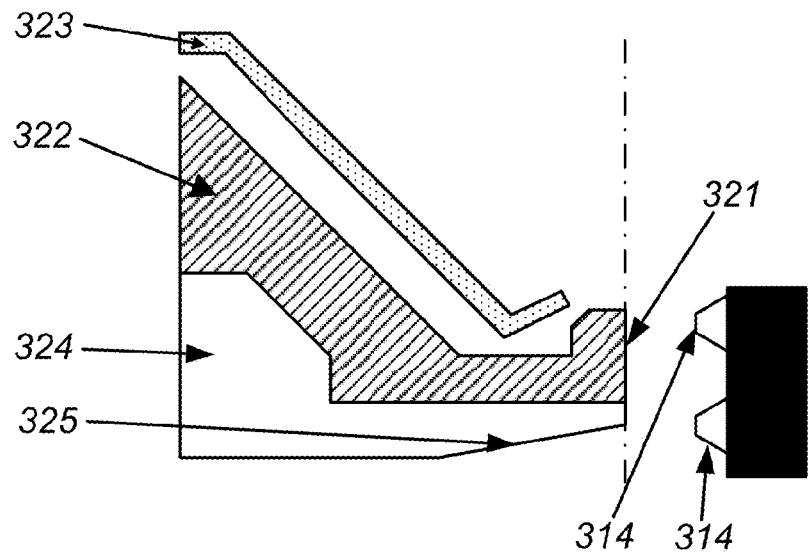
FIG. 3D schematically illustrates a pair of nozzles having different vertical positions relative to the inner circular edge of an electroplating substrate holder.
Figure 3E:
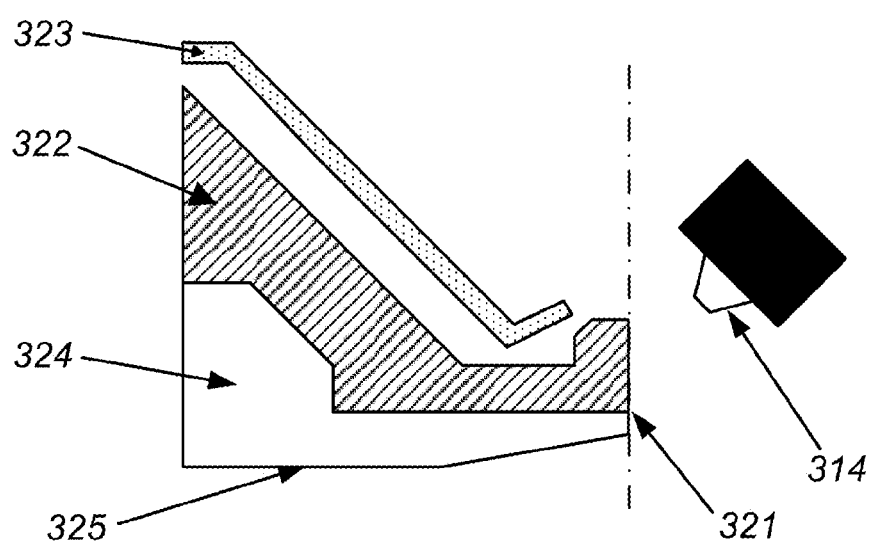
FIG. 3E schematically illustrates a nozzle which is angled downward with respect to the horizontal plane of the inner circular edge of an electroplating substrate holder.

Returning to the multi-nozzle embodiment, in some cases, such as that schematically illustrated in FIG. 3C, there may be two nozzles 314 directed at roughly the same point on the inner circular edge 321. In some embodiments, the respective angles of the nozzles 314 with respect to the inner circular edge 321 may be roughly equal, or they may be roughly equal but opposite to each other as shown in FIG. 3C, or they may have completely different angles with respect to the inner circular edge. However, in other embodiments, multiple nozzles may have different orientations and be directed at different points on the inner circular edge such as schematically illustrated in FIG. 3E. Multiple nozzles having varying orientations and hitting the inner circular edge at different points may be useful for providing different types of forces that act on the surface contaminants. For example, a flake of metal deposit may be loose at one end but well attached to the inner circular edge on its other end. If a nozzle is angled in such a way that a stream of cleaning fluid is forced underneath it, in between the loose end and the surface of the edge, the flake may easily separate and be removed. On the other hand, if the nozzle were angled such that the stream of cleaning fluid pushes the loose end towards the surface of the edge, the flake's removal may become significantly more challenging. Since it is impossible to predict how the contaminants will be distributed and attached to the surface, different or variable nozzle orientations may be advantageous. Furthermore, changing the rotational speed and even direction of the substrate holder may also help to alter the forces acting on contaminants even for the same nozzle orientation. Thus, in certain embodiments, a cleaning cycle may involve changing rotational direction and/or speed of the substrate holder.

FIG. 3C illustrates multiple nozzles having orientations which are varied within the horizontal plane and, specifically, have varying angles with respect to the inner circular edge's normal vector. However, some embodiments may employ multiple nozzles at different vertical positions, as shown in FIG. 3D, such that the streams of cleaning fluid dispensed from these nozzles impact the inner circular edge at different vertical points. Moreover, in some embodiments, one or more nozzles, such as the nozzle schematically illustrated in FIG. 3E, may be angled vertically with respect to the horizontal plane within which lies the inner circular edge. In this case the nozzle is angled downward with respect to the horizontal plane of the inner circular edge, however in embodiments described below (see FIGS. 4A and 4B), a nozzle may be angled upwards with respect to the horizontal plane of the circular edge. And, it is possible to have multiple nozzles with varying vertical angles with respect to the horizontal plane of the inner circular edge analogously to the variations in angle relative to the inner circular edge's normal vector as shown in FIG. 3C. In addition (as described more fully below), a single nozzle may be relocated and/or reoriented during a cleaning operation so as to be directed with different angles and/or at different points on the inner circular edge during the same cleaning operation/cycle. In such a case, a single nozzle may effectively provide the same functionality as a set of nozzles.

In some embodiments, the nozzle (or nozzles) 314 of a cleaning apparatus 310 may be a jet nozzle—a nozzle which dispenses cleaning fluid in a jet stream like flow—but other types of nozzles which may dispense lower velocity fluid may also be appropriately used in the disclosed cleaning apparatuses. For example, in some circumstances, a lower velocity fluid which has propagating sonic waves or, more particularly, propagating megasonic waves (i.e. a fluid dispensed from a "megasonic nozzle") may provide an effective cleaning solution. In specific embodiments, a cleaning apparatus may include a megasonic cleaning system such as that supplied by Sonosys in Neuenburg, Germany or Prosys in Campbell, Calif. A megasonic cleaning system may be equipped with corrosion resistant lines and nozzles, and is typically equipped with a megasonic power generator that transforms the main voltage of 50/60 Hz to a frequency of between about 700 kHz and 4 MHz. Thus, the megasonic power generator is used to generate megasonic waves (having a frequency between about 0.7 MHz and 4 MHz) in the cleaning solution within the nozzle as the cleaning solution is dispensed. The frequency of the megasonic power generator and resulting megasonic waves may be adjusted as needed for specific cleaning applications. The power used may be between about 0.5 and 2 Watts per square centimeter. The duty cycle may include between about 5-20% power on and between about 80-95% power off (e.g., 10% on and 90% off). Such a megasonic cleaning system is typically based on piezoelectric transducers that are bonded on a plate, provided outside of a tank containing the cleaning fluid. The transducers produce high frequency waves that propagate through the fluid. Each point along the wave oscillates between a maximum and minimum pressure. When the pressure minimum is below the vapor pressure of the fluid, bubbles are formed in the fluid. When the pressure increases to maximum pressure, the bubbles implode, sending out an intense shockwave of energy as the fluid rushes in to fill the void left by the collapsed bubble. This energy is referred to as cavitation energy and, in some embodiments, is well-suited for removing particles or contaminants from an inner circular edge. Relatedly, when megasonic power is used to enhance the effectiveness of a cleaning solution, dissolved gas (nitrogen, oxygen, etc.) may be added to the cleaning solution in order to increase the amount of cavitation (as just described) in the fluid stream. Thus, in certain embodiments, megasonic nozzles (i.e., nozzles dispensing a cleaning fluid having propagating megasonic waves) may provide smooth cleaning of extremely fragile microstructures and materials, such as an inner circular edge of a lipseal—which is oftentimes made from soft and easy to damage polymer material with relatively small features such as lip protrusions, for example. While ultrasonic cleaning is believed to be too rough and destructive for such cleaning applications, megasonic cleaning may provide an effective and more gentle alternative. Furthermore, megasonic nozzles allow for the removal of much smaller particles relative to ultrasonic cleaning—a fact that is particularly important for removing potential plating nuclei from the inner circular edge of a lipseal and/or cup bottom. The tip of an ultrasonic cleaning nozzle may be positioned at a distance of between about 0.5 and 3 millimeters from the nearest point of the inner circular edge, or, more specifically, between about 1 and 2 millimeters from the inner circular edge. These distance ranges may ensure, on the low end, that there is sufficient distance for the fluid stream to exit the nozzle with some minimum desirable fluid velocity, while yet being close enough to the inner circular edge to prevent significant dissipation of the (mega) sonication effect. Further specific predetermined positions (including distances and orientations) of the nozzle (or nozzles) 314 with respect to the inner circular edge of the lipseal and/or cup bottom that may depend on the type of nozzle 314 are described in greater detail below.

In order to transition from the electroplating apparatuses' electroplating mode (and plating position for the substrate holder) shown in FIG. 3A to the cleaning mode (and cleaning position of the substrate holder) shown in FIG. 3B, substrate holder 320 is first removed from the volume 332 of the electroplating cell 330 holding electroplating bath fluid/solution 334 by raising substrate holder 320 in the vertical direction to the loading position. Substrate holder 320 is then opened, and substrate 340 is unloaded from substrate holder 320 which leaves the bottom of the substrate holder 320 open, exposing the inner circular edge of the lipseal 322 and/or cup bottom 325. Cleaning apparatus 310 then positions the nozzle 314 at its predetermined cleaning position with respect to the inner circular edge of the lipseal 322 and/or cup bottom 325. This may involve moving of one or more components of cleaning apparatus 310 alone, such as nozzle arm actuator 312 or generally an arm or leg connected to the nozzle, etc., and/or moving the bulk of the cleaning apparatus itself up or down. Alternatively, it may involve a combined movement of a component or components of cleaning apparatus 310 (such as nozzle arm actuator 312, nozzle arm 313, and nozzle 314) in conjunction with movement of the substrate holder 320. In some embodiments, the nozzle arm actuator 312 is configured to rotate the nozzle arm 313 about a center of rotation 316 moving the nozzle arm 313 and nozzle 314 between the retracted position and the cleaning position described above. In some embodiments, once in its cleaning position, the nozzle 314 is positioned under substrate holder 320 and within a vertical periphery of the opening. Substrate holder 320 may be then lowered and/or nozzle arm 313 and nozzle 314 may be raised in order to orient the nozzle 314 relative to the lipseal and/or cup bottom such that the nozzle is pointed substantially at the inner circular edge of the lipseal and/or cup bottom.

Figure 4A:
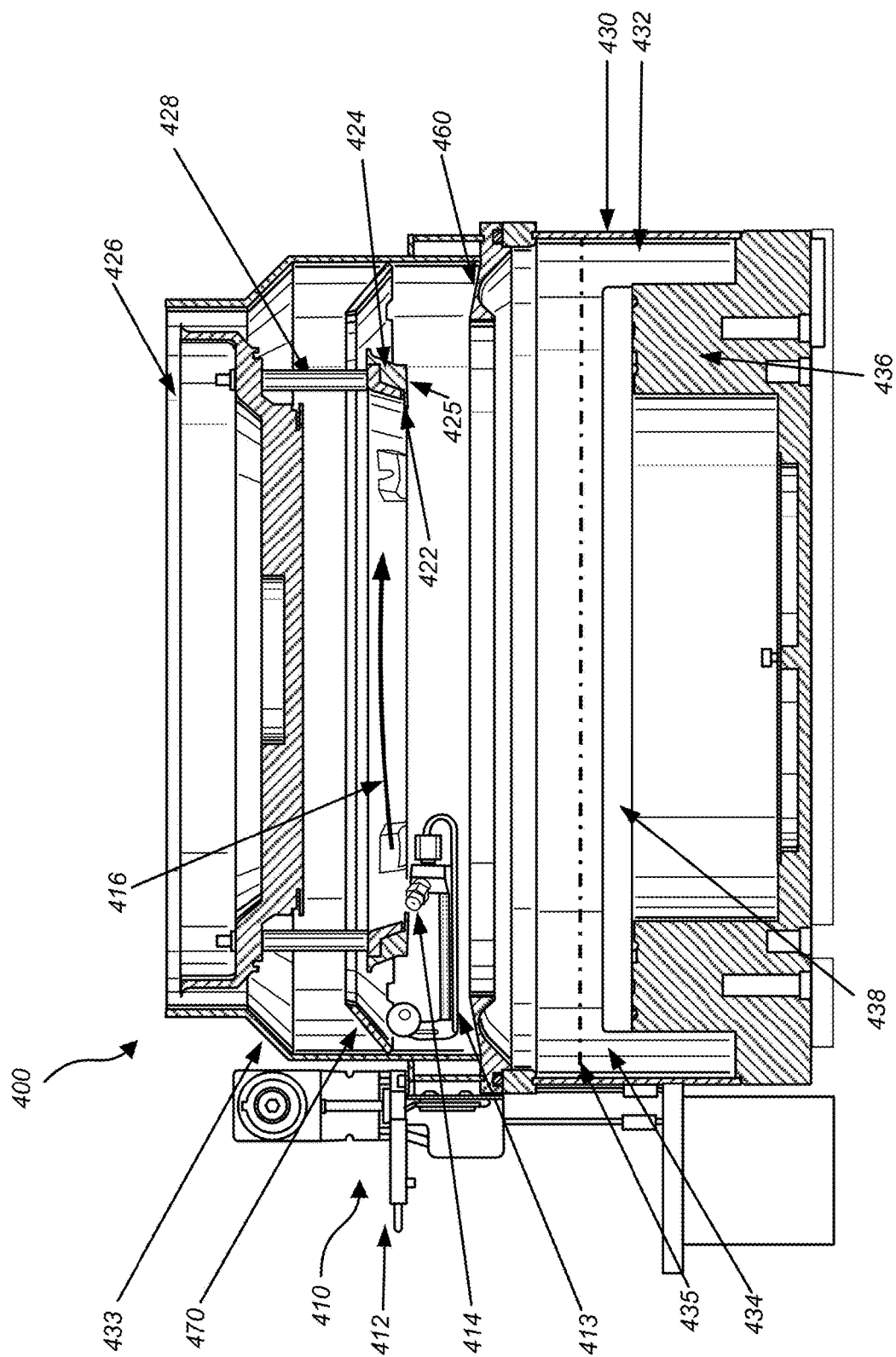
FIG. 4A presents a schematic illustrating a cutaway view of an electroplating apparatus having a built-in cleaning apparatus with its nozzle in its cleaning position.
Figure 4B:
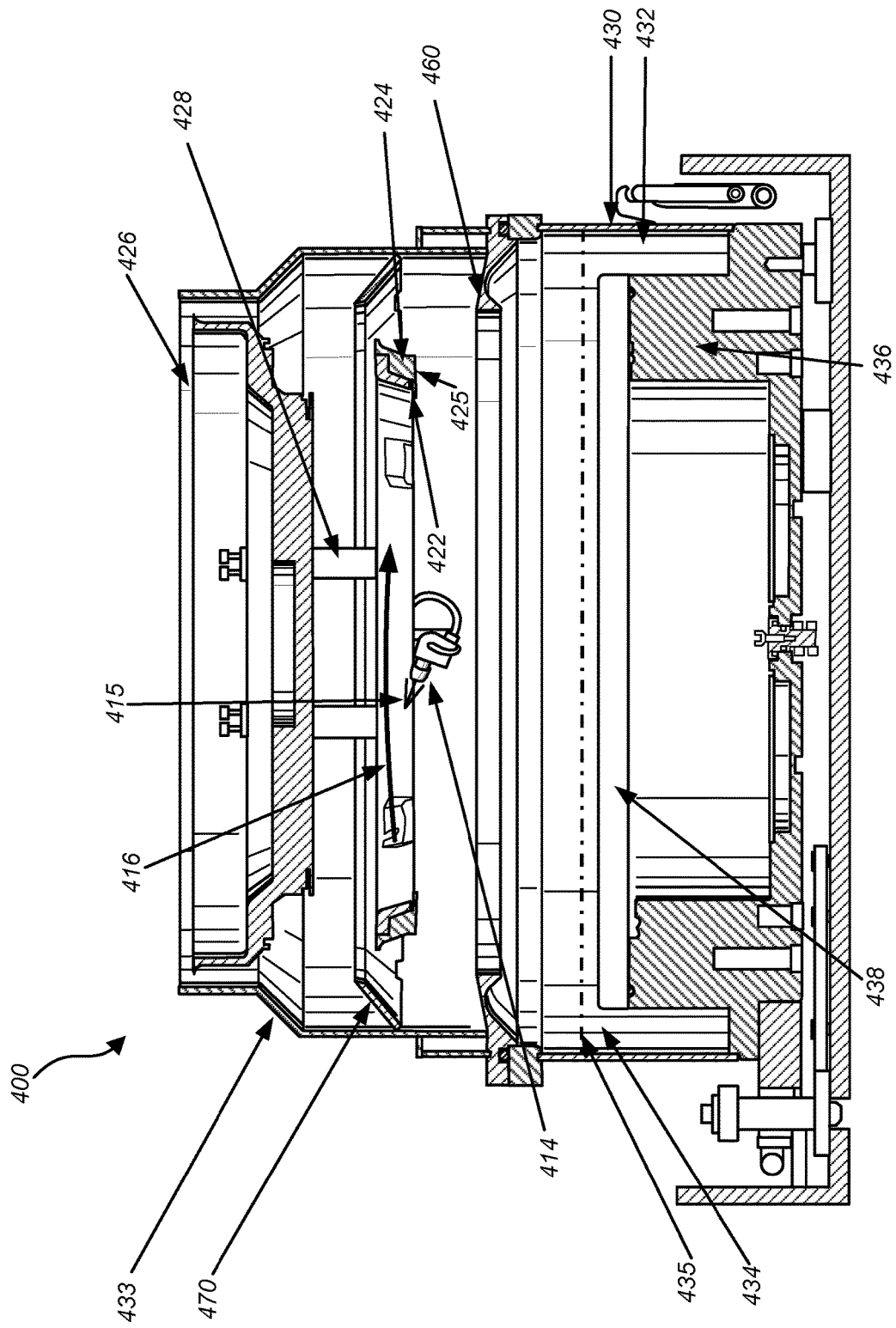
FIG. 4B presents a schematic illustrating a cutaway view of the electroplating apparatus and built-in cleaning apparatus of FIG. 4A rotated 90 degrees.

FIGS. 4A and 4B illustrate another embodiment of an electroplating apparatus which includes a built-in cleaning apparatus for cleaning spurious metal deposits from the electroplating apparatuses' substrate holder—particularly from the lip seal and/or cup bottom of the substrate holder. Once again, though the cleaning apparatus is described here as a built-in component of the electroplating apparatus, in some embodiments, the cleaning apparatus itself may be an independent component designed to be mounted for use in a preexisting electroplating device.

Essentially the same electroplating apparatus 400 is schematically illustrated in both FIGS. 4A and 4B, the difference being that the perspective of the apparatus shown in FIG. 4B has the apparatus rotated approximately 90 degrees from the perspective provided by FIG. A, in order to provide a different view of cleaning apparatus 410. In addition to the cleaning apparatus 410, electroplating apparatus 400 has a substrate holder 420 (oftentimes referred to as a "clamshell" or "clamshell assembly" or "cup-cone assembly"), an electroplating cell 430 with a volume for holding an electroplating bath fluid 434, and a "tophat" 433 which may enclose the upper portions of the electroplating apparatus (such as, for example, the substrate holder 420 when a substrate is being loaded). The substrate holder 420 generally includes a lipseal 422 mounted in a cup 424 having a cup bottom 425, a cone 426 movable relative to the cup 424 and lipseal 422 and configured to secure a substrate 440 in the substrate holder 420 by pressing the substrate (not shown) into the lipseal 422.

Figures 1, 1D, 2, 3, 4:
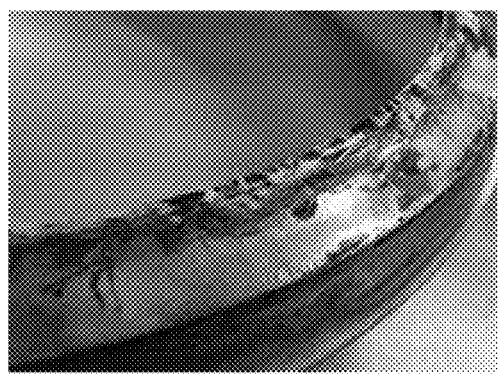

In some embodiments, such as that shown in FIGS. 4A and 4B, cup 424 is supported by cup struts 428 and attached to the cup-and-cone lift (not shown, but resides above the cone 426). The cup struts 428 pass though a portion of the cone 426 allowing the cone to move up-and-down via a pneumatic mechanism (mechanism not shown) relative to cup 424. Thereby the clamshell assembly (or substrate holder) may be closed to seal the substrate (not shown) at its periphery against the lip seal 422. When the cone 426 is in the retracted/up position and therefore the clamshell assembly (or substrate holder) is in an open configuration as shown in FIG. 4, a substrate may be loaded into the clamshell assembly and rested upon the lipseal 422. Once the substrate is resting on lipseal 422, cup struts 428 may be compressed (i.e. moved through the cone 426) so that the cup 424 and cone 426 move towards each other—in order to press the bottom surface of the cone 426 against the back surface of the substrate so that the periphery of the other side of the substrate (i.e., the side to be plated) is pressed against the lipseal 422, forming a fluid-tight seal.

The substrate holder 420 also typically includes a plurality of electrical contacts (not shown in FIGS. 4A and 4B) which supply the substrate 440 with electric charge via a power supply of the electroplating apparatus (also not shown in FIGS. 4A and 4B) during an electroplating operation. In some embodiments, the electrical contacts are formed as electrical contact fingers, but other shapes/types of electrical leads are also possible for supplying electrical current to the substrate. As indicated above, during plating the electrical contacts are generally protected by the fluid-tight seal formed between the substrate 440 and the lipseal 422 which keeps electroplating solution off of the backside of the substrate and away from the electrical contacts during electroplating. If not properly sealed, the electrical contacts may become plated with plating bath metal that increases the substrate/contact resistance non-uniformly, may become damaged by the corrosive effect of the electroplating solution, or extract current that may be otherwise intended to end up at the substrate periphery, all of which will diminish the quality, uniformity, and reproducibility of the plating processes. In some embodiment, the nozzle 314 is used to perform cleaning of the electrical contacts, for example by changing the height of the nozzle relative to the electrical contacts and adjusting the flow of cleaning fluid, substrate holder rotation rate, cleaning solution chemistry, and other parameters as appropriate.

Once a substrate is loaded and sealed in the substrate holder (i.e. engaged by the cup 424 and cone 426 and sealed against the lipseal 422), the proximal end of the substrate holder (or clamshell assembly) is ready to be lowered into the electroplating bath. The electroplating bath comprises an electrolyte solution contained in the electroplating cell 430 of the electroplating apparatus 400 which holds (or has a volume for holding) the electroplating bath fluid 434. In some embodiments, the electroplating cell 430 (also, in some embodiments, referred to as a lower outer cell confinement chamber) may include an anode chamber 436 and HRVA (High Resistance Virtual Anode) current distribution controller and flow diffuser 438, as described in U.S. Pat. Nos. 7,967,969, 7,622,024, and 8,308,931, each hereby incorporated by reference in their entirety for all purposes. During an electroplating operation, the clamshell assembly is lowered into the electroplating cell's volume 432 for holding the electroplating bath fluid 434 such that the working surface of the substrate (the downward surface) is lowered below the fluid level 435 of the electroplating bath fluid/solution 434, thereby submerging the working surface of the wafer in electroplating solution. See, for example, FIG. 8B: specifically, electroplating cell 430, anode chamber 436, HRVA current distribution controller and flow diffuser 438, volume 432 of electroplating cell 430, electroplating bath fluid 434, and electroplating bath fluid level 435 which is seen to be just above the position of substrate 440 in FIG. 8B (i.e. the bottom surface of substrate 440 is submerged within the electroplating bath fluid 434).

Referring now to the cleaning apparatus itself, as illustrated in FIGS. 4A, 4B, and 5A through 5D, cleaning apparatus 410 includes a nozzle 414, a cleaning fluid supply conduit 417 (see FIGS. 5C and 5D) in fluidic connection with the nozzle 414, and a nozzle arm 413 to which the nozzle 414 is affixed. In some embodiments, such as the embodiment displayed in FIGS. 4A, 4B, and 5A through 5D, the cleaning apparatus 410 includes a nozzle arm actuator 412 mechanically coupled to the nozzle arm 413 and configured to move the first nozzle 414 and nozzle arm 413 between a retracted position and a cleaning position.

These retracted and cleaning positions are further illustrated in FIGS. 5A through 5D which display close-up schematics of one embodiment of a cleaning apparatus 410—viewed in the spatial context of top hat 433, but viewed apart from the other components of electroplating apparatus 400. FIG. 5A shows the orientation of the nozzle 414, nozzle arm 413, and nozzle arm actuator 412 relative to the top hat 433 when the nozzle and nozzle arm are in their retracted position. FIG. 5B shows the same components with the nozzle 414 and nozzle arm 413 in their cleaning positions. FIGS. 5C and 5D display close-up presentations of one embodiment of a nozzle 414 and nozzle arm 413, also in their retracted and cleaning positions, respectively. It can be seen from FIGS. 5C and 5D that, in this embodiment, cleaning fluid is delivered to the nozzle 414 through a fluid supply line 417 which runs along the outside of the nozzle arm 413. In other embodiments, the nozzle arm 413 may itself serve as a conduit for cleaning fluid, rendering this portion of the supply line superfluous. The embodiments schematically illustrated in FIGS. 3A and 3B are configured as such.

Also evident from FIGS. 5C and 5D is that, in this embodiment, nozzle arm 413 is arc-shaped and is rotated by the nozzle arm actuator 412 about an axis of rotation in order move the nozzle and nozzle arm between retracted and cleaning positions, and vice versa. In so doing, the nozzle arm actuator 412 causes the nozzle arm 413 to move through a rotation pass-through hole 466 in the top hat 433. Note that in this embodiment, this rotational motion is all that is necessary to take nozzle 414 from its retracted (and/or "stored" and/or "parked") position to its cleaning (and/or expanded and/or extended) position and back again. Once again, similar to the example illustrated in FIGS. 3A and 3B, the axis of rotation here is substantially vertical, which means that the nozzle 414 travels substantially within the horizontal plane. And, once again, in some embodiments, a vertical orientation of nozzle 414 with respect to the inner circular edge of the lipseal 422 and/or cup bottom 425 may be achieved by moving the substrate holder 420 in the vertical direction. However, in other embodiments, the axis of rotation may not be strictly vertical and so a rotation of the nozzle 414 about the axis will cause a vertical displacement of the nozzle which may help to bring the nozzle 314 in sufficient proximity to the inner circular edge of the lipseal 422 and/or or cup bottom 423 for performance of a cleaning operation.

It should also be noted from FIGS. 5A and 5B, that judging from the circular diameter of the top hat 433 visible in these figures, with the nozzle 414 in its retracted position as shown in FIGS. 5A and 5B, an appropriately sized semiconductor substrate may lowered along the central axis of top hat 433 and electroplating cell 430, and past the retracted nozzle 414, without physically contacting the nozzle 414 or nozzle arm 413. In contrast, with the nozzle 414 in its cleaning position as shown in FIGS. 5C and 5D, the nozzle 414 and nozzle arm 413 would seem to be blocking the path of any semiconductor substrate attempting to be lowered into electroplating cell 430 where the electroplating fluid is held. However, with nozzle 414 and nozzle arm 413 in the cleaning position shown in FIGS. 5C and 5D, the nozzle is oriented such that it is substantially pointed at the inner circular edge of the lipseal 422 and/or cup bottom 425 of the electroplating device 400 as shown in FIGS. 4A and 4B.

Note that, collectively, FIGS. 4A, 4B, and 5A through 5D illustrate one mechanism for achieving movement of nozzle 414 and nozzle arm 413 between retracted and cleaning positions, and that FIGS. 3A and 3B illustrate another, but nevertheless, many other related schemes and embodiments for nozzle positioning are also feasible and within the scope of the inventive concepts disclosed herein.

Configurations for Minimizing Entry of Cleaning Solution into the Electroplating Bath With regards to the electroplating/cleaning apparatuses disclosed herein which employ a nozzle for dispensing cleaning fluid/solution, the flow of cleaning fluid (to lipseals and/or cup bottoms) is typically dispensed while the substrate holder is positioned in a cleaning position, a position that is typically directly above the plating solution. Thus, there is the danger, during a cleaning operation, that cleaning solution and removed metal deposits may fall into the electroplating bath and contaminate the electroplating solution. In some embodiments, in order to prevent this occurrence, the substrate holder may be continuously rotated so that centrifugal forces work to force cleaning solution/fluid away from the inner circular edge and bottom opening and towards regions of the electroplating apparatus other than the electroplating bath region—e.g. towards the walls of the electroplating cell where the cleaning fluid may be drained away from the electroplating bath.

Consistent with this approach, some embodiment cleaning apparatuses may employ some sort of structure, device or component to help divert spent cleaning fluid/solution away from the electroplating bath. For instance, a ring-shaped fluid collection structure/device/component circling the periphery of an electroplating apparatus's interior may serve to catch and capture spent cleaning fluid that has been forced radially outward by the centrifugal forces generated through substrate holder rotation.

As an example of this, note that in some electroplating apparatuses, it is advantageous to employ a reclaim shield—for the purpose of reclaiming electroplating fluid and returning it to the electroplating bath—as well as a rinse shield—for the purpose of diverting spent rinse solution away from the electroplating bath. However, in some embodiments, these components may serve the additional purpose of diverting spent cleaning fluid/solution, including any removed metal deposits—either dissolved or as particulates, away from the electroplating bath, thereby preventing its contamination. Such a reclaim shield embodiment 460 and rinse shield embodiment 470 are shown in FIGS. 4A and 4B, and these components are further described in more detail below with respect to FIGS. 8A, 8B, and 8C. The reclaim shield 460 as well as the rinse shield 470 are perhaps most clearly visible in the cutaway perspective views exhibited in FIGS. 5A and 5B. Put as concisely as possible, each of these components comprises a shelf circling the radial periphery of the electroplating apparatus's interior and tilting downward in the radially outward direction. Each shelf has a lower surface which acts to reflect any impacting fluid downward; and an upper surface which acts to capture any fluids falling onto it due to impact with the interior regions of electroplating apparatus above it. The radially down-and-outward tilt that accomplishes this can be seen in FIGS. 4A, 4B, and 8A through 8C. Note that the lower and upper surfaces may be perfectly flat, or perhaps just substantially flat, or perhaps have some (non-flat) contour to them which helps to direct the impacting fluid or serve some other structural role (e.g., the bottom surface of reclaim shield 460 shown in these figures has a non-flat contour to it). As stated, the upper surfaces serve to capture fluid and, in order to prevent the surfaces from overflowing with the collected fluid, a drain is typically fluidically accessible from these upper surfaces. In some embodiments, the drain may be a hole in the upper surface opening to a conduit (a pipe, etc.) presenting a fluid path away from the electroplating bath. In other embodiments, the drain may be a hole in the interior wall of the electroplating apparatus adjacent to the upper surface of the reclaim or rinse shield that, again, leads to a conduit presenting a fluid path away from the electroplating bath. In any event, because the upper surfaces of these shield components generally serve the purpose of diverting fluid away from the electroplating bath, they may serve the purpose of preventing some (or all) spent cleaning fluid (and any dissolved and/or particular metals) from entering the electroplating bath. In the embodiments shown in FIGS. 4A, 4B, and FIGS. 8A through 8C, it is the upper surface of the rinse shield 470 which serves this purpose.

Of course, for any fluid collection component to serve the purpose of collecting spent cleaning fluid thereby preventing its entry into the electroplating bath, the cleaning fluid has to make it into (and/or onto) the fluid collection component. Radially outward acceleration of the fluid by centrifugal forces generated through substrate rotation, as stated above, will help to accomplish this. However, another aspect of this when a nozzle is used to dispense cleaning fluid is the judicious selection of the type and/or configuration of the nozzle (or nozzles) as well the choice of nozzle orientation relative to the inner circular edge of the lipseal and/or cup bottom (e.g., distance from nozzle tip to inner circular edge, nozzle angle, etc.). Also important are the judicious choice of various fluid flow parameters—fluid flow rate, fluid flow volume, fluid velocity, nozzle pressure, etc. In conjunction with substrate holder rotation rate (and thus lipseal and cup bottom rotation rate) all these factors determine the destination of spent cleaning solution after it departs from the source (e.g., the nozzle) and then proceeds to flow around and over the lipseal and cup bottom. In some embodiments, such as that schematically illustrated in FIGS. 4A, 4B, and 8A through 8C, a proper selection/choice of the foregoing factors results in the cleaning fluid exiting the nozzle 414, contacting the inner circular edge of the lipseal 422 and/or cup bottom 425, effectively cleaning the lipseal 422 and/or cup bottom 425 and removing metal deposits, and then proceeding to flow up the inner cup surface, flowing over the top of it between the cup struts 428, and then finally landing in either the upper surface of the reclaim shield 460 or the bottom surface of the rinse shield 470 where the fluid may be safely drained away from the electroplating bath.

Figure 6:
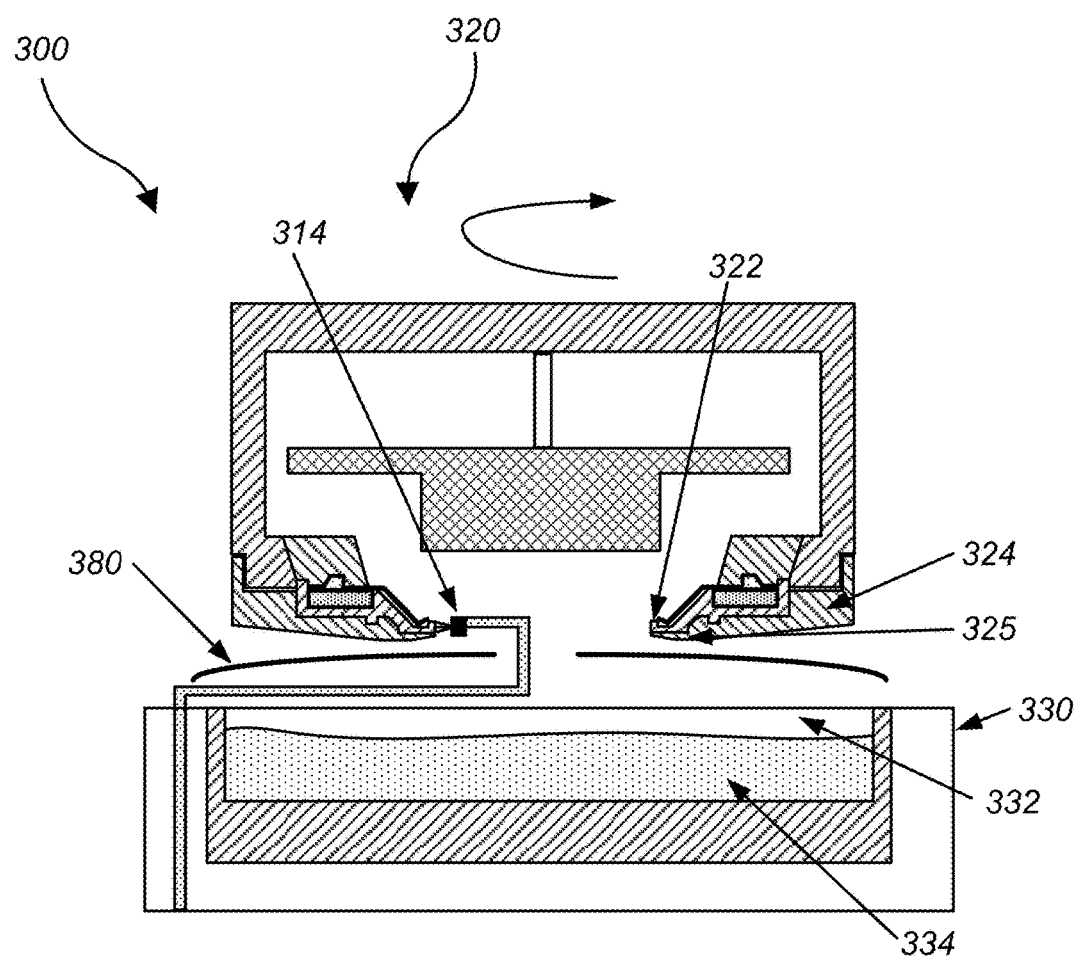
FIG. 6 presents a cross-sectional schematic of an electroplating apparatus having a built-in cleaning device and also a built-in retractable cleaning shield.

Another way of dealing with potential contamination of the electroplating bath with spent cleaning solution, possibly in conjunction with substrate rotation, is to employ a retractable cleaning shield for capturing any spent cleaning fluid that may fall down from the electroplating substrate holder during a cleaning operation. As shown in FIG. 6, the retractable cleaning shield 380 may be located above the volume 332 of the electroplating cell 330 which holds the electroplating bath fluid 334 and below any nozzle 314 used to dispense cleaning solution, and also below the substrate holder 320 when the substrate holder 320 is positioned in the cleaning position. A retractable cleaning shield 380 would typically have an expanded configuration and a retracted configuration wherein in the retracted configuration, the substrate holder 320 may be moved from the cleaning or loading positions to the electroplating position without being physically impeded by the cleaning shield 380, and in the expanded configuration, the cleaning shield 380 prevents cleaning fluid dispensed from the nozzle 314 from falling into the volume 332 of the electroplating cell 330 which holds the electroplating bath fluid 334. In some embodiments, the cleaning shield 380 in its expanded configuration extends past the nozzle 314 towards the center of the opening as shown in FIG. 6. In certain embodiments, the diameter of the opening 382 formed by the retractable cleaning shield 380 in its expanded configuration is less than about 75% of the diameter of the inner circular edge of the lipseal 322 and cup bottom 325. In certain embodiments, the diameter of the retractable cleaning shield's opening in the expanded configuration may be less than about 95%, 85%, 75%, 65%, 55%, 45%, 35%, 25%, or 15% of the diameter of the inner circular edge of the lipseal 322 and cup bottom 325. As such, even if some spent cleaning fluid/solution drips from the inner circular edge or from any bottom surface of the substrate holder 320, the retractable cleaning shield 380 will likely still capture this spent cleaning fluid and prevent it from contaminating the electroplating bath.

Nevertheless, even if an electroplating apparatus 300 is equipped with a retractable cleaning shield 380, the substrate holder 320 and, in certain embodiments, the retractable cleaning shield 380 itself may be rotated so that the centrifugal forces so generated work to force the spent cleaning solution/fluid away from the inner circular edge and bottom opening and towards regions of the electroplating apparatus other than the electroplating bath region—as described above. However, due to the presence of the retractable cleaning shield 380, rotation speeds may be substantially less than in the examples presented above where centrifugal forces are predominantly relied on for preventing spent cleaning solution from contaminating the electroplating bath. Moreover, despite the fact that a particular electroplating apparatus my employ a retractable cleaning shield 380 in conjunction with a fluid collection component such as the reclaim shield 460 or rinse shield 470 (as described above), it would typically be acceptable for a lesser fraction of spent cleaning solution to be collected by these components, since the retractable cleaning shield 380 may essentially provide backup protection for the electroplating bath.

In some embodiments, the cleaning shield 380 is a slightly conically shaped iris mechanism that can be opened or closed at least to a size to cover the projected surface below the inner diameter of the cup bottom and lip seal. Such a retractable iris type or diaphragm shutter cleaning shield 380 may include a number of thin movable blades that can change the size of the opening formed by the shield depending on whether the electroplating apparatus 300 is in a cleaning mode with the substrate holder 320 positioned in the cleaning position, or in an electroplating mode. The blades may be configured to slide over each other upon retraction and expansion of the retractable shield such that the blades create a substantially circular opening (or some other shape) of variable size. During an electroplating cycle, the retractable cleaning shield 380 may be configured to form a large opening that allows the substrate holder 320 to move through the shield 380 and into and out of the electroplating bath solution 334. During a cleaning cycle, the retractable shield 380 may create a smaller opening and extend past the inner circular edge of the lipseal 322 and cup bottom 325 as shown in FIG. 6.

Methods for Cleaning Electroplating Substrate Holders & Methods of Electroplating Employing an Automated Substrate Holder Cleaning Operation Also disclosed herein are methods of electroplating a metal onto a plurality of semiconductor substrates wherein a cleaning operation is periodically employed to remove spurious metal deposits (often tin-silver alloy deposits) from the lipseal and/or cup bottom of the substrate holder of the electroplating apparatus being used to perform the electroplating method. Such electroplating apparatuses have been described in detail above and, as described above, typically employ a substrate holder having a lipseal and a cup bottom which are likely to accumulate tin-silver deposits over the course of electroplating a sequence of semiconductor substrates. Accordingly, disclosed herein are electroplating methods that include electroplating a metal onto a first set of one or more substrates, periodically making a determination of whether to perform a cleaning operation which removes metal deposits accumulated on the lipseal and/or cup bottom while electroplating the first set of substrates, if the cleaning operation is warranted, interrupting the sequence of electroplating operations to perform the cleaning operation, and, after performing the cleaning operation, continuing on to electroplate the same metal onto a second set of one or more substrates.

Typically, determining whether to perform a cleaning operation involves an assessment of whether there has been sufficient build-up of metal deposits on the lipseal and/or cup bottom to warrant cleaning, or, in some embodiments, whether there is a possibility that there may have been a sufficient buildup to warrant cleaning. Various methodologies, techniques, rules-of-thumb, plating thresholds, substrate thresholds, and potentially other metrics for assessing whether its probable there has been sufficient buildup are described in more detail below. Generally, cleaning here involves a preventive maintenance procedure and process, to avoid or delay the catastrophic cup bottom plating, those totally detrimental events and results as shown in FIGS. 1D-1 through 4.

These methods of electroplating multiple semiconductor substrates which take advantage of periodic cleaning operations may employ any of the applicable cleaning methods disclosed herein which work to remove metal deposits accumulated on a lipseal and/or cup bottom over the course of prior electroplating operations. In some embodiments, these cleaning operations take advantage of a fluid dispensing nozzle (as described in greater detail below) which is oriented in a particular way (also described in grater detail below) with respect to the inner circular edge of the lipseal and cup bottom. For instance, a lipseal and/or cup bottom cleaning method may include orienting a nozzle relative to the lipseal and/or cup bottom such that the nozzle is pointed substantially at the inner circular edge of the lipseal and/or cup bottom, rotating the lipseal and cup bottom, and dispensing a stream of cleaning solution such that the stream of cleaning solution contacts the inner circular edge of the lipseal and/or cup bottom while they are rotating, thus removing metal deposits from the lipseal and/or cup bottom. In some embodiments, the stream of cleaning solution is dispensed having a fluid velocity between about 5 and 40 meters/second and, in certain such embodiments, the dispensed fluid stream may have a velocity component going against the rotational direction of the lipseal and cup bottom, but additional specifics regarding possible fluid stream velocities, nozzle orientations, etc. are disclosed in further detail below. Note, however, that in some embodiments, and particularly embodiments employing these fluid velocities with a counter-rotating substrate, a cleaning solution of simply distilled deionized water may be all that is required to effectively remove metal deposits from the lipseal and/or cup bottom.

Figure 7:
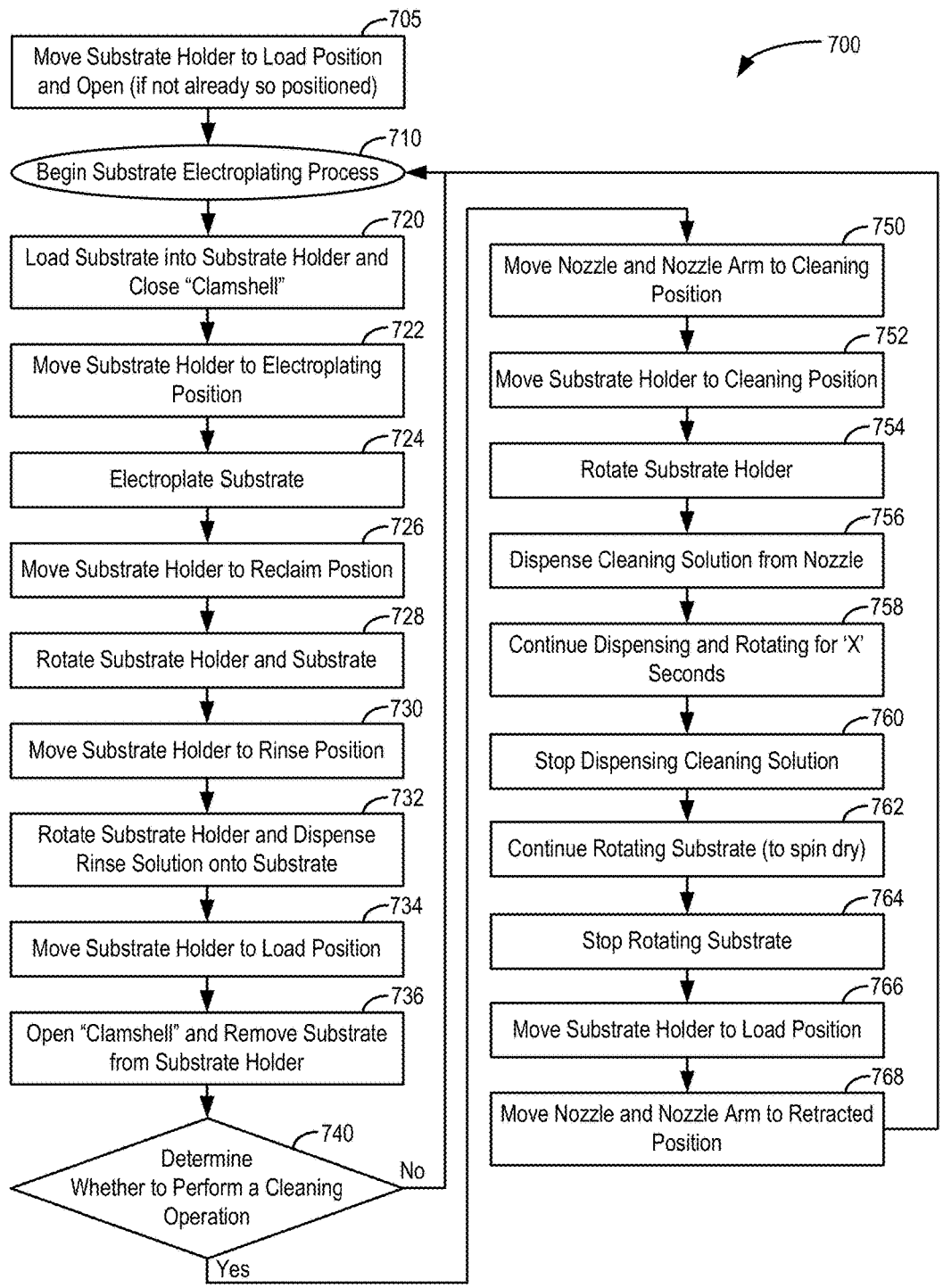
FIG. 7 presents a flowchart illustrating one embodiment method of electroplating a series of semiconductor substrates which periodically employs a method for removing metal deposits from a substrate holder.
Figure 8A:
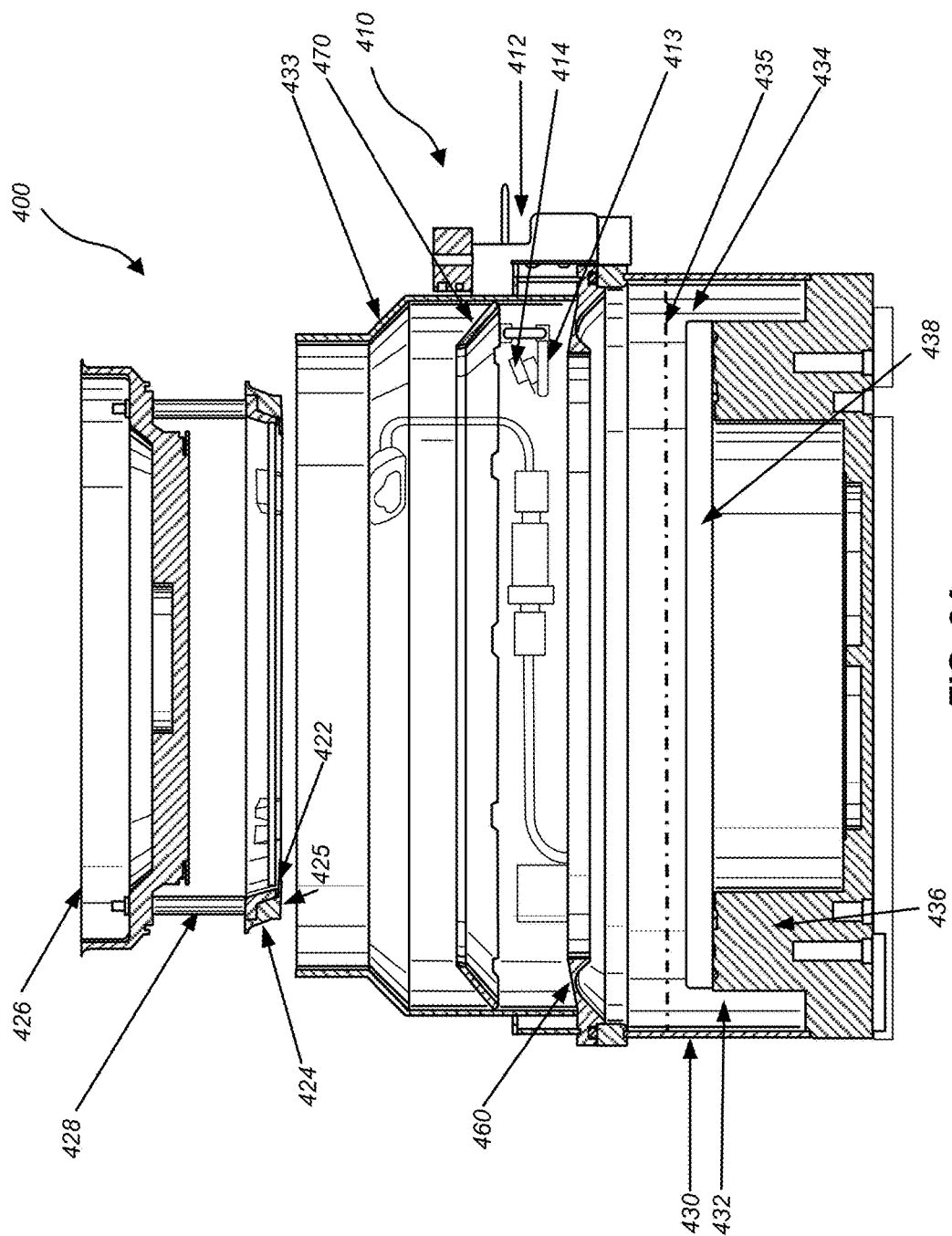
FIG. 8A presents a schematic illustrating a cutaway view of the electroplating apparatus and built-in cleaning apparatus of FIGS. 4A and 4B with the substrate holder in the loading position.
Figure 8B:
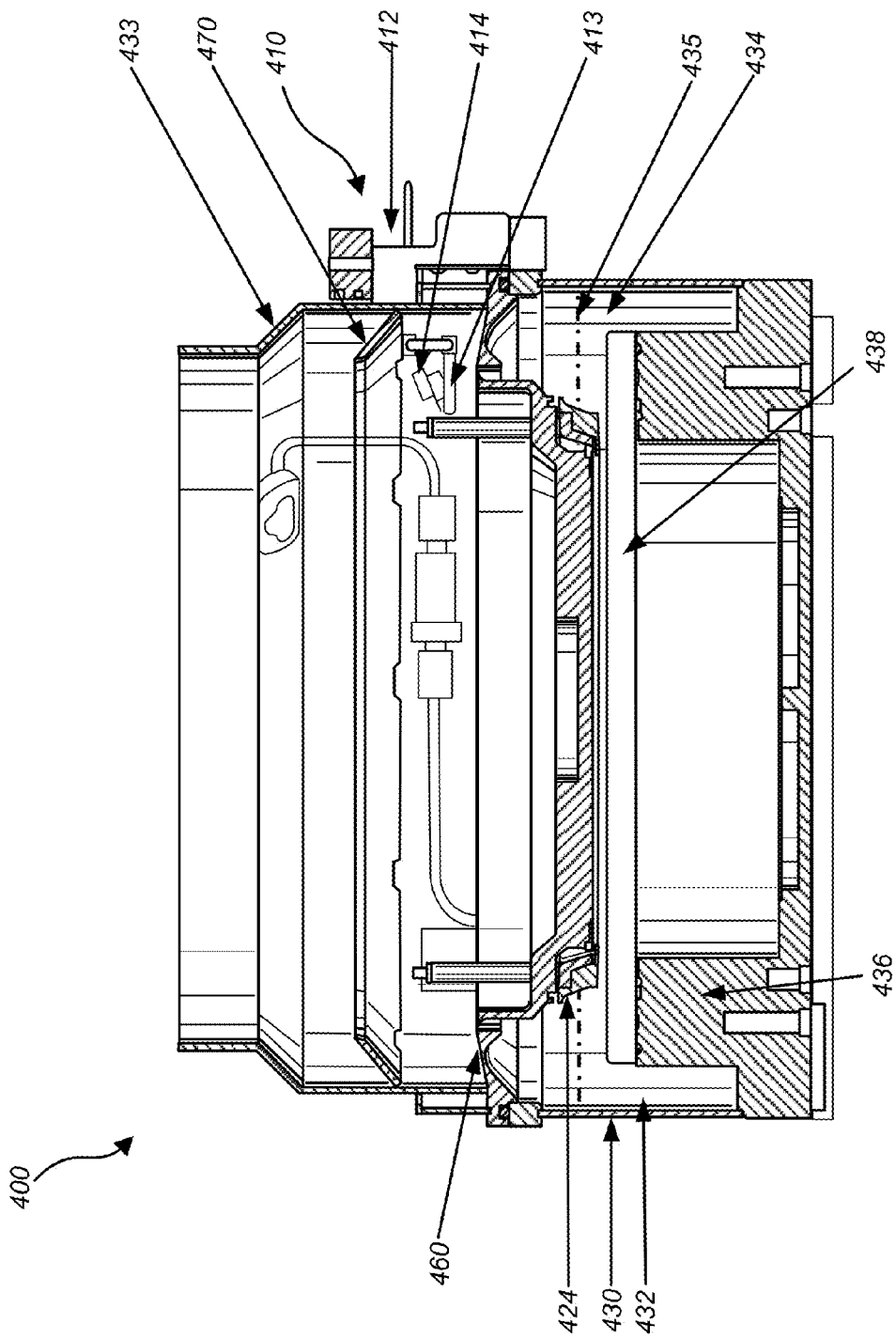
FIG. 8B presents a schematic illustrating a cutaway view of the electroplating apparatus and built-in cleaning apparatus of FIGS. 4A and 4B with the substrate holder in the electroplating position.
Figure 8C:
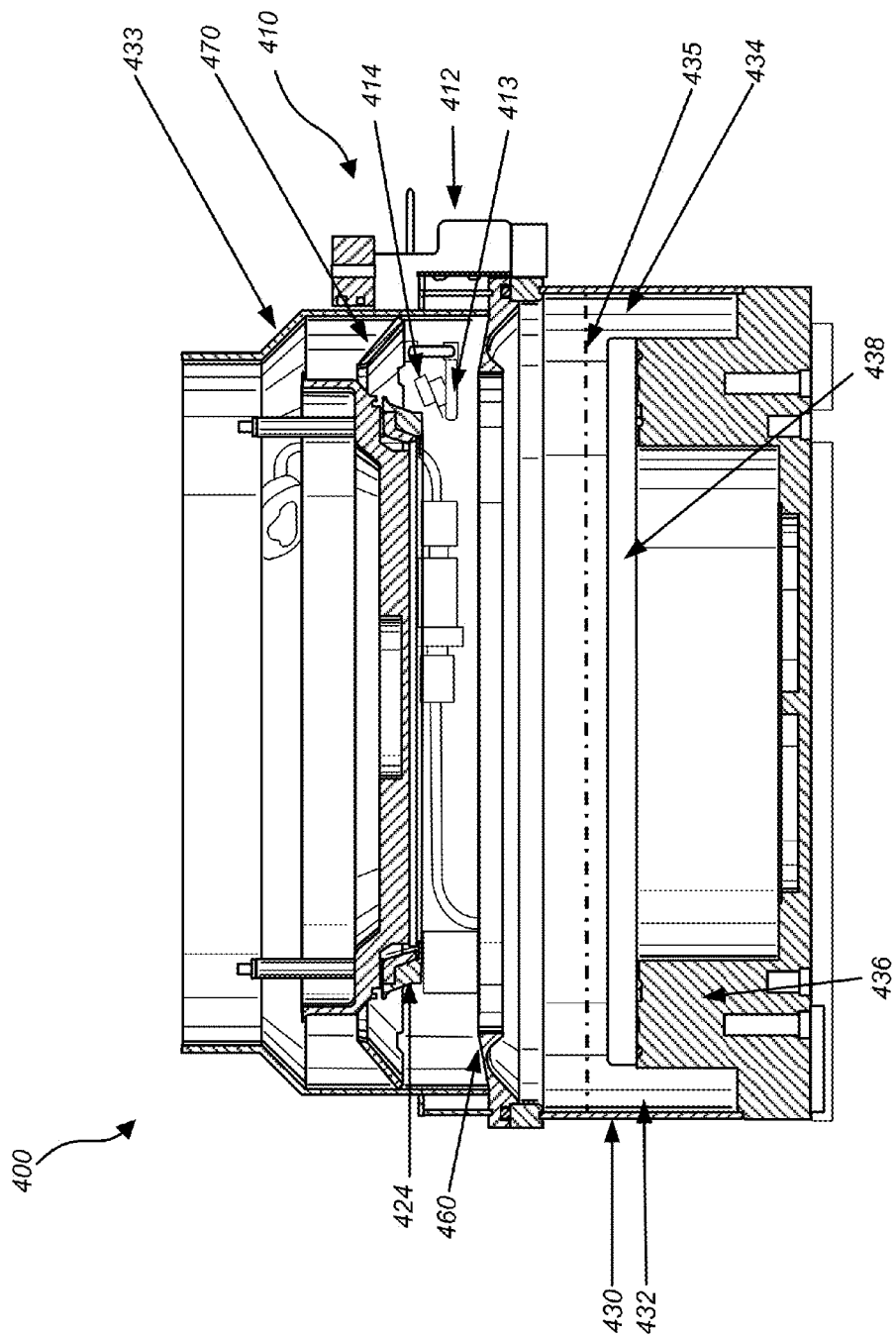
FIG. 8C presents a schematic illustrating a cutaway view of the electroplating apparatus and built-in cleaning apparatus of FIGS. 4A and 4B with the substrate holder in the rinse position.

One embodiment method of electroplating a series of semiconductor substrates which periodically employs a method for removing metal deposits from a substrate holder is schematically illustrated in FIG. 7. Although the flowchart of FIG. 7 illustrates one sequence of steps, one having ordinary skill in the art would appreciate that variations in the sequence may be possible within the scope of the present disclosure, including the omission of one or more steps where appropriate. Note that the electroplating method schematically illustrated in FIG. 7 employs several steps of positioning the substrate holder of an electroplating apparatus (and thus the substrate loaded in the substrate holder) at various vertical positions within the electroplating apparatus. Several of these vertical positions are schematically illustrated in FIGS. 8A, 8B, and 8C which each show a substrate holder vertically oriented within an electroplating apparatus. Also note that the electroplating apparatus schematically illustrated in FIGS. 8A through 8C is substantially the same apparatus as illustrated in FIGS. 4A and 4B, and that the cleaning position of the substrate holder illustrated in FIGS. 4A and 4B will also be referred to in the description of the specific method which follows.

Accordingly, the electroplating method 700 schematically illustrated in FIG. 7 begins 710 with loading a new substrate 440 into the electroplating apparatus 400 of FIGS. 4A, 4B, 8A, 8B, and 8C. (Step 720.) Note, this might be preceded by moving the substrate holder 420, also referred to herein as the clamshell assembly, to the load position (Step 705) if it is not already so positioned—the electroplating apparatus 400 in its load position is schematically illustrated in FIG. 8A. Once the substrate holder/clamshell assembly 420 is in the load position, substrate 440 is loaded by opening the clamshell assembly (cup struts 428 extended so that the cup 424 is separated from the cone 426) to accept the substrate 440, as also shown in FIG. 8A. Next the clamshell assembly is closed (cup struts 428 are retracted so that the cone 426 engages the substrate 440 pressing it against the lipseal 422 of the cup 424 forming the seal) and lowered into the electroplating position (Step 722) shown in FIG. 8B, with the working surface of the substrate 440 below the fluid level 435 of the electroplating bath 434. With the substrate 440 in contact with the electroplating solution 434, current is applied to it via contact elements (not shown), and metal (e.g., silver-tin alloy) is plated out on the working surface of the substrate 440. (Step 724.)

When electroplating is completed, the clamshell assembly/substrate holder 420 is raised within the electroplating cell 430 to a reclaim position (Step 728) where the substrate 440 and substrate holder 420 are above the fluid level 435 of the electroplating bath 434, but the substrate 440 is below the reclaim shield 460. (Note this reclaim position is not explicitly illustrated in any of the apparatus figures but is indicated in FIG. 7.) In this position, the substrate and substrate holder are rotated with a rotation rate between about 200 and 600 RPM, for between about 1 and 10 seconds (for example 400 RPM for 4 seconds) to remove any remaining electroplating solution adhered to the substrate and/or substrate holder. (Step 728.) Centrifugal force generated from spinning the substrate and substrate holder causes adhered electroplating solution to be flung off the substrate and/or substrate holder, however, the substrate and substrate holder are typically vertically positioned relative to the reclaim shield 460 such that flung electroplating solution impacts the reclaim shield 460 so as to be returned to the electroplating bath 434.

Next, the substrate 440 and substrate holder 420 are vertically raised to the rinse position (Step 730) shown in FIG. 8C, wherein the substrate 440 is located above the reclaim shield 460, but below the rinse shield 470. In this position, the substrate and substrate holder are sprayed with a rinse solution while spinning (Step 732) at a rotation rate between about 200 and 600 RPM, for between about 1 and 10 seconds (for example 400 RPM for 4 seconds), and by virtue of the vertical position, rinse solution and diluted electrolyte tends to be flung away from the substrate and substrate holder towards a region of the tophat 433 above the reclaim shield 460 but below the rinse shield 470, resulting in an accumulation of spent rinse solution and diluted electrolyte on the upper surface of the reclaim shield 460.

When enough fluid has accumulated, the spent rinse solution and diluted electrolyte are drained from the upper surface of the reclaim shield 460 through drain 462, shown most clearly in FIGS. 8A and 8C. Note that the drain 462 is a cutout in the wall of the tophat 433, but due to the view angle of the electroplating apparatus 400 schematically shown in FIGS. 8A and 8C, the drain 462 appears behind and rotated away from the part of the reclaim shield 460 appearing in the foreground of FIGS. 8A and 8C.

With these steps completed, the substrate 440 and substrate holder 420 are returned to the load position (Step 734) of FIG. 8A, the substrate holder is opened (by extending cup struts 428), and the now plated substrate 440 is removed (Step 736).

It is at this point that some embodiment electroplating methods employing an automated cleaning procedure will utilize a decision-making process to determine whether it is likely that there has been a sufficient build-up of metal deposits on the lipseal and/or cup bottom to warrant initiating an automated substrate holder cleaning operation. (Step 740.) Depending on the embodiment, one or more of a variety of factors may be considered in the decision as to whether or not to initiate automated cleaning operation. For instance, in some embodiments, automated cleaning will be initiated after a predetermined number of substrates have been electroplated since the last cleaning operation. In certain such embodiments, the predetermined number of substrates is a number selected from the range of 1 to 200, or a number selected from the range of 1 to 100, or a number selected from the range of 1 to 50, or a number selected from the range of 1 to 25. For example, in certain embodiments, the cleaning is performed after plating each wafer or after plating every 25th wafer, or after plating some number of wafer between 1 and 25. In certain embodiments, the predetermined number of substrates is selected dependent on the ratio of patterned to unpatterned surface area of the substrates electroplated since the last cleaning operation. In certain embodiments, the predetermined number of substrates is selected dependent on the fractional plating area near the circumference of the substrate. The extent to which the substrate patterning defines open (unpatterned) areas on the surface of the substrate influences such fractional plating. High fractions of open platable areas tend to be more heavily plated, involving greater current flow, and therefore typically more quickly accumulate lipseal and cup bottom deposits. Of course, the rate of metal deposit accumulation on the lipseal and cup bottom also typically depends on the proximity of the (heavily plated) open areas to the lipseal and cup bottom. Therefore, in some embodiments, the predetermined number of substrates to be plated between cleanings is set according to the percent open area on each substrate and the distance the open areas are from the edges of the substrate.

In some embodiments, the amount of electric charge transferred to the substrate via electroplating since the last cleaning operation may be measured (or estimated) and then be used to determine whether a cleaning operation is warranted. Thus, in some embodiments, it is determined that a cleaning operation is warranted if more than a predetermined quantity of electric charge has been transferred to the substrate via electroplating since the last cleaning operation. In certain such embodiments, the predetermined quantity of electric charge is a charge quantity selected from the range of about 5 to 500 Coulombs, or selected from the range of about 10 to 250 Coulombs, or selected from the range of about 20 to 100 Coulombs. In some embodiments, a measurement of charge transfer coupled with an analysis of the substrate patterning being used may be employed to determine whether it is advantageous to initiate a cleaning operation. For instance, in some embodiments a predictive metric for assessing likely accumulation may involve weighting the measured charge transfer by a likelihood of where on the substrate the charge was transferred to based upon the substrate patterning being used. Thus, for example, in some embodiments, the predetermined quantity of electric charge is selected dependent on the radial distribution of patterned surface area and/or the radial distribution of unpatterned surface area of the substrates electroplated since the last cleaning operation.

In any event, at this point in the electroplating method 700, a decision is made as to whether to initiate an automated lipseal cleaning operation based on one or more of the foregoing considerations. (Step 740.) If one or more factors (such as those just discussed) suggest that the lipseal and cup bottom are still sufficiently free from metal deposits, the electroplating process will begin (710) again with a new substrate 440, and without an intervening cleaning procedure, as illustrated in the flow diagram of FIG. 7. On the other hand, if one or more factors suggest that the lipseal and/or cup bottom are not sufficiently free of metal deposits, an automated lipseal cleaning operation may be initiated as also illustrated in the flow diagram of FIG. 7.

If initiated, the lipseal and/or cup bottom cleaning method begins by moving the nozzle arm 413 into cleaning position (Step 750) such that the nozzle 414 will be located proximate to the inner circular edge of the lipseal 422 and/or cup bottom 425 once the substrate holder 420 is lowered to its cleaning position. In some embodiments, the nozzle arm 413 is arc-shaped and rotated by the nozzle arm actuator 112 about a center of rotation which moves the nozzle arm 413 through a rotation pass-through hole 466 in the top hat 433, as shown in FIGS. 5A through 5D and described above. While this arrangement has certain benefits, some of which are described above, many different mechanisms may be used to move the nozzle 414 (and any associated nozzle arm 413) between a retracted parked/stored position and a deployed cleaning position.

Once the nozzle 414 is in its cleaning position, the substrate holder 420—which at this point is typically no longer holding a substrate—is lowered into the cleaning position shown in FIGS. 4A and 4B. (Step 752.) In this position, as indicated above and shown in FIGS. 4A and 4B, the nozzle 414 is located proximate to the inner circular edge of the lipseal 422 and/or cup bottom 425. Note that in general, at this point, the substrate holder 420 has not been reclosed after the substrate removal step (Step 736) where the clamshell was opened, and so the cone 426 is not in the vicinity of the nozzle 414. In some embodiments, this configuration provides for improved cleaning because it allows cleaning fluid to easily enter the region of the electrical contacts and flush any contaminates outward from the substrate holder 420 and away from the center of the electroplating cell and importantly away from the electroplating bath—and in some embodiments, onto the reclaim shield 460 or rinse shield 470 as described above). Additionally, in some embodiments there is more room underneath the substrate holder 420 to optimally position the nozzle 414 proximate to the inner edge of the lipseal 422 without interference from the closed cone 426. In some embodiments, this configuration may be advantageous simply because there is more exposed surface of the lipseal 422 available for cleaning, for example, the surface that seals the substrate is exposed for particle removal and cleaning. However, in other embodiments, the substrate holder 420 may be closed prior to moving forward with the cleaning procedure, which would mean that in the steps that follow the cone 426 is relatively closer to the nozzle 414. Also note, that in many configurations, the nozzle 414 and nozzle arm 413 should only be moved to and from their deployed cleaning positions when the substrate holder 420 is not in its cleaning position—because, when the substrate holder 420 is so positioned, extending or retracting the nozzle 414 will likely cause it to impact the substrate holder. While in some embodiments, this may not be the case, the procedure called for by the flowchart of FIG. 7 is to move the nozzle 414 into cleaning position (Step 750) prior to moving the substrate holder 420 into cleaning position (Step 752), and to subsequently move the substrate holder out of its cleaning position (to the load position, Step 766) prior to retracting the nozzle (Step 768), as will be explained below.

Prior to or upon reaching its cleaning position, as indicated in FIG. 7, the substrate holder 420 is spun/rotated (Step 754). And whether to employ higher-speed or lower-speed rotation rates may depend on the choice of nozzle type used for dispensing cleaning solution. In certain embodiments using something other than an impacting jet nozzle, for example a lower flowing chemical (non-water and etching) delivery nozzle, a lower-speed rotational rate may be appropriate, for example, at least about 30 RPM or, more specifically, at least about 60 RPM or, even more specifically, at least about 100 RPM. Note that substrate holder rotation helps to expose the entire perimeter of the inner circular edge to the dispensed cleaning solution multiple times, thus promoting thorough uniform cleaning. In certain embodiments, a cleaning cycle/operation may include at least about 30 complete revolutions/rotations of the substrate holder or, more specifically, at least about 100 revolutions/rotations of the substrate holder. In other embodiments, such as those employing a jet nozzle, appropriate rotation rates for the substrate holder while dispensing cleaning solution may be higher such as within a range from between about 250 to 800 RPM, or more preferably within a range between about 350 to 600 RPM (see the description below regarding nozzle choice/configuration).

Once the substrate holder is rotating, cleaning solution may be dispensed from nozzle 414 (Step 756) as indicated in FIG. 7. In some embodiments, the nozzle dispenses/releases a jet stream or jet-like stream of cleaning solution whose fluidic properties may aid in the removal of the metallic deposits built up on the lipseal and/or cup bottom. In some embodiments a megasonic nozzle may be used—i.e. a nozzle that dispenses a cleaning solution having megasonic waves propagating through its fluid medium—and so such a cleaning method may include generating megasonic waves in the cleaning solution within the nozzle as the cleaning solution is dispensed from the nozzle. In some embodiments, the cleaning solution may be distilled and/or deionized water (substantially free of any added acid(s)), although other cleaning solutions may also be employed depending on the embodiment. Other examples of cleaning solutions may include solutions containing metal etching compounds (e.g., hydrogen peroxide plus an acid such as sulfuric acid, ferric salts such as ferric nitrate in a moderately acidic solution, or ammonium persulfate), and/or wetting agents and surface tension reducing surfactants (e.g. various soaps and/or chemicals such as polyethylene or polypropylene-glycols and oxides), or acids alone (such as methane sulphonic acid, sulfuric acid, and/or oxidizing acids such as nitric acids). Thus, for example, a cleaning solution may comprise distilled and deionized water, a surface tension reducing agent selected from polyethylene glycol and polypropylene glycol, and it may be substantially free of acid.

In some embodiments, the orientation of the nozzle 414 may be varied while dispensing the stream of cleaning solution so as to vary the cleaning solution's angle of impact with the inner circular edge of the lipseal 422 and/or cup bottom 425. In certain such embodiments, the angle of the nozzle 414 relative to the surface of the lipseal 422 may be changed during a cleaning cycle by rotating the nozzle arm 413 (e.g., with the nozzle actuator assembly 412). This variation in nozzle orientation may be repeated several times during the cleaning cycle.

In some embodiments, the vertical position of the substrate holder 420 and therefore also the lipseal 422 relative to the nozzle 414 may be changed to some extent during a cleaning cycle. For example, at the start of the cleaning process the center of a dispensed jet stream of cleaning fluid may be set to hit the lower portion of the lipseal and then flows upwards, but as the cleaning cycle progresses, the height of the clamshell assembly may be lowered slightly so that jet stream of cleaning fluid's point of impact moves progressively upwards (in the direction of the cone and electrical contacts). More generally, a cleaning operation/cycle may include raising and/or lowering the lipseal and cup bottom while dispensing the stream of cleaning solution so as to vary the cleaning solution's area of contact with the inner circular edge of the lipseal and/or cup bottom over the course of the cleaning cycle. Moreover, various vertical positions of the substrate holder 420 relative to the nozzle 414 may be repeated several times during a cleaning cycle.

FIG. 4B displays (near nozzle 414) an arrow 415 indicating the directionality of the stream of cleaning solution as it exits the nozzle 414 in this particular embodiment. Belatedly, FIGS. 4A and 4B both display a curved arrow 416 indicating the rotational direction of the substrate holder 420 in this particular embodiment relative to the orientation of the nozzle 414. Note that, in this embodiment, the directionality 415 of the dispensed fluid stream (FIG. 4B) is counter to the rotational direction 416 of the substrate holder 420 (FIGS. 4A and 4B), and so this stream of cleaning solution dispensed from the nozzle has a velocity component against the rotational direction of the inner edge of the lipseal 422. This counter-rotation of the lipseal relative to the stream of cleaning solution may act to enhance the cleaning solution's ability to remove metal deposits from the lipseal. While not being restricted to any particularly theory regarding the mode of effective operation, the high relative velocity of the lipseal surface and the fluid flow stream, and the combination of a normal/impinging and parallel component of the fluid flow relative to the lipseal surface (as described below), may allow enhanced removal of lipseal deposits by forcing cleaning fluid under gaps that have been created between the lipseal deposits and the elastomeric lipseal itself. In some embodiments, force generated by the stream of cleaning solution exiting the nozzle 414 coupled to the counter rotation of the lipseal 422 may, at least in part, account for the successful use of distilled/deionized water as a cleaning agent instead of something more corrosive like concentrated nitric acid, for example. Also, note that arrow 415 indicating stream directionality in FIG. 4B is pointed slightly upward towards the inner circular edge of the lipseal 422. In some embodiments, this has also been found to enhance the cleaning effectiveness of the stream exiting the nozzle. Nozzle orientation will be discussed more generally and in greater detail below. Also note that in some embodiments cleaning methods may employ multiple cleaning-fluid-dispensing nozzles and electroplating apparatuses having multiple cleaning-fluid-dispensing nozzles. Several such schemes will also be described in further detail below. Furthermore, note that in some such multi-nozzle configurations, the nozzles may point in opposite directions relative to substrate rotation, and so a cleaning method/cycle may include rotating the lipseal and cup bottom in a first rotational direction while dispensing cleaning from the first nozzle and subsequently rotating the lipseal and cup bottom in a second rotational direction opposite the first rotational direction while dispensing cleaning fluid from the second nozzle. Thus, in some embodiments, the cleaning solution dispensed from the first nozzle may have a velocity component against the first rotational direction and the stream of cleaning solution dispensed from the second nozzle similarly may have a velocity component against the second rotational direction.

However, even in embodiments employing a single nozzle, the electroplating substrate holder may rotate in opposite directions at different times during the cleaning cycle. Changing rotational direction may help to provide different shear forces and stress the unwanted metal deposits in different directions or in different ways, promoting their removal by the fluid stream. Similarly, although likely to a lesser extent, changing the rotational speed of the substrate holder without reversing the rotation direction may vary the sheer forces on the deposits promoting their removal. If the rotational direction is reversed, in certain embodiments, supply of a cleaning fluid is discontinued for the period of time during which the reversal is taking place. If only a change in rotational velocity is implemented (without a change in rotational direction), its less beneficial to discontinue fluid flow during the changeover.

In a any event, with the substrate holder rotating cleaning solution is typically dispensed from the nozzle for a prescribed period of time (Step 758), and afterwards, the flow is stopped (Step 760) as indicated in FIG. 7. In some embodiments, the substrate holder continues spinning for some additional prescribed period of time (Step 762) in order to remove any remaining cleaning solution by spinning it off. In particular, if the rotational speed of the substrate holder is higher than that used during the application of the cleaning solution, this can further aid in removing any stray cleaning solution and possibly some remaining particles of previously deposited metal (e.g., tin-silver) which although basically detached from the lipseal and/or cup bottom, remain adhered to the substrate holder by fluidic adhesive forces or the like. During this spin-off phase (Step 762), because there is no cleaning solution being dispensed, a higher rotational speed can generally be used without the risk of creating an undesirable mist or spray that might exit the electroplating cell and enter other regions and/or contact other equipment within the electroplating apparatus. Thus, this spin-off may be performed at a rotational speed equal to the rotational speed used for the rinse step, or it may be faster or slower, depending on the embodiment. After the spin-off step, substrate rotation is stopped (Step 764), the substrate holder is then returned to its loading position (Step 766), and then the nozzle arm 413 is moved back to its retracted position by nozzle arm actuator 412 (Step 768)—which, in some embodiments, avoids interference between the nozzle 414 and the cup 424. The substrate holder is now cleaned, substantially free of metal deposits (e.g., tin-silver deposits), and ready to accept another substrate for electroplating.

Nozzle Choice, Orientation; Flow Parameter Selection; Substrate Holder Rotation Rates A variety of cleaning fluid dispensing nozzles may be used in the substrate holder cleaning devices disclosed herein, and also therefore in the electroplating apparatuses having build-in substrate holder cleaning devices. Similarly, a variety of cleaning fluid dispensing nozzles may be used in the cleaning methods disclosed herein, as well as in the disclosed electroplating methods employing a substrate holder autoclean method or operation. In fact, a variety of nozzles were tested, such as, for example, nozzles commercially available from Lechler, Inc. of St. Charles, Ill. and Spraying Systems Co. of Glendale Heights, Ill. Thus, in some embodiments, fan nozzles, conical nozzles, single hole/orifice nozzles, and fire hose-like (e.g. "Water-Pik"-like) jet nozzles may be employed to deliver cleaning solution. In certain such embodiments, jet nozzles having a small orifice were used with very good cleaning results (see below). With the correct flow-rate, these "jet nozzles" produce a narrow stream of high velocity cleaning fluid such as water that, in some cases, could be loosely described as being collimated or having low-divergence.

Figure 9A:
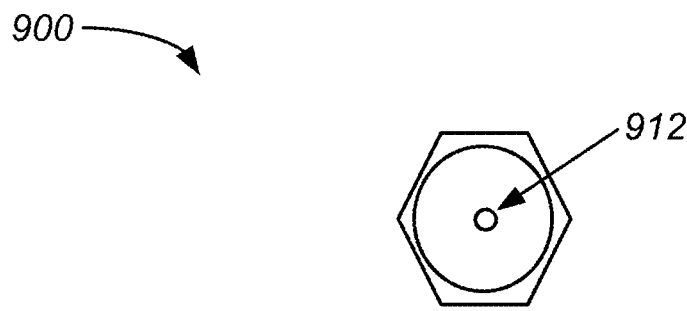
FIG. 9A presents a schematic head-on view of one jet nozzle embodiment for use in a substrate holder cleaning apparatus.
Figure 9B:
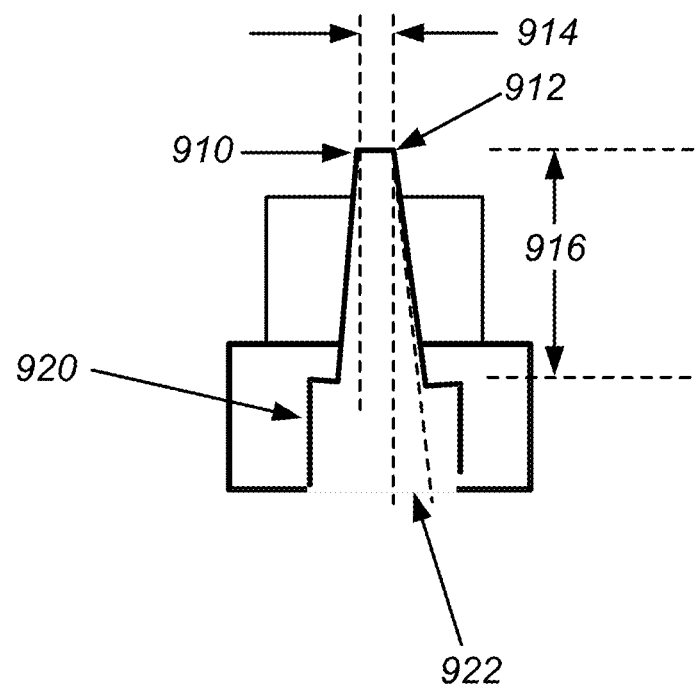
FIG. 9B presents a schematic cross-sectional view of one jet nozzle embodiment for use in a substrate holder cleaning apparatus.

One preferred embodiment of a jet nozzle 900 is displayed schematically head-on in FIG. 9A and cross-sectionally in FIG. 9B. Nozzle 900 has a tip 910 and base 920. The tip 910 has an orifice 912 with a diameter 914 which may range from about 0.02 to 0.04 inches. More preferably, orifice diameters may range from between about 0.25 to 0.35 inches, or still more preferably between about 0.3 to 0.32 inches, for example, 0.31 inches. In some embodiments, the orifice diameter 914 may be advantageously chosen such that the diameter of the cleaning fluid stream exiting the orifice 912 roughly corresponds to the height of the inner circular edge of the lipseal and/or cup bottom which is to be cleaned.

The cross-sectional view of jet nozzle 900 in FIG. 9B also illustrates how the interior volume tapers going from the base 920 of jet nozzle 900 to its tip 910. In FIG. 9B, it is apparent that the volume (or more precisely the interior diameter) of nozzle 900 is tapering from base 920 to tip 910 at a constant rate, and therefore, this taper may be characterized with a single angle referred to as camber angle 922, which defines the degree of the tapering. In some embodiments, camber angles 922 may range from 0 to about 20 degrees, or preferably from between about 2.5 to 15 degrees, or more preferably from between about 5 to 12 degrees, or even more preferably from between about 8 to 11 degrees, or about 10 degrees. In other embodiments, the taper may not be constant, and so may be characterized by a range of camber angles varying from base to tip—such as, for example, a nozzle having a camber angle varying from base to tip but within a range of between about 0 and 20 degrees, or more preferably within a range of between about 5 and 12 degrees, or even more preferably within a range of between about 8 and 11 degrees. The jet nozzle 900 schematically illustrated in FIG. 9B also includes a nozzle length 916 which is schematically illustrated as the distance from the edge of the nozzle base 920 to the nozzle tip 910. As indicated in FIG. 9B, preferred nozzle lengths may range from between about 0.5 to 2 cm, or more preferably from between about 1.2 to 1.7 cm, for example about 1.5 cm. Note that the tip 910 of nozzle 900 may extend beyond the main body of the nozzle, or it may be flush with the main body of the nozzle, depending on the embodiment. In some embodiments, the nozzle may be constructed from a thermoplastic polymer, however, in preferred embodiments, a nozzle may be constructed of a suitable steal, such as, for example, 304 stainless steel.

Figure 10A:
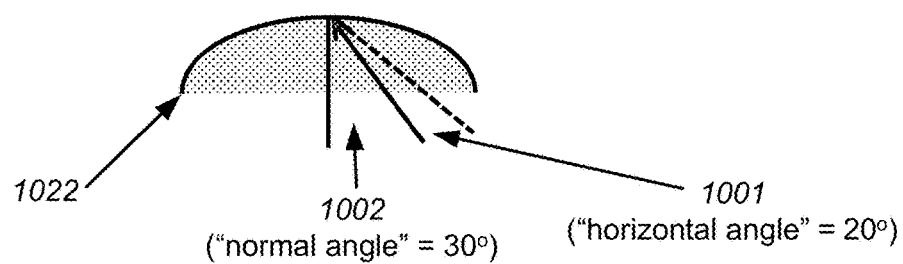
FIGS. 10A, 10B, and 10C schematically illustrate in terms of various angles a nozzle's orientation with respect to the inner circular edge of a lipseal and/or cup bottom.
Figure 10B:
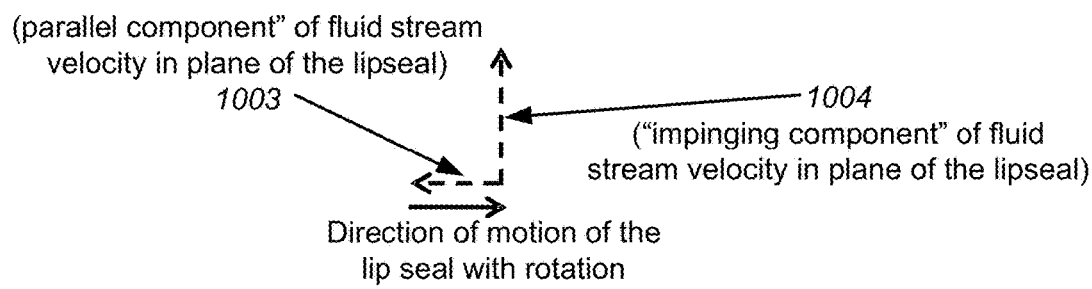
Figure 10C:
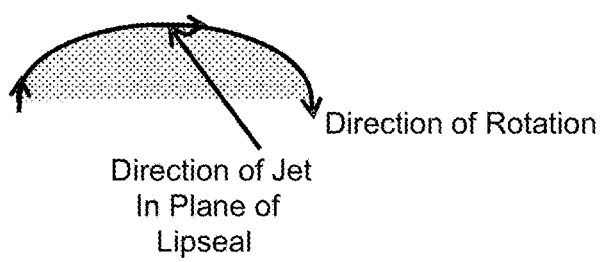

The position and orientation of a cleaning fluid dispensing nozzle relative to the inner circular edge of a lipseal and cup bottom may also be optimized to improve cleaning performance. FIGS. 10A, 10B, and 10C schematically illustrate in terms of various angles the selection of a nozzle orientation with respect to the inner circular edge of a lipseal 1022. Nozzle orientation relative to lipseal edge may be defined by two angles, as illustrated in FIG. 10A. The first angle is the angle the nozzle makes with the horizontal plane of the lipseal, which can be labeled as the "horizontal angle." The "horizontal angle" schematically portrayed in FIG. 10A is identified with ref. no. 1001 and illustrated by the dashed line in FIG. 10A which indicates that the nozzle is oriented out of the plane of the page, and at 20 degrees according to the figure. Note that a non-zero horizontal angle is exhibited by nozzle 414 of FIGS. 4A and 4B. Horizontal angles may be chosen anywhere from between about −30 to +10 degrees, depending on the embodiment, with the understanding that a negative horizontal angle indicates that the nozzle is pointing away from the earth. Thus, the nozzle 414 schematically displayed in FIGS. 4A and 4B possesses a negative horizontal angle.

The second angle defining a nozzle orientation is the angle the nozzle makes with a line normal to the interior edge of the lipseal, which is herein labeled the "normal angle." The "normal angle" schematically portrayed in FIG. 10A is identified with Ref. No. 1002. FIG. 10B is a schematic top-view looking down on the horizontal plane of the lipseal and illustrates that a non-zero normal angle 1002 defines a fluid stream velocity component parallel to the lipseal edge, labeled "parallel component" 1003, and another velocity component which is perpendicular to the lipseal edge, labeled the "impinging component" 1004. Thus, for example, a nozzle having a normal angle of zero dispenses a stream of cleaning fluid with a vanishing parallel component 1003 and a maximal impinging component 1004. The nozzle orientation schematically illustrated in FIG. 10A has a normal angle of 30 degrees and so any dispensed cleaning fluid would impact the lipseal with non-vanishing parallel and impinging velocity components.

In some embodiments, it has been found that a nozzle orientation having a non-zero normal angle (as defined above) leads to improved cleaning performance. In particular, it has been found that choosing a normal angle that results in a fluid stream having the parallel component of its velocity going against the rotational velocity of the lipseal significantly improves cleaning performance, as illustrated in FIG. 10C. This is because the cleaning force of the impacting fluid stream is enhanced by both the parallel component of the fluid stream's velocity and also the rotational velocity of the spinning inner circular edge of the lipseal. In essence, the impact force of the fluid stream results from adding the two velocities. A high parallel flow component going against the direction of lipseal rotation tends to result in the cleaning fluid getting underneath the leading edges of flakes of deposited metal adhered to the lipseal and efficiently stripping them off. Thus, while normal angles ranging from between about +45 degrees and −45 degrees may be used, preferred embodiments use positive normal angles relative to the rotation of the lipseal as illustrated in FIG. 10C.

Several other nozzle parameters may also be adjusted in order to optimize cleaning performance, and in particular, the ability of the cleaning fluid stream to strip away metal deposits. For instance, the nozzle's distance to the lipseal may be adjusted. In certain embodiments, an appropriate distance from nozzle tip to the nearest point of the inner circular edge of the lipseal and cup bottom is between about 2 and 50 mm, or more particularly, between about 2 and 10 mm, or still more particularly, between about 3 and 7 mm. For lower range distances between the nozzle tip and the nearest point of the inner circular edge, the orientation of the nozzle should be chosen so as to prevent substantial splashing of the cleaning fluid in order to minimize or substantially prevent contamination of the electroplating bath. Depending on the embodiment, the distance from the nozzle tip to the inner circular edge may be adjusted by altering the vertical cleaning position of the substrate holder 420, the cleaning position of the nozzle arm 413 as controlled by the nozzle arm actuator 412, and/or the position of the nozzle 414 on the nozzle arm 413 (assuming it is adjustable). Of course, changing any of these parameters may also require a corresponding adjustment in the two nozzle orientation angles described above.

The flow rate of the stream of cleaning fluid dispensed from the nozzle may also be adjusted. In some embodiments, an appropriate flow rate may be chosen from between about 250 and 750 ml/min, or more particularly, between about 400 and 500 ml/min, though it is understood that flow rate and nozzle orifice diameter generally determine the exit velocity of the fluid and should be adjusted accordingly. In some embodiments, a constant flow rate is selected. In other embodiments, a high-frequency pulsating flow rate of cleaning fluid through the nozzle may be used. In some embodiments, the frequency may range from about 3 to 50 pulses/second or preferably between about 5 and 20 pulses/second.

As indicated above, increasing flow rate through a given nozzle orifice diameter increases the velocity of the cleaning fluid leaving the nozzle, and so an appropriate flow rate may be chosen in order to achieve a particularly desired cleaning fluid velocity. Instead of specifying a flow rate, specifying a fluid pressure within the nozzle (or just at the tip of the nozzle) may also be used to set an appropriate velocity for the cleaning fluid stream leaving the nozzle. In some embodiments, an appropriate pressure within the nozzle while dispensing a stream of cleaning solution may be chosen from between about 20 to 100 PSI (pounds per square inch), or more preferably between about 30 and 75 PSI. In some embodiments, an appropriate cleaning fluid velocity may be between about 5 and 40 meters/sec, or preferably between about 10 and 25 meters/sec, or yet more preferably between about 13 and 19 meters/sec, such as, for example, a cleaning fluid velocity of about 16.4 meters/sec.

In some embodiments, it is advantageous to have the cleaning fluid and any metal deposits removed with it collected in the reclaim shield 460 and/or in the rinse shield 470 so that the cleaning fluid and debris do not end up falling into the electroplating solution below. One mechanism for accomplishing this is to select various fluid flow parameters and rotation rates such that cleaning fluid exiting the nozzle 414 contacts the inner circular edge of the lipseal 422 and/or cup bottom 425, effectively cleans it removing metal deposits, and then proceeds to flow up the inner surface of the cup 424, flowing over the top of it between the cup struts 428, and then finally landing in either the bottom surface of the reclaim shield 460 or the bottom surface of the rinse shield 470. In some embodiments, appropriate flow rates and cleaning fluid velocities, along with nozzle angles, substrate holder rotation rates, and the distance from nozzle tip to the inner circular edge of the lipseal and/or cup bottom may be selected to achieve this effect.

The time interval for dispensing cleaning solution (Steps 756 and 758) and the substrate rotation rate (and direction) through this period may also be adjusted to improve cleaning performance. The post-cleaning spin-dry rotation rate (Step 762) may also be judiciously chosen to improve performance. In some embodiments, appropriate cleaning times may range from between about 1 to 10 seconds, or preferably between about 2 and 5 seconds, and appropriate rotation rates for the substrate holder while cleaning solution is dispensed may range from between about 250 to 800 RPM, or preferably between about 350 to 600 RPM. In some embodiments, the substrate holder's rotation direction may be changed at least once, or at least twice, or at least three times, or at least four times during this operation to provide different shear forces on the metal deposits being removed by the cleaning fluid. In some embodiments, appropriate rotation rates for the substrate holder during the post-cleaning spin-dry period may be at least about 100 RPM, or more preferably, at least about 300 RPM, or even more preferably between about 400 and 1250 RPM, or still more preferably between about 500 and 800 RPM.

Furthermore, in some embodiments, during the post-cleaning spin-dry, a high velocity stream of a drying gas (such as dry nitrogen or air) may be applied to the inner circular edge.

In one preferred embodiment, the lipseal and/or cup bottom cleaning is performed for about 4 seconds at about 550 RPM using a stream velocity of about 16.4 m/sec. In this embodiment, the flow rate would be about 480 ml/min with a fluid pressure of about 47.5 PSI. In certain such preferred embodiments, the horizontal angle (as defined above) may be about negative 20 degrees, and the normal angle (as defined above) may be about 30 degrees (meaning that a parallel component of the cleaning fluid stream is directed against the rotation of the lipseal, as discussed above). Using these nozzle angles with the aforementioned cleaning fluid flow rates and velocities, may in some embodiments, cause the cleaning fluid to advantageously flow up and over the inner surface of the cup 424 and into the reclaim shield 460 and/or rinse shield 470 as described above, keeping removed metal debris out of the electroplating bath 434 below. After dispensing cleaning solution, in certain such preferred embodiments, the post-cleaning spin-dry may be performed for a period of about 15 seconds at about 550 RPM.

Controllers

An electroplating apparatus having an automated cleaning device may include a controller for receiving feedback signals from various the components, modules, subsystems, etc. of the apparatus and for supplying control signals to the same or other components, modules, or subsystems. For instance, the controller may control operation of electroplating substrate holders, robots, cleaning systems, etc. that are part of the electroplating apparatus. In certain embodiments, the controller may synchronize the operation of the electroplating substrate holders and robots with respect to other substrate processing modules.

In some embodiments, the controller may determine when a cleaning process should be initiated in a sequence of plating operations. In some embodiments, the controller is employed to control process conditions during various operations disclosed and described herein. Some examples of such operations include moving a support of a cleaning system such that a sonic cleaning nozzle is positioned at a predetermined position within respect to an inner circular edge formed by at least the lip seal, rotating the electroplating substrate holder, and other operations described above. Some examples of such operations include orienting a nozzle relative to the lipseal and/or cup bottom of the substrate holder of an electroplating apparatus such that the nozzle is pointed substantially at the inner circular edge of the lipseal and/or cup bottom, rotating the lipseal and cup bottom, and dispensing a stream of cleaning solution having a fluid velocity between about 5 and 40 meters/second from the nozzle such that the stream of cleaning solution contacts the inner circular edge of the lipseal and/or cup bottom while they are rotating, removing metal deposits from the lipseal and/or cup bottom.

The controller will typically include one or more memory devices and one or more processors. The processor may include a central processing unit (CPU) or computer, analog and/or digital input/output connections, stepper motor controller boards, and other like components. Machine readable instructions for implementing appropriate control operations are executed on the processor. The machine readable instructions may be stored on the memory devices associated with the controller or they may be provided over a network.

In certain embodiments, the controller controls all or most activities of the semiconductor processing apparatus described above. For example, the controller may control all or most activities of the semiconductor processing apparatus associated with cleaning unintended metal deposits from the lipseal and/or cup bottom of a substrate holder. The controller executes system control software including sets of instructions for controlling the timing of the processing steps, pressure levels, gas flow rates, and other parameters of particular operations further described below. Other computer programs, scripts, or routines stored on memory devices associated with the controller may be employed in some embodiments.

In some embodiments, machine readable instructions associated with a substrate cleaning operation include, but are not limited to: instructions for moving the substrate holder to the loading position, receiving a substrate, and closing the substrate holder; instructions for moving the substrate holder to the electroplating position and electroplating the substrate; instructions for moving the substrate holder to the reclaim position and rotating the substrate holder and substrate; instructions for moving the substrate holder to the rinse position and rinsing the substrate while rotating the substrate holder and substrate; instructions for returning the substrate holder to the loading position, opening the substrate holder, and removing the substrate; instructions for moving the nozzle arm actuator of the cleaning apparatus to its cleaning position prior to moving the substrate holder to the cleaning position; instructions for moving the substrate holder to the cleaning position; instructions for dispensing cleaning solution from the nozzle of the cleaning apparatus while rotating the substrate holder; instructions for moving the substrate holder out of the cleaning position; and instructions for returning the nozzle arm actuator to its retracted position after moving the substrate holder out of the cleaning position.

Typically, there is a user interface associated with the system controller. The user interface may include a display screen, graphical software to display process conditions, and user input devices such as pointing devices, keyboards, touch screens, microphones, and other like components.

The computer program code for controlling the above operations can be written in any conventional computer readable programming language: for example, assembly language, C, C++, Pascal, Fortran or others. Compiled object code or script is executed by the processor to perform the tasks identified in the program.

Signals for monitoring the process may be provided by analog and/or digital input connections of the controller. The signals for controlling the process are output on the analog and digital output connections of the processing system.

Photolithographic Patterning

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or X-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Test Cleaning Results

Figure 11A:
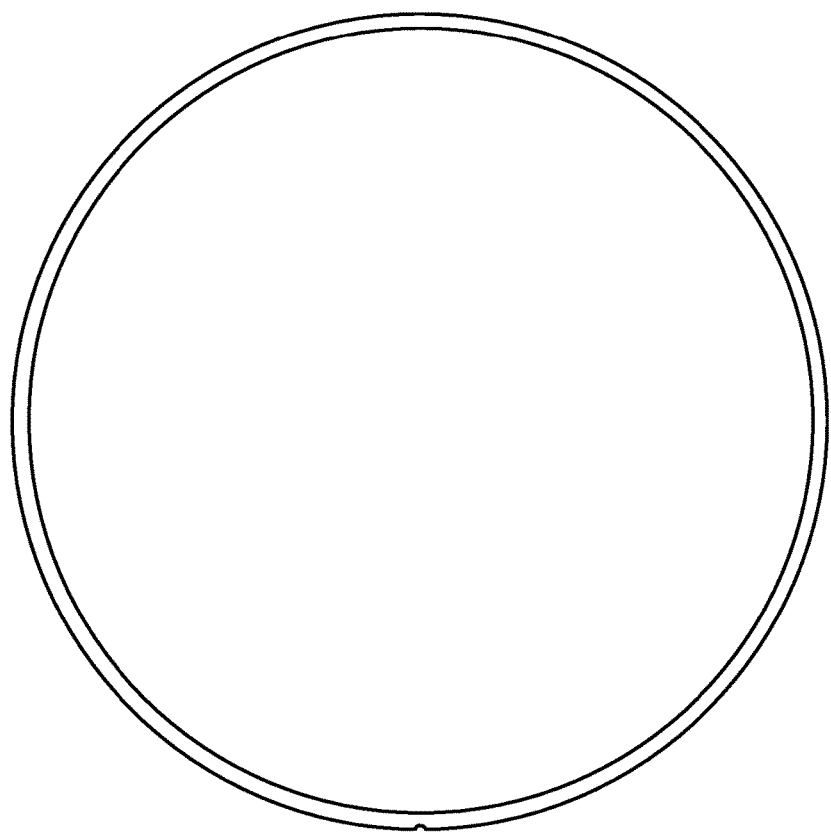
FIG. 11A displays a drawing of a tin-silver plated blanket test wafer such as those used in the Marathon Test presented herein.

In order to assess the cleaning capabilities of the cleaning methods and apparatuses disclosed herein, and to demonstrate the capabilities of these methods and apparatuses to remove spurious tin-silver deposits from an electroplating substrate holder's lipseal, a "Marathon Test" was performed over a test sequence of semiconductor wafers (serving as electroplating substrates). This Marathon Test was performed using 100% exposed open edge blanket test wafers that represent a much more arduous cleaning task than what would normally be encountered in the field—hence this experiment is herein referred to as a "Marathon Test"). Specifically, the Marathon Test used 300 mm silicon wafers having a full-faced blanket of 1000 Å copper seed (so no photoresist). See, e.g., the tin-silver plated blanket test wafer displayed in FIG. 11A. In the field, a semiconductor wafer is typically patterned, oftentimes having an exposed open edge of around 4%, for example. However, electroplating onto a 100% open edge blanket test wafer (such as that shown in FIG. 11A) leads to the buildup of metallic deposits (in this case, tin-silver deposits) on the lipseal much more rapidly, and so represent a useful test case. Note that in some circumstances, it has been found that the rate of metallic buildup on an electroplating apparatus's lipseal is approximately inversely proportional to the percent open area, so for example, plating a single blanket test wafer (as used in the Marathon Test) results in a lipseal buildup roughly corresponding to the buildup expected from about twenty-five 4% open area wafers (i.e., 25=100%/4%). Thus, the 500 blanket test wafers used in the Marathon Test are likely equivalent to more than 10,000 4% open area wafers.

The apparatus used to electroplate the test wafers and perform the substrate holder cleaning methods was substantially similar to that displayed in FIGS. 4A, 4B, and 8A through 8C. The nozzle of the cleaning apparatus was substantially similar schematically to that shown in FIGS. 9A and 9B and oriented with a normal angle of 20 degrees and a horizontal angle of 30 degrees (as these terms are described above). Substantially DI (distilled and deionized) water was used as the cleaning solution. The DI water was dispensed from the nozzle with an approximate flow rate of 570 ml/min and an approximate fluid velocity of 12.1 m/sec. A 4 second rinse with the wafer spinning at 550 RPM was performed after the cleaning step, followed by a 15 second spin-dry, also at 550 rpm. Lipseal cleaning, spin-rinse, and spin-dry were performed in this Marathon Test after electroplating every 5 wafers. Note, however, that in the field using typical 4% open area pattern wafers, this roughly corresponds to a cleaning interval of 125 wafers (since the lipseal buildup from 25 pattern wafers roughly correspond to the metallic buildup from a single 100% open area wafer). Additional process conditions for the Marathon Test were as follows:

TABLE I

Electroplating Bath Composition and Conditions
(Ishihara/MMC- TS202 SnAg bath)

| | |
|---|---|
| Sn Concentration | 50 gm/L |
| Acid Concentration | 130 gm/L |
| Ag Concentration | 0.65 gm/L |
| SLG (silver complexer) Concentration | 140 gm/L |
| AD (additive) Concentration | 40 ml/L |
| Electroplating Bath Temperature | 25° C. |

TABLE II

Electroplating Conditions

| | |
|---|---|
| Current | 2.0 A |
| Deposition Rate | 3.6 μm/min |
| Plating thickness | 25 μm |

TABLE II-continued

Electroplating Conditions

| | |
|---|---|
| Bath Flow Rate | 36 L/min |
| Wafer Rotation Rate | 90 RPM |

Results from the Marathon Test are displayed in FIGS. 11B-1 through 11I-3. FIGS. 11B-1 through 11B-4 display images of a substrate holder (including lipseal, cup bottom, and contact fingers) prior to the Marathon Test—i.e., prior to electroplating any wafers. FIGS. 11C-1 through 11C-4 display similar images of the substrate holder after electroplating 500 blanket test wafers under the conditions of Tables 1 and 11 and employing the cleaning method described above with a cleaning interval of 5 wafers (as indicated above). Comparing the images presented in FIGS. 11C-1 through 11C-4 with those presented in FIGS. 11B-1 through 11B-4, it is apparent that after plating 500 blanket test wafers with the cleaning operation enabled there is no significant tin-silver deposition on the substrate holder. In contrast, FIGS. 11D-1 through 11D-4 display images of a substrate holder after plating 200 blanket test wafers with substrate holder autocleaning disabled, and it is evident in at the first of the four images that tin-silver deposition has occurred on the substrate holder (see the arrow in FIG. 11D-1). Similarly, FIGS. 11E-1 through 11E-4 display images of a substrate holder after plating 500 blanket test wafers with autocleaning disabled. Here, there appears to be tin-silver deposition on the cup bottom of the substrate holder in all four displayed images (as indicated by arrows in each of FIGS. 11E-1 through 11E-4). Thus, periodic substrate holder autocleaning during the Marathon Test substantially prevented tin-silver build-up on the lipseal and cup bottom during a sequence of plating on 500 blanket test wafers, whereas without substrate holder autocleaning, there was significant build-up on the cup bottom after the 500 wafer test sequence, and even some build-up already visible after plating just 200 test wafers.

Additional results are displayed in FIGS. 11F, 11G, 11H, and 11I. FIG. 11F demonstrates the contamination that occurs on the electroplating apparatus's high-resistance virtual anode (HRVA) (Ref. No. 438 in FIGS. 4A, 4B, and 8A through 8C) in the absence of periodic substrate holder cleaning. As shown in FIG. 11F, some contamination was apparent after just 100 wafers, but contamination increased substantially as more wafers were plated, up through the last image of FIG. 11F that shows the significant contamination present after plating 500 wafers. Note that no contamination appeared on the HRVA when periodic autocleaning was employed.

FIGS. 11G-1 through 4 further illustrate the electroplating cell and HRVA contamination that occurs in the absence of periodic substrate holder cleaning. FIGS. 11G-1 and 4 show large broken metallic particles contaminating the HRVA (similar to FIG. 11F) (see arrows), and FIG. 11G-3 shows metallic film growth within the electroplating cell as a result of this contamination. Interestingly, FIG. 11G-2 shows that, even without employment of the periodic cleaning method, some metal particles may actually fortuitously end up in the tophat (see Ref. No. 433 of FIGS. 4A, 4B, and 8A through 8C) where they can be easily removed. However, the images shown in FIGS. 11H-1 through 3 illustrate that when periodic cleaning is employed, many more metal particles end up in the top hat—specifically the upper surface of the rinse shield (see Ref. No. 470 of FIGS. 4A, 4B, and 8A through 8C)—where they are trapped and prevented from contaminating sensitive components of the electroplating apparatus (such as the HRVA, for example), and also the electroplating bath (as discussed above).

This beneficial collection of contaminants in the tophat (see, e.g., Ref. No. 433 of FIGS. 4A, 4B, and 8A through 8C) is further illustrated in FIG. 11I-1 through 3 which, more specifically, show the accumulation of metal particles on the upper surface of the rinse shield (see, e.g., Ref. No. 470 of FIGS. 4A, 4B, and 8A through 8C) of the top hat. FIG. 11I-1 shows a clean rinse shield within the top hat prior to the Marathon Test (i.e., before any electroplating), and FIG. 11I-2 and FIG. 11I-3 show the rinse shield after electroplating 250 and 500 wafers, respectively, progressively accumulating a greater number of metal particles (see arrows). The accumulation of metal particles in the rinse shield as the Marathon Test proceeds illustrates the positive effect of performing periodic substrate cleaning operations.

Other Embodiments

Although the foregoing disclosed processes, methods, systems, apparatuses, and compositions have been described in detail within the context of specific embodiments for the purpose of promoting clarity and understanding, it will be apparent to one of ordinary skill in the art that there are many alternative ways of implementing these processes, methods, systems, apparatuses, and compositions which are within the spirit of this disclosure. Accordingly, the embodiments described herein are to be viewed as illustrative of the disclosed inventive concepts rather than restrictively, and are not to be used as an impermissible basis for unduly limiting the scope of the appended Claims.

We claim:

1. A method of cleaning a lipseal and/or cup bottom of an electroplating device by removing metal deposits accumulated on an inner circular edge of the lipseal and/or cup bottom in prior electroplating operations, the method comprising:
   orienting a first nozzle relative to the lipseal and/or cup bottom such that the first nozzle is pointed substantially at the inner circular edge of the lipseal and/or cup bottom, wherein the first nozzle is a jet nozzle having a base and a tip, the jet nozzle having a larger interior diameter at the base than at the tip, wherein the interior diameter of the jet nozzle tapers from the base to the tip, wherein the inner circular edge is the innermost surface of the lipseal and/or cup bottom that is exposed to an electrolyte during electroplating of a wafer;
   rotating the lipseal and cup bottom in a first rotational direction; and
   dispensing a stream of the cleaning solution having a fluid velocity between about 5 and 40 meters/second from the first nozzle such that the stream of the cleaning solution contacts the inner circular edge of the lipseal and/or cup bottom while they are rotating in the first rotational direction, removing metal deposits from the lipseal and/or cup bottom, wherein the dispensed stream of the cleaning solution has a velocity component opposing the first rotational direction.

2. The method of claim 1, wherein the fluid velocity of the stream of the cleaning solution is between about 10 and 25 meters/second.

3. The method of claim 1, wherein the fluid pressure within the first nozzle while dispensing the stream of the cleaning solution is between about 20 and 100 PSI.

4. The method of claim 1, further comprising raising and/or lowering the lipseal and cup bottom while dispensing the stream of the cleaning solution so as to vary the cleaning solution's area of contact with the inner circular edge of the lipseal and/or cup bottom.

5. The method of claim 1, further comprising varying the orientation of the first nozzle while dispensing the stream of the cleaning solution so as to vary the cleaning solution's angle of impact with the inner circular edge of the lipseal and/or cup bottom.

6. The method of claim 1, wherein the metal deposits comprise a tin/silver alloy.

7. The method of claim 1, wherein the cleaning solution is substantially distilled and deionized water.

8. The method of claim 1, wherein the cleaning solution comprises distilled and deionized water, a surface tension reducing agent selected from polyethylene glycol and polypropylene glycol, and is substantially free of acid.

9. The method of claim 1, wherein the first nozzle is oriented relative to the inner circular edge of the lipseal and/or cup bottom at a normal angle between 0 and 45 degrees.

10. The method of claim 9, wherein the first nozzle is oriented relative to the horizontal plane of the lipseal and/or cup bottom at a horizontal angle between about −30 and +10 degrees.

11. The method of claim 10, wherein the first nozzle tip is oriented at a distance of between about 2 and 50 mm from nearest point of the inner circular edge of the lipseal and cup bottom.

12. The method of claim 10, wherein the flow rate of the stream of the cleaning solution dispensed from the first nozzle is between about 250 and 750 ml/min.

13. The method of claim 1, further comprising generating megasonic waves in the cleaning solution within the first nozzle as the cleaning solution is dispensed from the first nozzle.

14. A method of electroplating a metal onto a plurality of semiconductor substrates using an electroplating apparatus having a lipseal and cup bottom, wherein the metal is a tin-silver alloy, the method comprising:
   electroplating the metal onto a first set of one or more substrates;
   determining whether to perform a cleaning operation which removes metal deposits accumulated on the lipseal and/or cup bottom while electroplating the first set of substrates, wherein the determining comprises an assessment of whether there is sufficient build-up of metal deposits on the lipseal and/or cup bottom to warrant cleaning;
   if it is determined that the cleaning operation is warranted, performing the cleaning operation which removes the metal deposits according to the cleaning method of claim 1; and
   after determining whether a cleaning operation is warranted and if the cleaning operation is warranted after performing the cleaning operation, electroplating the metal onto a second set of one or more substrates.

15. The electroplating method of claim 14, wherein it is determined that a cleaning operation is warranted if more than a predetermined number of substrates have been electroplated since the last cleaning operation.

16. The electroplating method of claim 15, wherein the predetermined number of substrates is selected dependent on the ratio of patterned to unpatterned surface area of the substrates electroplated since the last cleaning operation.

17. The electroplating method of claim 16, wherein the predetermined number of substrates is selected depending on the ratio of patterned to unpatterned surface area of the substrates electroplated since the last cleaning operation, and also the radial distribution of patterned surface area and/or the radial distribution of unpatterned surface area of the substrates electroplated since the last cleaning operation.

18. The electroplating method of claim 14, wherein it is determined that a cleaning operation is warranted if more than a predetermined quantity of electric charge has been transferred to the substrate via electroplating since the last cleaning operation.

19. The electroplating method of claim 18, wherein the predetermined quantity of electric charge is selected depending upon the radial distribution of patterned surface area and/or the radial distribution of unpatterned surface area of the substrates electroplated since the last cleaning operation.

20. The method of claim 1, wherein the first nozzle dispenses a substantially collimated stream of the cleaning solution from an orifice in the first nozzle, the orifice having a diameter of 0.02-0.04 inches.

21. The method of claim 20, wherein the substantially collimated stream of the cleaning solution has a diameter of 0.02-0.04 inches upon exiting the first nozzle.

22. The method of claim 1, wherein the first nozzle is affixed to a nozzle arm, wherein the electroplating device further includes a nozzle arm actuator mechanically coupled to the nozzle arm, wherein the nozzle arm actuator is configured to move the nozzle arm and the first nozzle between a cleaning position and a retracted position.

23. The method of claim 22, further comprising moving the nozzle arm and the first nozzle to the retracted position from the cleaning position after dispensing the stream of cleaning solution.

24. The method of claim 23, further comprising placing a semiconductor substrate on the lipseal without contacting the semiconductor substrate with the first nozzle or nozzle arm while the first nozzle is in the retracted position.

25. The method of claim 1, further comprising removing the metal deposits using a second nozzle.

26. The method of claim 1, wherein the cleaning solution comprises an acid.

27. The method of claim 1, wherein the cleaning solution comprises methanesulfonic acid.

* * * * *